(12) United States Patent
Nishida et al.

(10) Patent No.: US 9,780,232 B2
(45) Date of Patent: Oct. 3, 2017

(54) MEMORY SEMICONDUCTOR DEVICE WITH PERIPHERAL CIRCUIT MULTI-LAYER CONDUCTIVE FILM GATE ELECTRODE AND METHOD OF MANUFACTURE

(71) Applicant: RENESAS ELECTRONICS CORPORATION, Tokyo (JP)

(72) Inventors: Yukio Nishida, Tokyo (JP); Tomohiro Yamashita, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/048,791

(22) Filed: Feb. 19, 2016

(65) Prior Publication Data
US 2016/0172509 A1    Jun. 16, 2016

Related U.S. Application Data

(62) Division of application No. 14/188,131, filed on Feb. 24, 2014, now Pat. No. 9,299,854.

(30) Foreign Application Priority Data

Feb. 25, 2013 (JP) .................................. 2013-034248

(51) Int. Cl.
H01L 21/28     (2006.01)
H01L 29/66     (2006.01)
(Continued)

(52) U.S. Cl.
CPC ...... *H01L 29/792* (2013.01); *H01L 21/28008* (2013.01); *H01L 21/28282* (2013.01);
(Continued)

(58) Field of Classification Search
CPC .................. H01L 21/28282; H01L 29/66833
See application file for complete search history.

(56) References Cited

U.S. PATENT DOCUMENTS

| 5,635,416 A | 6/1997 | Chen et al. |
| 6,034,416 A | 3/2000 | Uehara et al. |

(Continued)

FOREIGN PATENT DOCUMENTS

| JP | 1140515 A | 2/1999 |
| JP | 2002141500 A | 5/2002 |

(Continued)

OTHER PUBLICATIONS

U.S. Notice of Allowance dated Nov. 20, 2015 issued in U.S. Appl. No. 14/188,131.
(Continued)

*Primary Examiner* — Evan Pert
(74) *Attorney, Agent, or Firm* — McDermott Will & Emery LLP

(57) ABSTRACT

To enhance the performance of a semiconductor device. In a method for manufacturing a semiconductor device, a metal film is formed over a semiconductor substrate having an insulating film formed on a surface thereof, and then the metal film is removed in a memory cell region, whereas, in a part of a peripheral circuit region, the metal film is left. Next, a silicon film is formed over the semiconductor substrate, then the silicon film is patterned in the memory cell region, and, in the peripheral circuit region, the silicon film is left so that an outer peripheral portion of the remaining metal film is covered with the silicon film. Subsequently, in the peripheral circuit region, the silicon film, the metal film, and the insulating film are patterned for forming an insulating film portion formed of the insulating film, a metal
(Continued)

film portion formed of the metal film, and a conductive film portion formed of the silicon film.

12 Claims, 32 Drawing Sheets

(51) Int. Cl.
    *H01L 29/792* (2006.01)
    *H01L 27/11573* (2017.01)
    *H01L 29/423* (2006.01)
    *H01L 27/11563* (2017.01)
    *H01L 29/06* (2006.01)

(52) U.S. Cl.
    CPC .. *H01L 27/11563* (2013.01); *H01L 27/11573* (2013.01); *H01L 29/0653* (2013.01); *H01L 29/42344* (2013.01); *H01L 29/66833* (2013.01)

(56) References Cited

U.S. PATENT DOCUMENTS

| | | | |
|---|---|---|---|
| 6,420,232 B1 | 7/2002 | Wu | |
| 6,468,914 B1 | 10/2002 | Jang et al. | |
| 6,541,324 B1 | 4/2003 | Wang | |
| 7,052,947 B2 | 5/2006 | Ding | |
| 7,053,438 B2 | 5/2006 | Ding | |
| 8,018,004 B2 | 9/2011 | Sato et al. | |
| 8,106,444 B2 * | 1/2012 | Terai | H01L 21/28282 |
| | | | 257/255 |
| 9,159,843 B2 | 10/2015 | Saito et al. | |
| 9,437,593 B2 * | 9/2016 | Yan | H01L 27/0617 |
| 2012/0132997 A1 | 5/2012 | Tokita | |

FOREIGN PATENT DOCUMENTS

| | | |
|---|---|---|
| JP | 2003-17596 A | 1/2003 |
| JP | 2007258743 A | 10/2007 |
| JP | 2008-288465 A | 11/2008 |
| JP | 2012-119383 A | 6/2012 |
| JP | 2012-248652 A | 12/2012 |

OTHER PUBLICATIONS

Japanese Office Action dated Jun. 28, 2016 issued in Japanese Patent Application No. 2013-034248 (English translation thereof).
Japanese Office Action dated Sep. 20, 2016 issued in Japanese Patent Application No. 2013-034248 (with English translation).

* cited by examiner

| APPLIED VOLTAGE / OPERATION | Vd | Vcg | Vmg | Vs | Vb |
|---|---|---|---|---|---|
| WRITE | Vdd | 1V | 12V | 6V | 0 |
| ERASE | 0 | 0 | −6V | 6V | 0 |
| READ | Vdd | Vdd | 0 | 0 | 0 |

Vdd = 1.5V

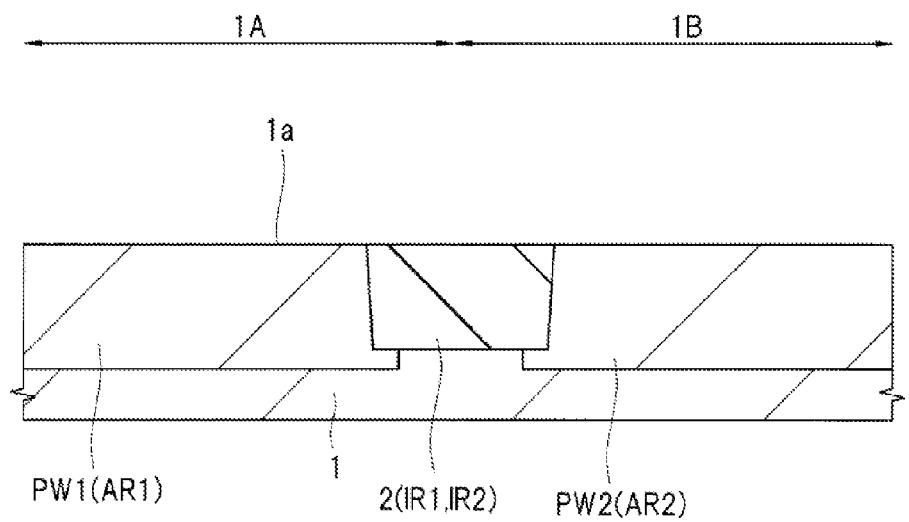
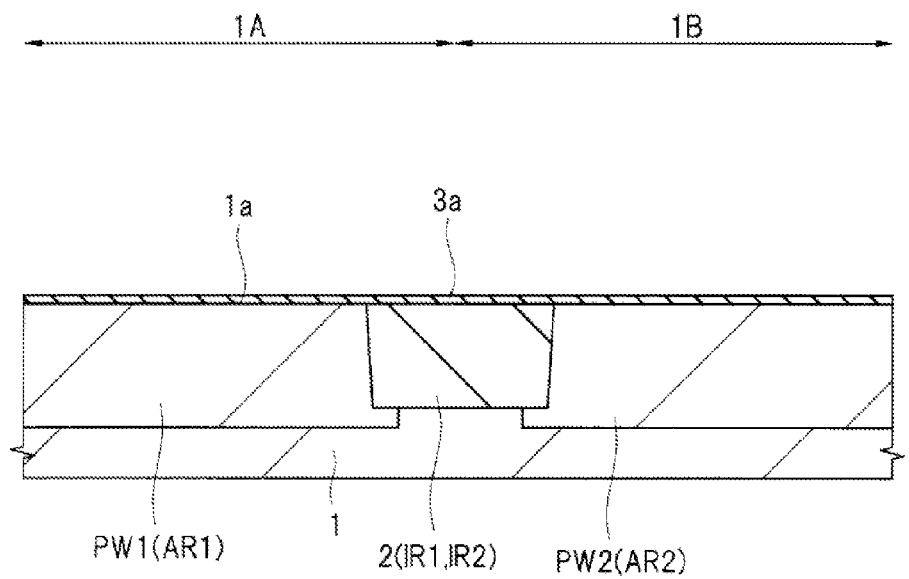

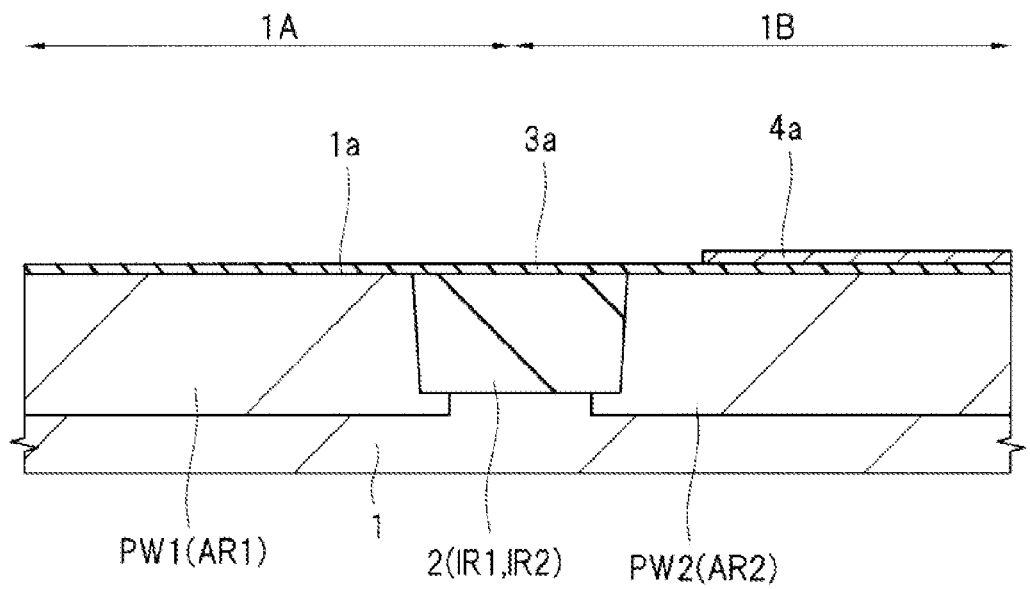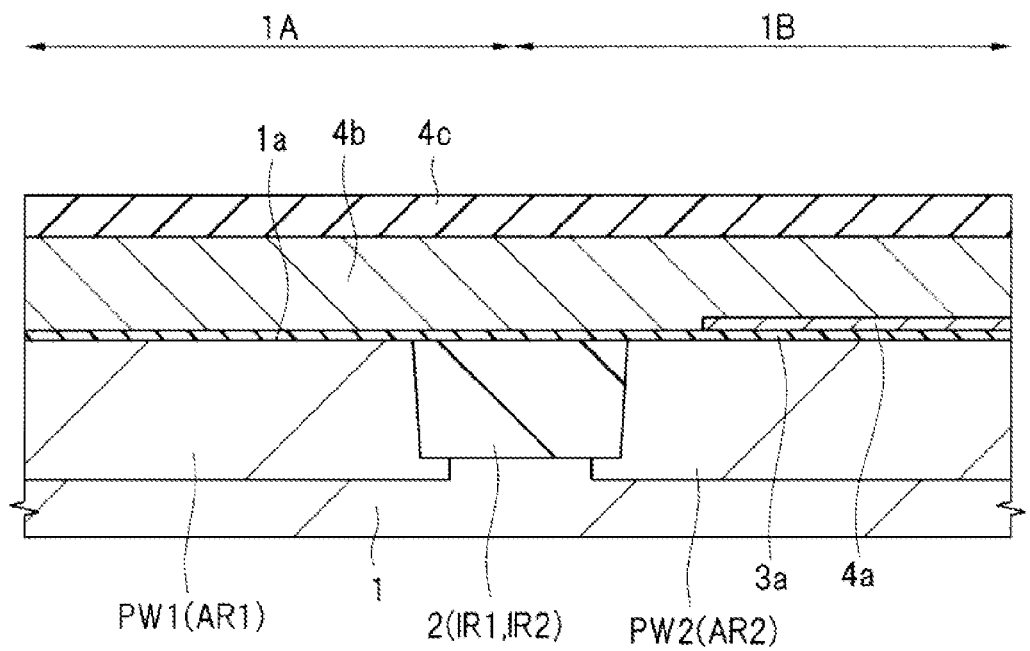

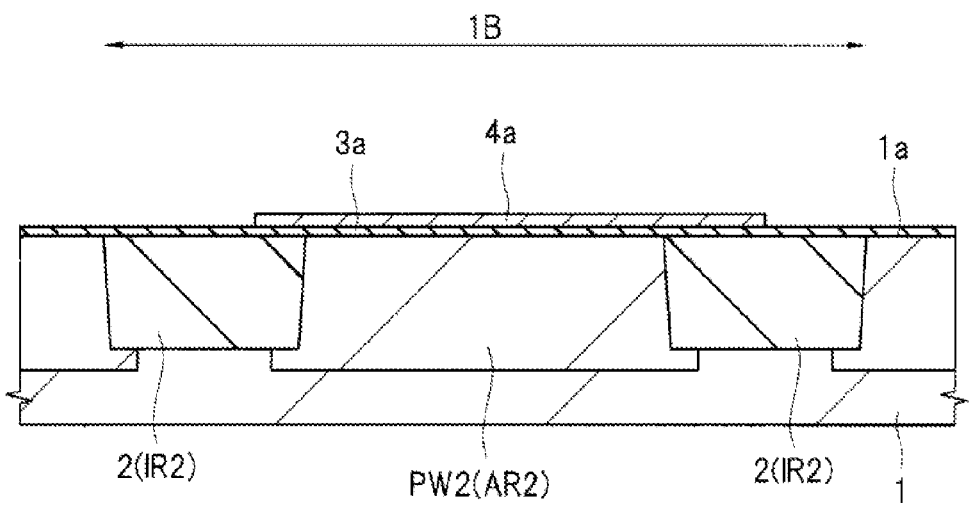
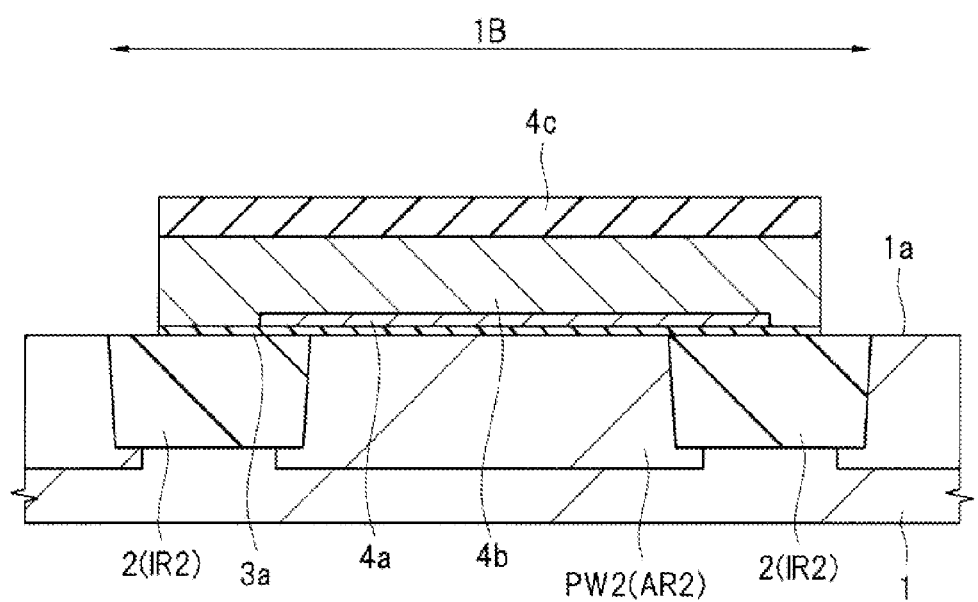

MEMORY SEMICONDUCTOR DEVICE WITH PERIPHERAL CIRCUIT MULTI-LAYER CONDUCTIVE FILM GATE ELECTRODE AND METHOD OF MANUFACTURE

CROSS-REFERENCE TO RELATED APPLICATION

This application is a divisional patent application of U.S. patent application Ser. No. 14/188,131, filed on Feb. 24, 2014, which in turn claims the benefit of Japanese Patent Application No. 2013-034248, filed on Feb. 25, 2013, including the disclosures of which are incorporated herein by reference in their entireties.

BACKGROUND

The present invention relates to a semiconductor device and a method for manufacturing the same, and can be suitably utilized, for example, in a semiconductor device including a semiconductor element formed in a semiconductor substrate and in a method for manufacturing the same.

There is widely used a semiconductor device which includes: a memory cell region where a memory cell such as, for example, a nonvolatile memory, is formed over a semiconductor substrate; and a peripheral circuit region where a peripheral circuit constituted by such as, for example, a MISFET (Metal Insulator Semiconductor Field Effect Transistor) is formed over the semiconductor substrate. That is, a semiconductor device is widely used, in which a memory cell such as, for example, a nonvolatile memory, and a MISFET forming a peripheral circuit are mounted in the respective regions over a semiconductor substrate (i.e., are mixedly mounted over a semiconductor substrate).

For example, as a nonvolatile memory, a memory cell constituted by a split-gate cell using a MONOS (Metal-Oxide-Nitride-Oxide-Semiconductor) film may be formed. At this time, the memory cell is formed by two MISFETs, i.e., a control transistor with a control gate electrode and a memory transistor with a memory gate electrode. In a case where such a memory cell such as a nonvolatile memory and a MISFET forming a peripheral circuit are mixedly mounted over a semiconductor substrate, a gate electrode is formed in the respective regions.

Japanese Patent Laid-Open No. 2003-17596 (Patent Document 1) discloses a technique in which, after forming a lamination-type gate electrode of a nonvolatile memory in a first region and before forming a gate electrode of a MISFET in a second region, an insulating film is formed so that a silicon film serving as the gate electrode of the MISFET is covered.

Japanese Patent Laid-Open No. 2007-258743 (Patent Document 2) discloses a technique in which a gate electrode is formed by patterning a laminated film including a titanium silicide film, then a silicon film is formed on a sidewall of the titanium silicide film, and subsequently in oxidizing the surface of a semiconductor substrate, oxidation of the titanium silicide film is prevented.

Japanese Patent Laid-Open No. 11-40515 (Patent Document 3) discloses a technique, in which a gate electrode is formed by patterning a laminated film including a titanium silicide film, then a titanium nitride film is formed on a side surface of the titanium silicide film, and subsequently, a silicon oxide film is formed and thus silicon oxide film spacer is formed.

Japanese Patent Laid-Open No. 2002-141500 (Patent Document 4) discloses a technique, in which a gate electrode is formed by patterning a laminated film including a tungsten film and then a damascene gate cap formed of a silicon nitride film is formed on a side surface of the gate electrode.

SUMMARY

In a case where such a memory cell, such as a nonvolatile memory, and a MISFET forming a peripheral circuit are mixedly mounted over a semiconductor substrate, for example after forming a gate electrode for a control transistor included in the memory cell first in a memory cell region, a gate electrode of the MISFET forming the peripheral circuit may be formed in a peripheral circuit region.

Here, in the peripheral circuit region, along with miniaturization of semiconductor elements, a high-dielectric film, i.e., the so-called high-k film, having a relative dielectric constant higher than, for example, a silicon nitride film, is used as the gate insulating film of the MISFET. Moreover, in the peripheral circuit region, in combination with a gate insulating film formed of a high-k film, the so-called metal gate electrode formed of a metal film is used in place of a silicon film.

On the other hand, in the memory cell region, a polycrystalline silicon gate electrode, instead of a metal gate electrode, may be used from the design point of view or from the manufacturing process point of view. In this case, in a memory cell region, a silicon film is formed via an insulating film over a semiconductor substrate, and in a peripheral circuit region, a laminated film of a metal film and silicon film is formed via the insulating film over the semiconductor substrate, and then in the memory cell region, the silicon film is patterned for forming a polycrystalline silicon gate electrode. Subsequently, in the peripheral circuit region, the silicon film and the metal film are patterned for forming a metal gate electrode.

In forming the polycrystalline silicon gate electrode in the memory cell region, the silicon film and the metal film are left in the peripheral circuit region, but the metal film may be exposed to a side surface of this remaining silicon film. If a process of oxidizing the surface of the semiconductor substrate is performed in this state, the remaining metal film is oxidized, and not only in an outer peripheral portion of the metal film but also in a region where the metal gate electrode is to be formed in the peripheral circuit region, the film thickness of the metal film might increase or the quality of the material might change. Therefore, the state of an interface between the metal gate electrode and the gate insulating film formed in the peripheral circuit region fluctuates, and thus the performance of the semiconductor device cannot be enhanced.

Alternatively, for example, a memory cell for a DRAM (Dynamic Random Access Memory) or various semiconductor elements such as a pixel of a CMOS (Complementary Metal Oxide Semiconductor) image sensor, and a MISFET with a metal gate electrode may be mixedly mounted over a semiconductor substrate. Also, in such a case, after a silicon film is patterned in a certain region and before a metal gate electrode is formed in a region different from the certain region, a process of performing an oxidation treatment on the semiconductor substrate may be performed in a state where a metal film and the silicon film remain in this different region. Also in such a case, the remaining metal film might be oxidized and thus the performance of the semiconductor device cannot be enhanced.

The other problems and the new feature will become clear from the description of the present specification and the accompanying drawings.

According to one embodiment, in a method for manufacturing a semiconductor device, a metal film is formed over a semiconductor substrate having an insulating film formed in a surface thereof, and then the metal film is removed in a memory cell region, while in a part of a peripheral circuit region a metal film is left. Next, a silicon film is formed over the semiconductor substrate and then the silicon film is patterned in the memory cell region, and in the peripheral circuit region, the silicon film is left so that an outer peripheral portion of the remaining metal film is covered with the silicon film. Subsequently, in the peripheral circuit region, the silicon film, the metal film, and the insulating film are patterned for forming an insulating film portion formed of the insulating film, a metal film portion formed of the metal film, and a conductive film portion formed of the silicon film.

In addition, according to another embodiment, in the semiconductor device, a gate electrode formed via a gate insulating film over the semiconductor substrate includes the metal film portion formed of the metal film and the conductive film portion formed of the silicon film. In the metal film portion, one end in a gate width direction of the gate electrode is covered with the conductive film portion.

According to one embodiment, the performance of the semiconductor device can be enhanced.

BRIEF DESCRIPTION OF THE DRAWINGS

FIG. 7 is a cross-sectional view of a principal part during a manufacturing process of the semiconductor device of the first embodiment;

FIG. 8 is a cross-sectional view of the principal part during a manufacturing process of the semiconductor device of the first embodiment;

FIG. 11 is a cross-sectional view of the principal part during a manufacturing process of the semiconductor device of the first embodiment;

FIG. 12 is a cross-sectional view of the principal part during a manufacturing process of the semiconductor device of the first embodiment;

FIG. 40 is a cross-sectional view of the principal part of the semiconductor device of the second embodiment during a manufacturing process;

FIG. 41 is a cross-sectional view of the principal part of the semiconductor device of the second embodiment during a manufacturing process.

DETAILED DESCRIPTION

Figure 1:
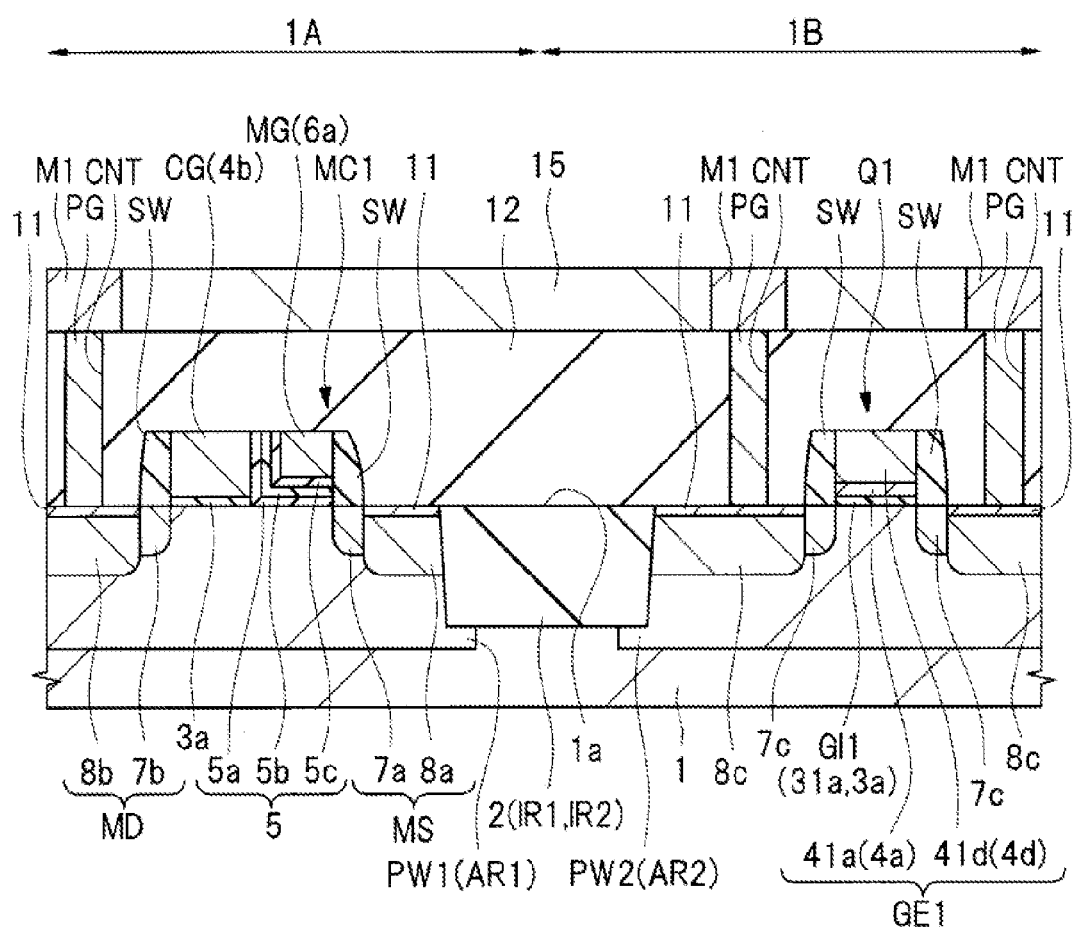
FIG. 1 is a cross-sectional view of a principal part of a semiconductor device of a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements or the like (including the number, a numeric value, an amount, a range and the like), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for such a case where it is clearly specified in particular or where it is considered to be clearly indispensable from a theoretical point of view. Similarly, in the following embodiments, when shape, position relationship or the like of an element or the like is referred to, what resembles or is similar to the shape substantially shall be included, except for the case where it is clearly specified in particular or where it is considered to be clearly not right from a theoretical point of view. This statement also applies to the numeric value and range described above.

In the following, typical embodiments will be described in detail, based on the drawings. In all the drawings for explaining embodiments, the same symbol is attached to the member having the same functionality and the repeated explanation thereof is omitted. Additionally, in the following embodiments, explanation of the same or similar part is not repeated, as a principle, unless particularly required.

Furthermore, in the drawings explaining the embodiment, hatching may be omitted even if it is a cross-sectional view, in order to make the drawings intelligible.

Moreover, in a cross-sectional view, the size of each region does not correspond to the size of an actual device, and a specific region may be displayed relatively large in order to make the drawings intelligible.

First Embodiment

In a first embodiment, there will be described a semiconductor device including a nonvolatile memory and a MISFET with a metal gate electrode, i.e., a semiconductor device having a nonvolatile memory and a MISFET with a metal gate electrode mixedly mounted therein, and a method for manufacturing the same.

In the present first embodiment, as one example of a nonvolatile memory, the nonvolatile memory having a charge storage section using a trap-insulating film, i.e., an insulating film capable of storing charges will be described. Specifically, as the nonvolatile memory, the description will be performed on the basis of a memory cell using an n-channel MISFET and a trap-insulating film.

Note that, in the present first embodiment, as the polarity of an applied voltage during a write operation, during an erase operation, and during a read operation and as the conductive polarity of a carrier, a case of using an n-channel MISFET will be described. However, when a p-channel MISFET is used, a nonvolatile memory can be caused to perform the same operation by reversing all the polarities such as the polarity of an applied voltage and the conductive polarity of a carrier, described above.

<Structure of Semiconductor Device>

Next, the structure of the semiconductor device of the present first embodiment will be described with reference to the accompanying drawings.

Figures 2, 3:
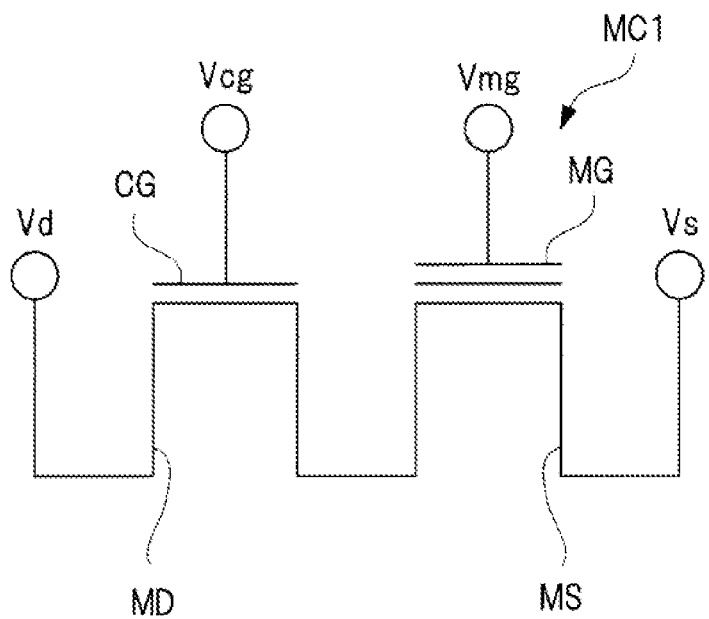
FIG. 2 is an equivalent circuit diagram of a memory cell in the semiconductor device of the first embodiment.
FIG. 3 is a table showing an example of the application conditions of a voltage applied to each region of the memory cell during "writing", "erasing", and "reading.

FIG. 1 is a cross-sectional view of a principal part of the semiconductor device of the first embodiment. FIG. 2 is an equivalent circuit diagram of a memory cell in the semiconductor device of the first embodiment.

As shown in FIG. 1, the semiconductor device includes a semiconductor substrate 1. The semiconductor substrate 1 is a semiconductor wafer formed of p-type single crystal silicon or the like having the resistivity of, for example, approximately 1 to 10 Ωcm.

The semiconductor device includes a memory cell region 1A and a peripheral circuit region 1B on a principal surface 1a side of the semiconductor substrate 1. A memory cell MC1 is formed in the memory cell region 1A, and a MISFET Q1 is formed in the peripheral circuit region 1B. The memory cell region 1A and the peripheral circuit region 1B may not be adjacent to each other. However, for ease of understanding, in the cross-sectional view of FIG. 1, the peripheral circuit region 1B is illustrated adjacent to the memory cell region 1A. Here, the peripheral circuit is a circuit other than a nonvolatile memory, and for example, is a processor, such as a CPU (Central Processing Unit), a control circuit, a sense amplifier, a column decoder, a row decoder, an input/output circuit, or the like. MISFET Q1 formed in the peripheral circuit region 1B is a MISFET for the peripheral circuit.

First, the configuration of the memory cell MC1 formed in the memory cell region 1A will be specifically described.

In the memory cell region 1A, the semiconductor device includes an active region AR1 and an element isolating region IR1. The element isolating region IR1 is for isolating an element, and an element isolating film 2 is formed in the element isolating region IR1. The active region AR1 is defined by the element isolating region IR1, and is electrically isolated from other active regions by the element isolating region IR1, and a p-well PW1 is formed in the active region AR1. That is, the active region AR1 is a region where the p-well PW1 is formed.

In the p-well PW1 of the memory cell region 1A, the memory cell MC1 formed of a memory transistor and a control transistor as shown in FIG. 1 is formed. In the memory cell region 1A, actually a plurality of memory cells MC1 is formed in an array, and FIG. 1 shows the cross-section of one memory cell MC1 among them. The memory cell MC1 is included in a nonvolatile memory provided in the semiconductor device.

The memory cell MC1 of the nonvolatile memory is a split-gate memory cell. That is, as shown in FIG. 1 and FIG. 2, the memory cell MC1 includes the control transistor with a control gate electrode CG, and the memory transistor with a memory gate electrode MG, the memory transistor being coupled to the control transistor.

As shown in FIG. 1, the memory cell MC1 of the nonvolatile memory includes n-type semiconductor regions MS and MD, the control gate electrode CG, and the memory gate electrode MG. Then, the memory cell MC1 of the nonvolatile memory includes an insulating film 3a formed between the control gate electrode CG and the semiconductor substrate 1, and an insulating film 5 formed between the memory gate electrode MG and the semiconductor substrate 1 and between the memory gate electrode MG and the control gate electrode CG.

The control gate electrode CG and the memory gate electrode MG extend along the principal surface 1a of the semiconductor substrate 1 and are arranged side by side, with the insulating film 5 interposed between their side surfaces facing each other, i.e., between their sidewalls. The extending direction of the control gate electrode CG and the memory gate electrode MG is a direction perpendicular to the plane of the view of FIG. 1. The control gate electrode CG is formed via the insulating film 3a over the p-well PW1 between a semiconductor region MD and a semiconductor region MS, i.e., over the semiconductor substrate 1, and the memory gate electrode MG is formed via the insulating film 5 over the p-well PW1 between the semiconductor region MD and the semiconductor region MS, i.e., over the semiconductor substrate 1. Moreover, the memory gate electrode MG is arranged on the semiconductor region MS side, and the control gate electrode CG is arranged on the semiconductor region MD side. The control gate electrode CG and the memory gate electrode MG are the gate electrodes constituting the nonvolatile memory, i.e., the memory cell MC1.

The control gate electrode CG and the memory gate electrode MG are adjacent to each other, with the insulating film 5 interposed therebetween, and the memory gate electrode MG is formed over the side surface of the control gate electrode CG, i.e., is formed in the form of a sidewall spacer via the insulating film 5 over the sidewall. Moreover, the insulating film 5 extends in both of a region between the memory gate electrode MG and the p-well PW1 in the semiconductor substrate 1 and a region between the memory gate electrode MG and the control gate electrode CG.

The insulating film 3a formed between the control gate electrode CG and the p-well PW1 functions as the gate insulating film of the control transistor, and the insulating film 5 between the memory gate electrode MG and the p-well PW1 functions as the gate insulating film of the memory transistor.

The insulating film 3a is preferably a high-dielectric film, i.e., the so-called high-k film, having a relative dielectric constant higher than a silicon nitride film. Note that, in the present application, when referring to a high-k film or a high-dielectric film, it means a film having the dielectric constant (relative dielectric constant) higher than silicon nitride. As the insulating film 3a, a metal oxide film such as, for example, a hafnium oxide film, a zirconium oxide film, an aluminum oxide film, a tantalum oxide film, or a lanthanum trioxide film, can be used.

The insulating film 5 is formed of a laminated film including a silicon oxide film 5a, a silicon nitride film 5b as a charge storage section over the silicon oxide film 5a, and a silicon oxide film 5c over the silicon nitride film 5b. Note that the insulating film 5 between the memory gate electrode MG and the p-well PW1 functions as the gate insulating film of the memory transistor. On the other hand, the insulating film 5 between the memory gate electrode MG and the control gate electrode CG functions as the insulating film for isolating (i.e., electrically isolating) between the memory gate electrode MG and the control gate electrode CG.

In the insulating films 5, the silicon nitride film 5b is an insulating film for storing charges, and functions as the charge storage section. That is, the silicon nitride film 5b is a trap insulating film formed inside the insulating film 5. Therefore, the insulating film 5 can be regarded as an insulating film having a charge storage section therein.

The silicon oxide film 5c and the silicon oxide film 5a positioned above and below the silicon nitride film 5b can function as a charge block layer for confining charges. A structure in which the silicon nitride film. 5b is sandwiched by the silicon oxide film 5c and the silicon oxide film 5a enables charges to be stored into the silicon nitride film 5b. The silicon oxide film 5a, the silicon nitride film 5b, and the silicon oxide film 5c can be regarded also as an ONO (Oxide-Nitride-Oxide) film.

The control gate electrode CG is formed of a conductive film, and is formed of, for example, a silicon film 4b, such as an n-type polycrystalline silicon film that is a polycrystalline silicon film having an n-type impurity introduced therein. Specifically, the control gate electrode CG is formed of the patterned silicon film 4b.

The memory gate electrode MG is formed of a conductive film, and is formed of a silicon film 6a such as, for example, an n-type polycrystalline silicon film that is a polycrystalline silicon film having an n-type impurity introduced therein. The memory gate electrode MG is formed by anisotropically etching of, i.e., etching-back of, a silicon film 6a that is formed over the semiconductor substrate 1 so as to cover the control gate electrode CG, and leaving the silicon film 6a via the insulating film 5 over the sidewall of the control gate electrode CG. Therefore, the memory gate electrode MG is formed in the form of a sidewall spacer via the insulating film 5 over one sidewall of the control gate electrode CG.

The semiconductor region MS is a semiconductor region functioning as either a source region or a drain region, and the semiconductor region MD is a semiconductor region functioning as the other of the source region or the drain region. Here, the semiconductor region MS is a semiconductor region functioning as the source region, and the semiconductor region MD is a semiconductor region functioning as the drain region. The semiconductor regions MS and MD are formed of a semiconductor region having an n-type impurity introduced therein, and are provided with an LDD (Lightly doped drain) structure, respectively.

That is, the source semiconductor region MS includes an $n^-$-type semiconductor region 7a and an $n^+$-type semiconductor region 8a having an impurity concentration higher than the $n^-$-type semiconductor region 7a. Moreover, the drain semiconductor region MD includes an $n^-$-type semiconductor region 7b and an $n^+$-type semiconductor region 8b having an impurity concentration higher than the $n^-$-type semiconductor region 7b. The $n^+$-type semiconductor region 8a has a junction depth deeper than the $n^-$-type semiconductor region 7a and also has an impurity concentration higher than the $n^-$-type semiconductor region 7a, and the $n^+$-type semiconductor region 8b has a junction depth deeper than the $n^-$-type semiconductor region 7b and also has an impurity concentration higher than the $n^-$-type semiconductor region 7b.

Over a sidewall on a side where the memory gate electrode MG and the control gate electrode CG are not adjacent to each other, a sidewall spacer SW formed of an insulating film, such as a silicon oxide film, a silicon nitride films, or a laminated film thereof, is formed. That is, the sidewall spacer SW is formed over the sidewall, i.e., over the side surface, of the memory gate electrode MG opposite to a side where the memory gate electrode MG is adjacent to the control gate electrode CG via the insulating film 5, and over a sidewall, i.e., over a side surface, of the control gate electrode CG opposite to a side where the control gate electrode CG is adjacent to the memory gate electrode MG via the insulating film 5.

Note that, a non-illustrated sidewall insulating film may be interposed between the memory gate electrode MG and the sidewall spacer SW, between the control gate electrode CG and the sidewall spacer SW, and between the control gate electrode CG and the insulating film 5.

The $n^-$-type semiconductor region 7a of the source portion is formed in a self-aligning manner with respect to the side surface of the memory gate electrode MG, and the $n^+$-type semiconductor region 8a is formed in a self-aligning manner with respect to the side surface of the sidewall spacer SW. Therefore, the low-concentration $n^-$-type semiconductor region 7a is formed under the sidewall spacer SW over the sidewall of the memory gate electrode MG, and the high-concentration $n^+$-type semiconductor region 8a is formed on an outer side of the low-concentration $n^-$-type semiconductor region 7. Accordingly, the low-concentration $n^-$-type semiconductor region 7a is formed so as to be adjacent to a channel region of the memory transistor, while the high-concentration $n^+$-type semiconductor region 8a is formed so as to contact the low-concentration $n^-$-type semiconductor region 7a and be spaced by the $n^-$-type semiconductor region 7a from the channel region of the memory transistor.

The $n^-$-type semiconductor region 7b of the drain portion is formed in a self-aligning manner with respect to the side surface of the control gate electrode CG, and the $n^+$-type semiconductor region 8b is formed in a self-aligning manner with respect to the side surface of the sidewall spacer SW. Therefore, the low-concentration $n^-$-type semiconductor region 7b is formed under the sidewall spacer SW over the sidewall of control gate electrode CG, while the high-concentration $n^+$-type semiconductor region 8b is formed on an outer side of the low-concentration $n^-$-type semiconductor region 7b. Accordingly, the low-concentration $n^-$-type semiconductor region 7b is formed so as to be adjacent to the channel region of the control transistor, while the high-concentration $n^+$-type semiconductor region 8b is formed so as to contact the low-concentration $n^-$-type semiconductor region 7b and be spaced by the $n^-$-type semiconductor region 7b from the channel region of the control transistor.

Under the insulating film 5 under the memory gate electrode MG, the channel region of the memory transistor is formed, whereas under the insulating film 3a under the control gate electrode CG, the channel region of the control transistor is formed.

Over the $n^+$-type semiconductor regions 8a and 8b, i.e., in an upper surface of the $n^+$-type semiconductor regions 8a and 8b, a metal silicide layer 11 is formed by a Salicide (Self Aligned Silicide) technique or the like. The metal silicide layer 11 is formed of, for example, a cobalt silicide layer, a nickel silicide layer, a platinum-added nickel silicide layer, or the like. With the metal silicide layer 11, a diffusion resistance and/or a contact resistance can be reduced.

Note that the metal silicide layer may be formed over the silicon film 4b constituting the control gate electrode CG or over the silicon film 6a constituting the memory gate electrode MG.

Next, the configuration of MISFET Q1 formed in the peripheral circuit region 1B is specifically described.

In the peripheral circuit region 1B, the semiconductor device includes an active region AR2 and an element isolating region IR2. The element isolating region IR2 is for isolating an element, and the element isolating film 2 is formed in the element isolating region IR2. The active region AR2 is defined by the element isolating region IR2, and is electrically isolated from other active regions by the element isolating region IR2, and a p-well PW2 is formed in the active region AR2. That is, the active region AR2 is a region having the p-well PW2 formed therein.

Note that, as stated before, in the cross-sectional view of FIG. 1, for ease of understanding, the peripheral circuit region 1B is illustrated adjacent to the memory cell region 1A. Therefore, in the cross-sectional view of FIG. 1, an example is illustrated, in which the element isolating region IR1 of the memory cell region 1A is also the element isolating region IR2 of the peripheral circuit region 1B.

In the p-well PW2 of the peripheral circuit region 1B, MISFET Q1 as shown in FIG. 1 is formed. In the peripheral circuit region 1B, actually, a plurality of MISFETs Q1 is formed, and FIG. 1 shows the cross-section perpendicular to a gate width direction of one MISFET Q1 among them.

As shown in FIG. 1, MISFET Q1 includes a semiconductor region formed of an $n^-$-type semiconductor region 7c and an $n^+$-type semiconductor region 8c, a gate insulating film GI1 formed over the p-well PW2, and a gate electrode GE1 formed over the gate insulating film GI1. The $n^-$-type semiconductor region 7c and the n+-type semiconductor region 8c are formed inside the p-well PW2 of the semiconductor substrate 1.

The gate insulating film GI1 is formed by an insulating film portion 31a formed of the insulating film 3a. The insulating film portion 31a functions as the gate insulating film GI1 of MISFET Q1. The insulating film 3a constituting the insulating film portion 31a can be an insulating film in the same layer as the insulating film 3a of the memory cell MC1.

The gate electrode GE1 is formed by a metal film portion 41a formed of a metal film 4a and a conductive film portion 41d formed of a conductive film 4d over the metal film portion 41a. That is, the gate electrode GE1 is formed by the metal film portion 41a formed of the metal film 4a in contact with the gate insulating film GI1 and the conductive film portion 41d formed of the conductive film 4d over the metal film 4a. The gate electrode GE1 includes the metal film portion 41a formed of the metal film 4a in contact with the gate insulating film GI1, and thus is the so-called metal gate electrode. Note that, in the present specification, a metal film means a conductive film exhibiting metallic conduction.

As the metal film 4a, preferably, a metal film formed of a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a tungsten (W) film, or the like can be used. Moreover, from a viewpoint of improving an electric conduction property, and from a viewpoint of causing the metal film 4 to function as an etching stopper in removing the silicon film 4b in the manufacture process of the semiconductor device, a TiN film can be more preferably used as the metal film 4a. As the conductive film 4d, a metal film of the same type as the metal film 4a can also be used, but a metal film of a different type can also be used.

The semiconductor region formed of the n−-type semiconductor region 7c and the n+-type semiconductor region 8c is the source and drain semiconductor region having an n-type impurity introduced therein, and is provided with an LDD structure, as with the semiconductor regions MS and MD of the memory cell MC1. That is, the n+-type semiconductor region 8c has a junction depth deeper than the n−-type semiconductor region 7c, and also has an impurity concentration higher than the n−-type semiconductor region 7c.

Over the sidewall of gate electrode GE1, there is formed the sidewall spacer SW formed of an insulating film such as a silicon oxide film, a silicon nitride films, or a laminated film thereof.

Over the n+-type semiconductor region 8c, i.e., on an upper surface of the n+-type semiconductor region 8), as with over the n+-type semiconductor regions 8a and 8b in the memory cell MC1, i.e., on an upper surface of the n+-type semiconductor regions 8a and 8b, the metal silicide layer 11 is formed by the Salicide technique or the like. Note that the metal silicide layer may be formed over the gate electrode GE1.

Next, a structure over the memory cell MC1 formed in the memory cell region 1A and a structure over MISFET Q1 formed in the peripheral circuit region 1B will be specifically described.

Over the semiconductor substrate 1, an interlayer insulating film 12 is formed as an insulating film so as to cover the control gate electrode CG, the memory gate electrode MG, the gate electrode GE1, and the sidewall spacer SW. The interlayer insulating film 12 is formed of a single film of a silicon oxide film, or a laminated film of a silicon nitride film and a silicon oxide film. An upper surface of the interlayer insulating film 12 is planarized.

A contact hole CNT is formed in the interlayer insulating film 12, and inside the contact hole CNT, a conductive plug PG is embedded as a conductor portion.

The plug PG is formed by a thin barrier conductor film formed over the bottom portion and the sidewall, i.e., over a side surface of the contact hole CNT, and a main conductor film that is formed so as to fill the contact hole CNT over this barrier conductor film. In FIG. 1, for ease of illustration, the barrier conductor film and the main conductor film constituting the plug PG are shown in an integrated manner. Note that, the barrier conductor film constituting the plug PG can be, for example, a titanium (Ti) film, a titanium nitride (TiN) film, or a laminated film thereof, and the main conductor film constituting the plug PG can be a tungsten (W) film.

The contact hole CNT and the plug PG embedded therein are formed over the n+-type semiconductor regions 8a, 8b, and 8c, over the control gate electrode CG, over the memory gate electrode MG, and over the gate electrode GE1, and so on. In the bottom portion of the contact hole CNT, for example, a part of the metal silicide layer 11 over the surface of the n+-type semiconductor regions 8a, 8b, and 8c, a part of the metal silicide layer 11 over the surface of the control gate electrode CG, or a part of the metal silicide layer 11 over the surface of the memory gate electrode MG is exposed. Alternatively, in the bottom portion of the contact hole CNT, for example, a part of the metal silicide layer 11 over the surface of the gate electrode GE1 and the like are exposed. Then, the plug PG is coupled to this exposed area. Note that, FIG. 1 shows the cross-section in which a part of the metal silicide layer 11 over the surface of the n+-type semiconductor regions 8b and 8c is exposed in the bottom portion of the contact hole CNT and is electrically coupled to the plug PG embedding the contact hole CNT.

Over the interlayer insulating film 12 into which the plug PG is embedded, a wiring M1 that is the first layer wiring is formed. The wiring M1 is a damascene wiring as an embedded wiring containing copper (Cu) as a principal conductive material, for example, and is embedded into a wiring groove provided in the insulating film 15 formed over the interlayer insulating film 12. The wiring M1 is electrically coupled via the plug PG to the semiconductor region MS, semiconductor region MD, control gate electrode CG, and memory gate electrode MG, of the memory cell MC1, as well as the n+-type semiconductor region 8c and gate electrode GE1, of MISFET Q1, and the like. Note that, FIG. 1 shows, as an example of the wiring M1 electrically coupled, via the plug PG, to the semiconductor region MD of the memory cell MC1 and to the n+-type semiconductor region 8c of MISFET Q1. Although a wiring and an insulating film, in a further upper layer are actually formed, the illustration and description thereof are omitted here. Moreover, the wiring M1 and the wiring in an upper layer of the wiring M1 are not limited to the damascene wiring, but can be formed by patterning a conductive film for wiring, and, for example, can also be a tungsten (W) wiring, an aluminum (Al) wiring, or the like.

Next, the operation of the memory cell MC1 formed in the memory cell region 1A will be described.

FIG. 3 is a table showing an example of the application conditions of a voltage applied to each region of the memory cell during "writing", "erasing", and "reading." The table of FIG. 3 describes a voltage Vmg applied to the memory gate electrode MG, a voltage Vs applied to the semiconductor region MS, a voltage Vcg applied to the control gate electrode CG, and a voltage Vd applied to the semiconductor region MD during each of "writing", "erasing", and "reading". In addition, the table of FIG. 3 describes a voltage Vb applied to the p-well PW1 during each of "writing", "erasing", and "reading". Note that, the example shown in the table of FIG. 3 is a preferable example of the application conditions of the voltages, and is not limiting, but can be variously modified as necessary. Furthermore, in the present first embodiment, injection of electrons into the silicon nitride film 5b that is the charge storage section inside the insulating film 5 of the memory transistor is defined as "writing", whereas injection of holes (i.e., positive holes) is defined as "erasing." Moreover, a power supply voltage Vdd is assumed to be 1.5 V.

As a write method, hot electron writing referred to as a source side injection (SSI) method can be used. For example, the voltage as shown in the column of the "write" of FIG. 3 is applied to each region of the memory cell MC1 where writing is performed, and thus electrons are injected into the silicon nitride film 5b inside the insulating film 5 of the memory cell MC1. A hot electron is generated in the channel region under between the memory gate electrode MG and the control gate electrode CG, and is injected into the silicon nitride film 5b that is the charge storage section inside the insulating film 5 under the memory gate electrode MG. The injected hot electron is trapped at a trap level inside the silicon nitride film 5b inside the insulating film 5, and as a result, a threshold voltage (Vth) of the memory transistor rises.

As an erase method, a hot hole injection/erase method based on band-to-band tunnelling (BTBT) phenomenon can be used. That is, erasing is performed by injecting holes, i.e., positive holes which are generated by the BTBT phenomenon, into the charge storage section, i.e., into the silicon nitride film 5b inside the insulating film 5. For example, there is performed application of the voltage as shown in the column of "erase" of FIG. 3 to each region of the memory cell MC1 where erasing is performed, to thereby generate holes by the BTBT phenomenon, the generated holes are accelerated by an electric field, and thus the holes are injected into the silicon nitride film 5b in the insulating film 5 of the memory cell MC1, thereby the threshold voltage of the memory transistor being lowered.

During reading, for example the voltage as shown in the column of "read" of FIG. 3 is applied to each region of the memory cell MC1 where reading is performed. The voltage Vmg applied to the memory gate electrode MG during reading is set to a value between the threshold voltage of the memory transistor in a write state and the threshold voltage of the memory transistor in an erase state whereby a distinction between the write state or the erase state can be made.

<Method for Manufacturing Semiconductor Device>

Next, a method for manufacturing the semiconductor device of the present first embodiment will be described.

Figure 4:
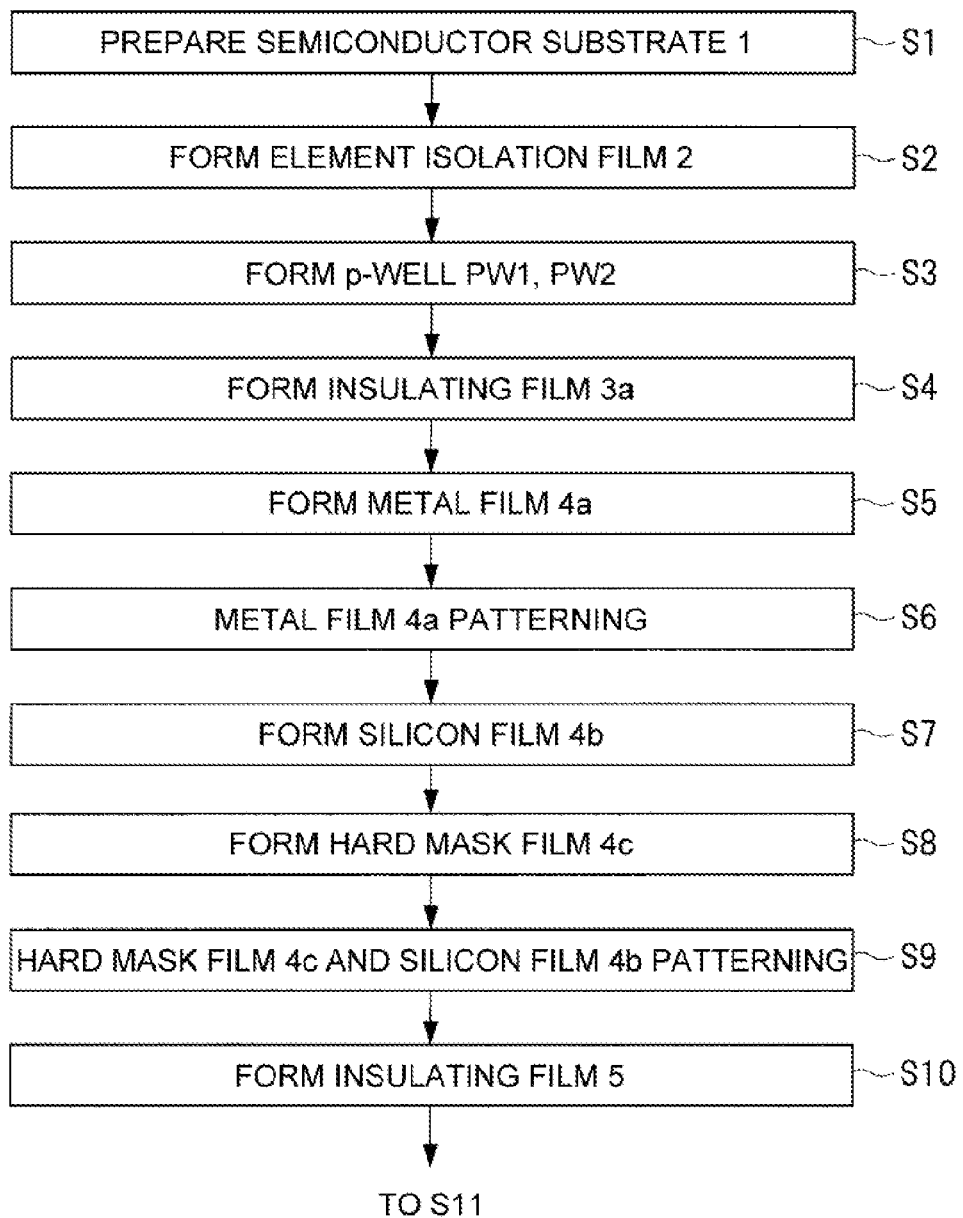
FIG. 4 is a process flow chart showing a part of a manufacturing process of the semiconductor device of the first embodiment.
Figure 5:
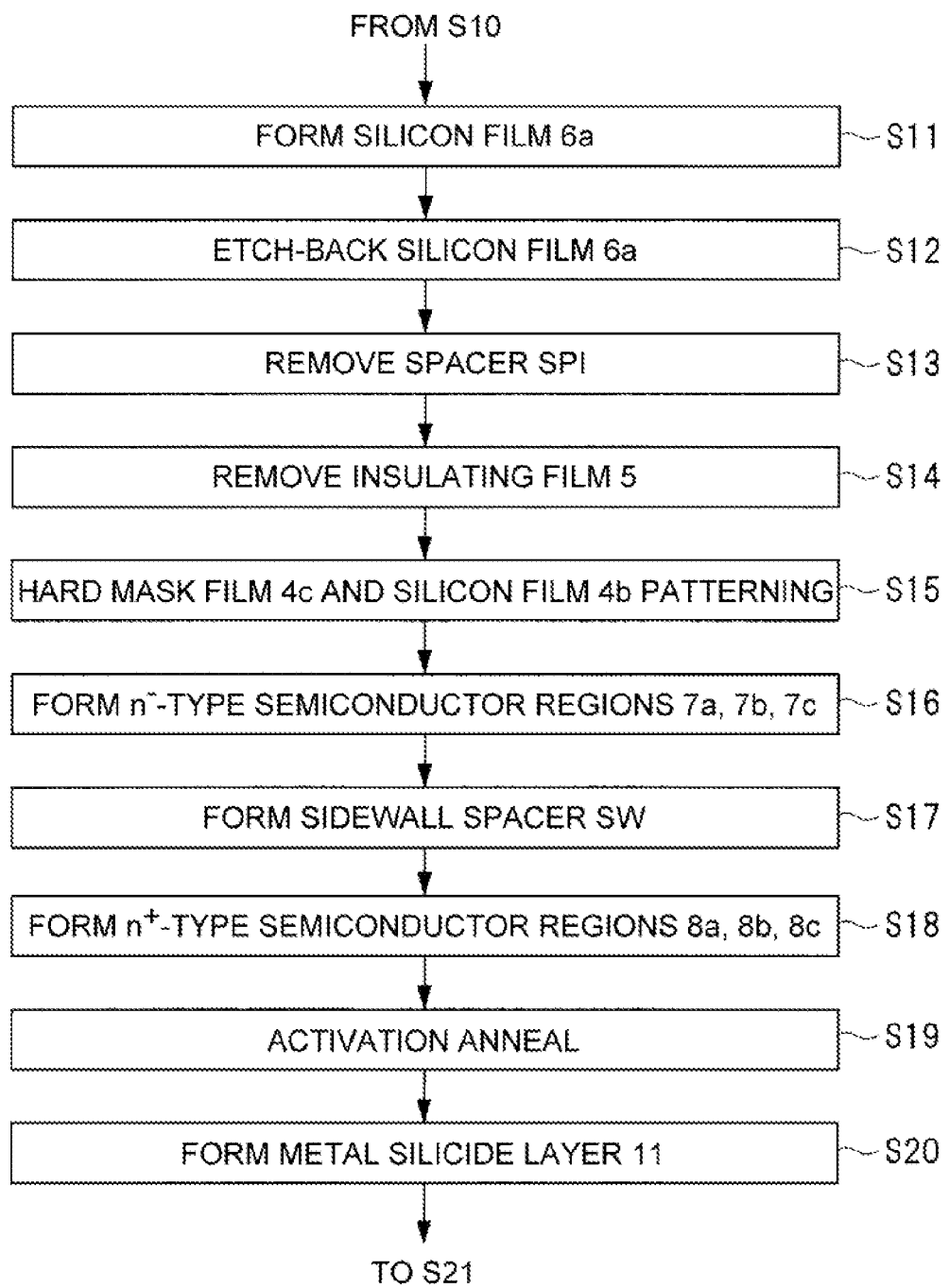
FIG. 5 is a process flow chart showing a part of the manufacturing process of the semiconductor device of the first embodiment.
Figure 6:
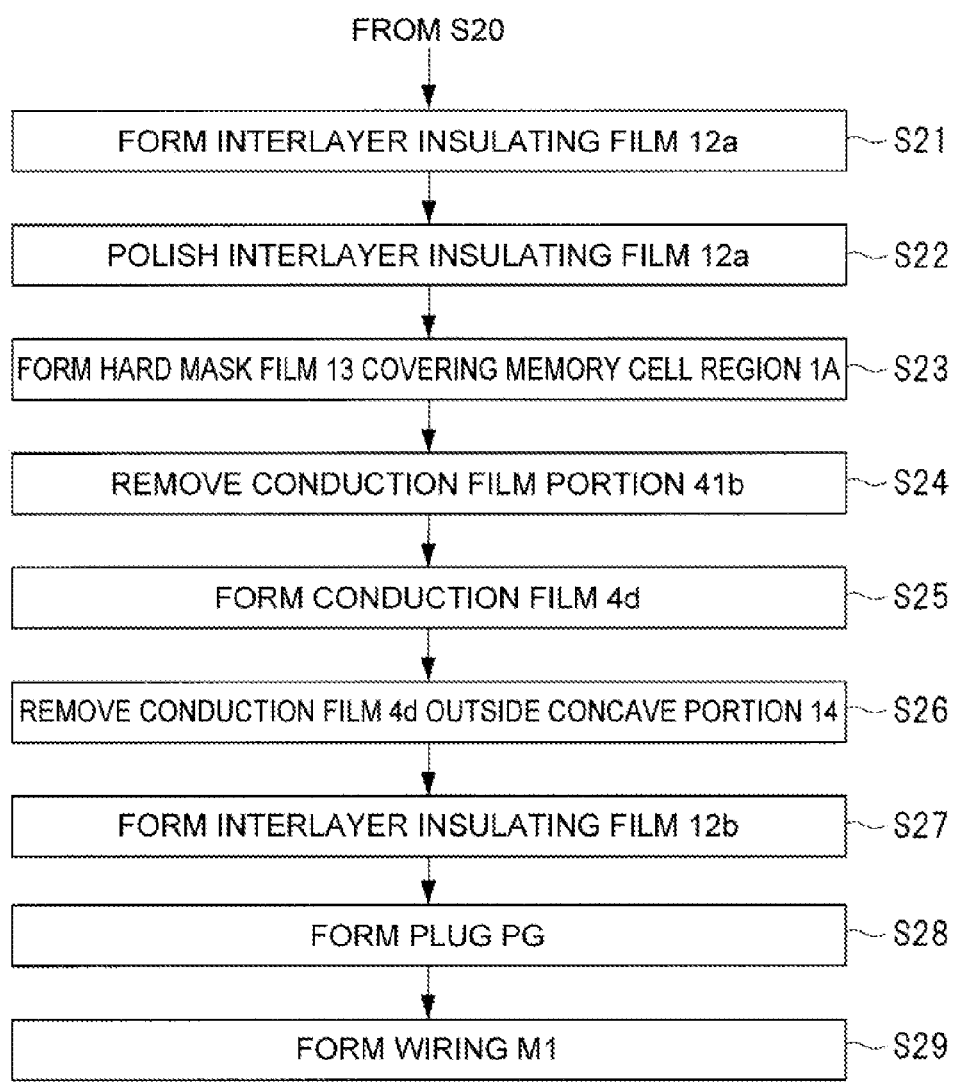
FIG. 6 is a process flow chart showing a part of the manufacturing process of the semiconductor device of the first embodiment.

FIG. 4 to FIG. 6 are process flow diagrams showing a part of the manufacture process of the semiconductor device of the first embodiment. FIG. 7 to FIG. 32 are cross-sectional views of a principal part of the semiconductor device of the first embodiment during a manufacturing process. The cross-sectional views of FIG. 7 to FIG. 32 show the cross-sectional view of the principal part of the memory cell region 1A and the peripheral circuit region 1B, showing how the memory cell MC1 is formed in the memory cell region 1A and how MISFET Q1 is formed in the peripheral circuit region 1B, respectively.

As stated before, the memory cell region 1A and the peripheral circuit region 1B may not be adjacent to each other, but for ease of understanding, in the cross-sectional views of FIG. 7 to FIG. 32, the peripheral circuit region 1B is illustrated adjacent to the memory cell region 1A.

In addition, in the present first embodiment, there will be described a case where an n-channel control transistor and an n-channel memory transistor are formed in the memory cell region 1A, but by reversing the conductivity type, a p-channel control transistor and a p-channel memory transistor can also be formed in the memory cell region 1A. Similarly, in the present first embodiment, there will be described a case where the n-channel MISFET Q1 is formed in the peripheral circuit region 1B, but by reversing the conductivity type, a P-channel MISFET Q1 can also be formed in the peripheral circuit region 1B, and furthermore a CMISFET (Complementary MISFET) and the like can also be formed in the peripheral circuit region 1B.

As shown in FIG. 7, first the semiconductor substrate 1 as a semiconductor wafer formed of p-type single crystal silicon having a resistivity of, for example, approximately 1 to 10 Ωcm is prepared (Step S1 in FIG. 4). Next, there is formed the element isolating film 2, which serves as the element isolating region IR1 defining the active region AR1 in the memory cell region 1A on the principal surface 1a side of the semiconductor substrate 1 and which also serves as the element isolating region IR2 defining the active region AR2 in the peripheral circuit region 1B on the principal surface 1a side of the semiconductor substrate 1 (Step S2 in FIG. 4). The element isolating film 2 is formed of an insulator such as silicon oxide, and can be formed by, for example, an STI (Shallow Trench Isolation) method, a LOCOS (Local Oxidization of Silicon) method, or the like. For example, after forming a groove for element isolation in the element isolating regions IR1 and IR2, an insulating film formed of, for example, silicon oxide is embedded into this groove for element isolation, and thus the element isolating film 2 can be formed.

Next, as shown in FIG. 7, the p-well PW1 is formed in the active region AR1 in the memory cell region 1A, and the p-well PW2 is formed in the active region AR2 in the peripheral circuit region 1B (Step S3 in FIG. 4). The p-wells PW1 and PW2 can be formed by ion-implanting a p-type impurity such as, for example, boron (B), into the semiconductor substrate 1. The p-wells PW1 and PW2 are formed from the principal surface 1a of the semiconductor substrate 1 through a predetermined depth.

Here, in the present first embodiment, in the memory cell region 1A, it is preferable that channel-doping ion implantation is not performed on the p-well PW1 in the semiconductor substrate 1. Alternatively, even when the channel-doping ion implantation is performed, the dose amount is preferably reduced for lowering of the impurity concentration of the channel region.

Next, a natural oxidation film on the surface of the semiconductor substrate 1 is removed by, for example, wet etching or the like using a hydrofluoric acid (HF) solution, and the surface of the semiconductor substrate 1 is cleaned by washing the surface of the semiconductor substrate 1. Therefore, the surface of the semiconductor substrate 1, i.e., the surfaces of the p-wells PW1 and PW2, is exposed.

Next, as shown in FIG. 8, the insulating film 3a is formed on the entire principal surface 1a of the semiconductor substrate 1 (Step S4 in FIG. 4). In this Step S4, in the memory cell region 1A on the principal surface 1a side of the semiconductor substrate 1 and in the peripheral circuit region 1B on the principal surface 1a side of the semiconductor substrate 1, the insulating film 3a is formed over the semiconductor substrate 1. As described above, as the insulating film 3a, the so-called high-k film, i.e., a high-dielectric film, can be used, and an example of the material usable as the insulating film 3a is as described above. Furthermore, the insulating film 3a can be formed by a sputtering method, an atomic layer deposition (ALD) method, a chemical vapor phase growth (CVD) method, or the like.

Note that, although illustration is omitted, before forming the insulating film 3a, an interface layer formed of a silicon oxide film and the like may be formed over the surface of the semiconductor substrate 1, i.e., over the surface of the p-wells PW1 and PW2, through the use of a thermal oxidation method or the like, and then over this interface layer, the insulating film 3a can be formed.

In addition, as described in Step S24' to Step S26' to be described later, the gate insulating film GI1 of MISFET Q1 can be the one formed of an insulating film different from the insulating film 3a by performing the so-called high-k last process. In such a case and when a film other than the high-k film is used as the gate insulating film of the memory cell MC1, there can be used, as the insulating film 3a, for example, a silicon oxide film, a nitrogen silicon film, a silicon oxynitride film, or the like.

Figure 9:
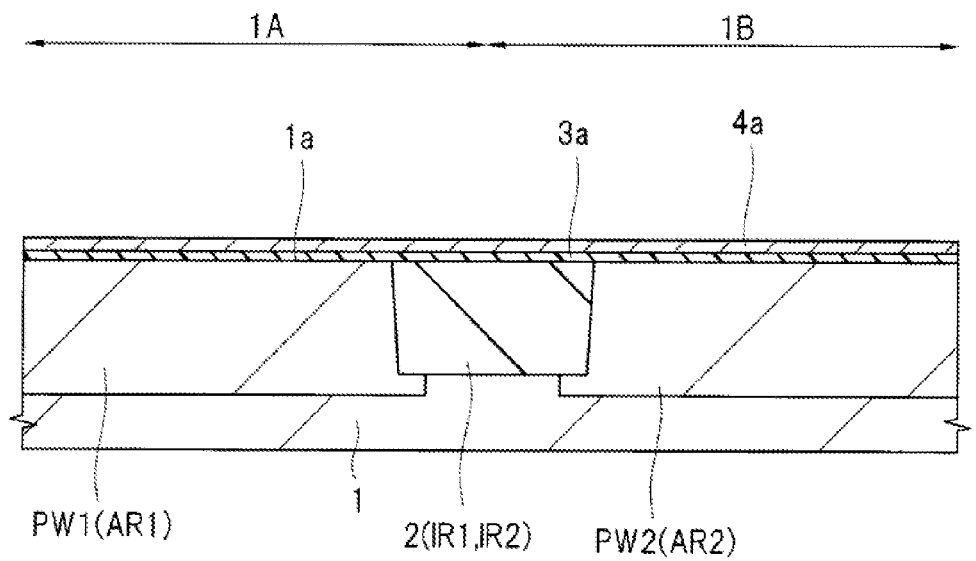
FIG. 9 is a cross-sectional view of the principal part during a manufacturing process of the semiconductor device of the first embodiment.

Next, as shown in FIG. 9, the metal film 4a is formed (i.e., deposited) on the entire principal surface 1a of the semiconductor substrate 1 (Step S5 in FIG. 4). In this Step S5, in the memory cell region 1A and in the peripheral circuit region 1B, the metal film 4a for the gate electrode GE1 as the metal gate electrode is formed over the insulating film 3a. An example of the material preferable as the metal film 4a is as described above. The metal film 4a can be formed by, for example, a sputtering method or the like, and the film thickness of the metal film 4a can be set to, for example, approximately 2 nm.

Note that, the metal film 4a functions also as an etching stopper in removing the conductive film portion 41b formed of the silicon film 4b in Step S24 to be described later.

Next, the metal film 4a of the memory cell region 1A is patterned by etching such as dry etching (Step S6 in FIG. 4). This Step S6 can be performed, for example, as follows.

Figure 10:
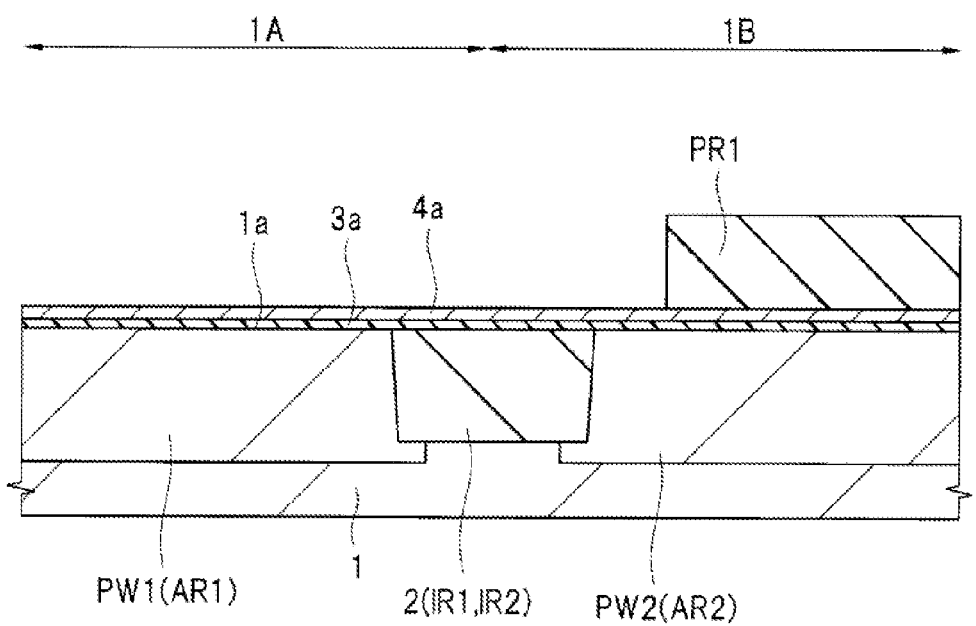
FIG. 10 is a cross-sectional view of the principal part during a manufacturing process of the semiconductor device of the first embodiment.

First, as shown in FIG. 10, a photoresist pattern PR1 is formed over the metal film 4a by using a photolithography method. The photoresist pattern PR1 is formed in a region being a part of the peripheral circuit region 1B, the region where the metal film 4a is to be left.

Next, using the photoresist pattern PR1 as an etching mask, the metal film 4a is etched and patterned by, for example, dry etching or wet etching. Subsequently, the photoresist pattern PR1 is removed.

In this way, the metal film 4a is patterned in Step S6, and as shown in FIG. 11, the metal film 4a is removed across the entire memory cell region 1A and the insulating film 3a is exposed. On the other hand, in a part of the peripheral circuit region 1B, the metal film 4a is left.

In the present first embodiment, in Step S9 to be described later, patterning is performed so that an outer peripheral portion of the metal film 4a that has been left in Step S6, that is, a side surface of the metal film 4a that has been left in Step S6, is covered with the silicon film 4b. Accordingly, as described above, the metal film 4a remains in a part of the peripheral circuit region 1B, instead of in the entire peripheral circuit region 1B. In other words, the metal film 4a is left so that the position of an outer periphery of the metal film 4a left in Step S6 backs away from the position of an outer periphery of a region where the silicon film 4b is to be left in Step 9 to be described later. Alternatively, in a plan view, the metal film 4a is left so that a region where the metal film 4a is left in Step S6 is included in a region where the silicon film 4b is to be left in Step 9 to be described later.

Next, as shown in FIG. 12, on the entire principal surface 1a of the semiconductor substrate 1, the silicon film 4b is formed, i.e., the silicon film 4b is deposited (Step S7 in FIG. 4). In this Step S7, the silicon film 4b is formed over the insulating film 3a of the memory cell region 1A, over the insulating film 3a of the peripheral circuit region 1B, and over the metal film 4a of the peripheral circuit region 1B. That is, in the memory cell region 1A and in the peripheral circuit region 1B, the silicon film 4b is formed on the principal surface 1a of the semiconductor substrate, including over the metal film 4a that has been left in Step S6.

The silicon film 4b is formed of a polycrystalline silicon, i.e., a polycrystalline silicon film, and can be formed using a CVD method or the like. The film thickness of the silicon film 4b can be set to an enough degree of thickness so as to cover the metal film 4a. During deposition, the silicon film 4b is formed as an amorphous silicon film, and then a subsequent heat treatment can turn the amorphous silicon film into a polycrystalline silicon film.

More preferably, the silicon film 4b has a low resistivity by introducing, for example, an n-type impurity such as phosphorus (P) or arsenic (As), or a p-type impurity such as boron (B). The impurity can be introduced during deposition of the silicon film 4b or after the deposition. In a case where an impurity is introduced during deposition of the silicon film 4b, gas for deposition of the silicon film 4b is caused to contain a doping gas whereby the silicon film 4b having an impurity introduced therein can be deposited. On the other hand, in a case where an impurity is introduced after deposition of the silicon film, the silicon film is deposited without intentionally introducing an impurity and thereafter an impurity is introduced into this silicon film by an ion implantation method or the like whereby the silicon film 4b having an impurity introduced therein can be formed.

Next, as shown in FIG. 12, on the entire principal surface 1a of the semiconductor substrate 1, i.e., over the silicon film 4b), a hard mask film 4c formed of a silicon nitride film, for example, is formed, i.e., deposited (Step S8 in FIG. 4). The hard mask film 4c can be formed using, for example, a CVD method or the like. Although the illustration is omitted in FIG. 12, a thin silicon oxide film may be formed between the silicon film 4b and the hard mask film 4c by oxidizing the surface of the silicon film 4b, for example, by thermal oxidation before forming the hard mask film 4c.

Next, the hard mask film 4c and the silicon film 4b are patterned by etching such as, for example, dry etching (Step S9 in FIG. 4). This Step S9 can be performed as follows, for example.

Figure 13:
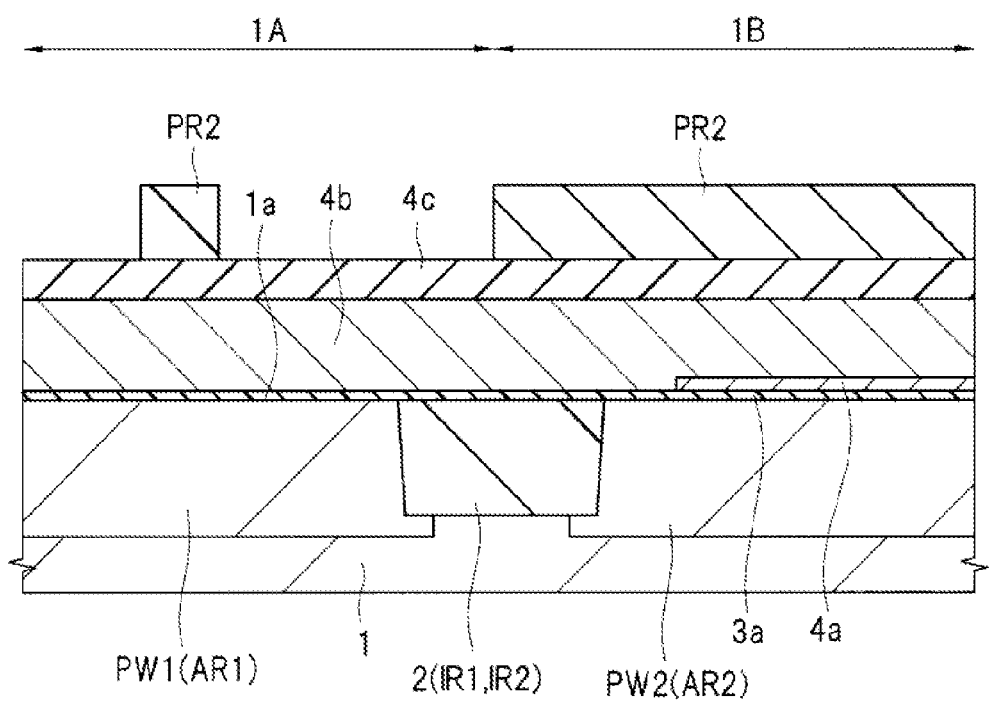
FIG. 13 is a cross-sectional view of the principal part during a manufacturing process of the semiconductor device of the first embodiment.

That is, as shown in FIG. 13, over the hard mask film 4c, i.e., over the silicon film 4b, a photoresist pattern PR2 is formed using a photolithography method. The photoresist pattern PR2 is formed in a region where the control gate electrode CG is to be formed, the region being a part of the memory cell region 1A, and on the entire peripheral circuit region 1B.

Next, using the photoresist pattern PR2 as an etching mask, the hard mask film 4c and the silicon film 4b are etched and patterned by, for example, dry etching or the like. Subsequently, the photoresist pattern PR2 is removed.

Figure 14:
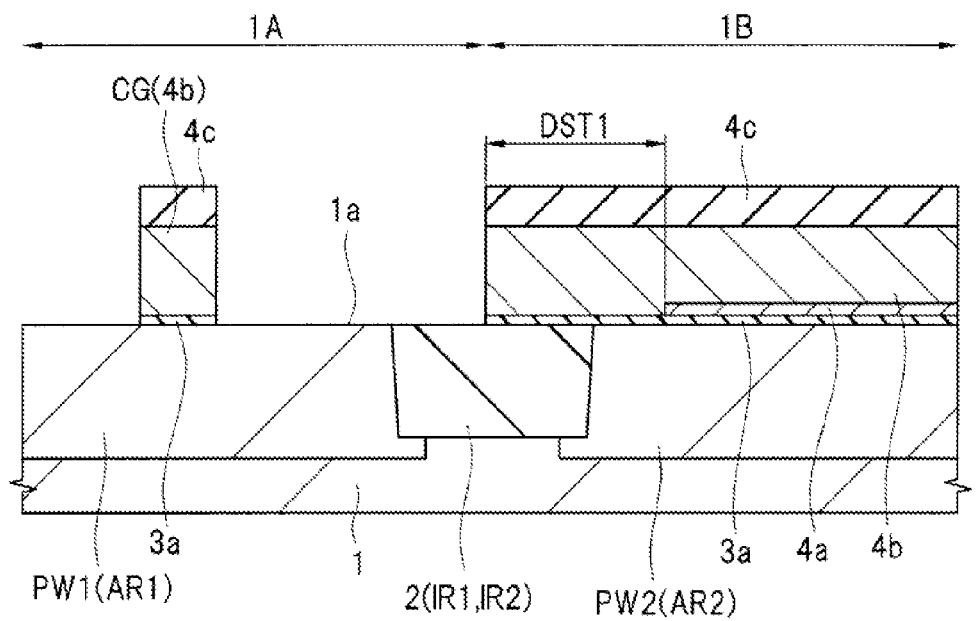
FIG. 14 is a cross-sectional view of the principal part during a manufacturing process of the semiconductor device of the first embodiment.

In this way, in Step S9, as shown in FIG. 14, in the memory cell region 1A, the hard mask film 4c and the silicon film 4b are patterned, and the control gate electrode CG formed of the patterned silicon film 4b is formed. On the other hand, in the peripheral circuit region 1B, the hard mask film 4c and the silicon film 4b are not patterned because the photoresist pattern PR2 is formed as described above. Therefore, in the entire peripheral circuit region 1B, the hard mask film 4c and the silicon film 4b remain.

In the present first embodiment, in Step S6, the metal film 4a remains in a part of the peripheral circuit region 1B, instead of in the entire peripheral circuit region 1B. In other words, the position of an outer periphery of the remaining metal film 4a that has been left in Step S6 backs away from the position of an outer periphery of the silicon film 4b left in Step S9. Alternatively, in a plan view, a region where the metal film 4a that has been left in Step S6 is included in a region where the silicon film 4b is to be left in Step S9.

Accordingly, in Step S9, the silicon film 4b over the metal film 4a is left so that an outer peripheral portion of the metal film 4a that has been left in Step S6, i.e., a side surface of the metal film 4a that has been left in Step S6, is covered with the silicon film 4b. Therefore, the outer peripheral portion of the metal film 4a is not exposed, and thus, in Step S10 to be described later, the oxidation of the metal film 4a can be prevented or suppressed in performing, on the semiconductor substrate 1, an oxidation treatment for forming the insulating film 5.

A distance DST1 (see FIG. 14), by which the position of an outer periphery of the metal film 4a is caused to back away from the position of an outer periphery of the silicon film 4b, is no less than approximately 10 nm, is more preferably approximately 30 nm, and is further preferably approximately 100 nm, as described later.

Note that, it is also possible not to form the hard mask film 4c over the silicon film 4b by not performing Step S8 after Step S7 and before Step S9. At this time, the hard mask film 4c is not formed also over the control gate electrode CG that is formed by patterning of the silicon film 4b in Step S9.

The insulating film 3a in a part not covered with the control gate electrode CG in the memory cell region 1A may be removed by performing the dry etching of Step S9 or by performing wet etching after the dry etching of Step S9. The insulating film 3a positioned under the control gate electrode CG is left without being removed by the dry etching of Step S9 or by wet etching after the dry etching of Step S9. In the memory cell region 1A, the insulating film 3a remaining under the control gate electrode CG serves as the gate insulating film of the control transistor. Accordingly, the control gate electrode CG formed of the silicon film 4b is put into a state of being formed via the insulating film 3a as the gate insulating film over the p-well PW1 in the semiconductor substrate 1. Then, in a part in which the control gate electrode CG is not formed in the memory cell regions 1A, the principal surface 1a of the semiconductor substrate 1 is exposed.

Figure 15:
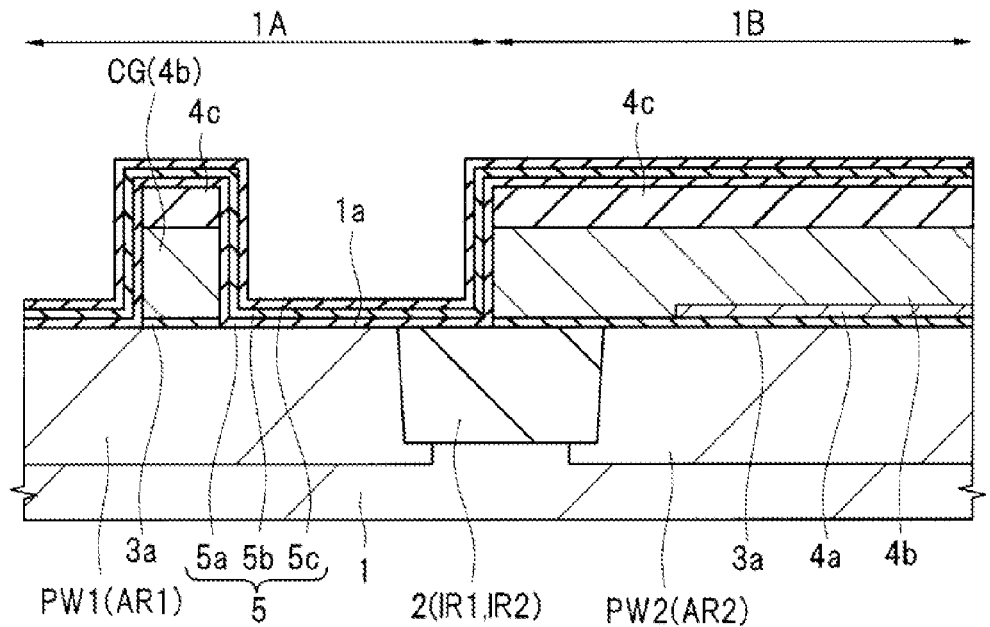
FIG. 15 is a cross-sectional view of the principal part during a manufacturing process of the semiconductor device of the first embodiment.

Next, after cleaning the surface of the semiconductor substrate 1 by washing the surface of the semiconductor substrate 1, as shown in FIG. 15, the insulating film 5 for the gate insulating film of the memory transistor is formed on the entire principal surface 1a of the semiconductor substrate 1 (Step S10 in FIG. 4). In this Step S10, in the memory cell region 1A, the insulating film 5 is formed on the exposed principal surface 1a of the semiconductor substrate 1 and on the surface of the control gate electrode CG. In addition, in the peripheral circuit region 1B, the insulating film 5 is formed on an upper surface and a side surface of the hard mask film 4c that has been left in Step S9, and on a side surface of the silicon film 4b. That is, in Step S10, the insulating film 5 is formed so as to cover the principal surface 1a of the semiconductor substrate 1, the surface of the control gate electrode CG, and the surfaces of the hard mask film 4c and silicon film. 4b, which have been left in the peripheral circuit region 1B in Step S9.

The insulating film 5 is an insulating film having a charge storage section therein, as described above, and is formed, as an insulating film, of a laminated film of the silicon oxide film 5a, the silicon nitride film 5b, and the silicon oxide film 5c, which are formed in this order from the bottom.

In the insulating film 5, the silicon oxide film 5a can be formed by an oxidation treatment such as, for example, a thermal oxidation treatment, and as the thermal oxidation treatment, ISSG (In Situ Steam Generation) oxidation can be used. In addition, in the insulating film 5, the silicon nitride film 5b can be formed by, for example, a CVD method. Furthermore, in the insulating film 5, the silicon oxide film 5c can be formed by, for example, a CVD method. Note that FIG. 15 shows a case where the silicon oxide film 5a is formed by an ISSG method or a CVD method.

In Step S9, the silicon film 4b is patterned so that the outer peripheral portion of the metal film 4a that has been left in Step S6, i.e., the side surface of the metal film 4a that has been left in Step S6, is covered with the silicon film 4b, and thus the outer peripheral portion of the metal film 4a is not exposed. For this reason, in Step S10, the oxidation of the metal film 4a can be prevented or suppressed in performing, on the semiconductor substrate 1, an oxidation treatment for forming the insulating film 5.

First, the silicon oxide film 5a is formed on the exposed principal surface 1a of the semiconductor substrate 1, the surface, i.e., the side surface and upper surface, of the control gate electrode CG, the surface of the remaining hard mask film 4c, and the surface, i.e., the side surface, of the remaining silicon film 4b by a thermal oxidation treatment such as, for example, ISSG oxidation. At this time, there are oxidized the exposed principal surface 1a of the semiconductor substrate 1, the surface of the control gate electrode CG, the surface of the remaining hard mask film 4c, and the surface of the remaining silicon film 4b. The thickness of the silicon oxide film 5a can be set to, for example, approximately 4 nm.

As other aspect, the silicon oxide film 5a can be formed by an ALD method. At this time, the exposed principal surface 1a of the semiconductor substrate 1, the surface of the control gate electrode CG, the surface of the remaining hard mask film 4c, and the surface of the remaining silicon film 4b are heat-treated in an oxidation atmosphere. Accordingly, also in this case, the exposed principal surface 1a of the semiconductor substrate 1, the surface of the control gate electrode CG, the surface of the remaining hard mask film 4c, and the surface of the remaining silicon film 4b are oxidized.

Next, the silicon nitride film 5b is formed over the silicon oxide film 5a by a CVD method, and the silicon oxide film 5c is further formed over the silicon nitride film 5b by a CVD method, thermal oxidation, or both of them. Thus, the insulating film 5 formed of the laminated film of the silicon oxide film 5a, the silicon nitride film 5b, and the silicon oxide film 5c can be formed.

The insulating film 5 formed in the memory cell region 1A functions as the gate insulating film of the memory gate electrode MG to be formed later, and has a charge storing function. The insulating film 5 has a structure in which the silicon nitride film 5b as the charge storage section is sandwiched by the silicon oxide films 5a and 5c as a charge block layer. In addition, a potential barrier height of the charge block layer formed of the silicon oxide films 5a and 5c becomes higher than a potential barrier height of the charge storage section formed of the silicon nitride film 5b.

Note that, in the present first embodiment, as the insulating film having a trap level, the silicon nitride film 5b is used, and the use of the silicon nitride film 5b is preferable in terms of reliability. However, an insulating film having a trap level is not limited to the silicon nitride film, and there can be used a high-dielectric film such as, for example, an aluminum oxide film (alumina), a hafnium oxide film, or a tantalum oxide film, the high-dielectric film having a dielectric constant higher than the silicon nitride film.

Figure 16:
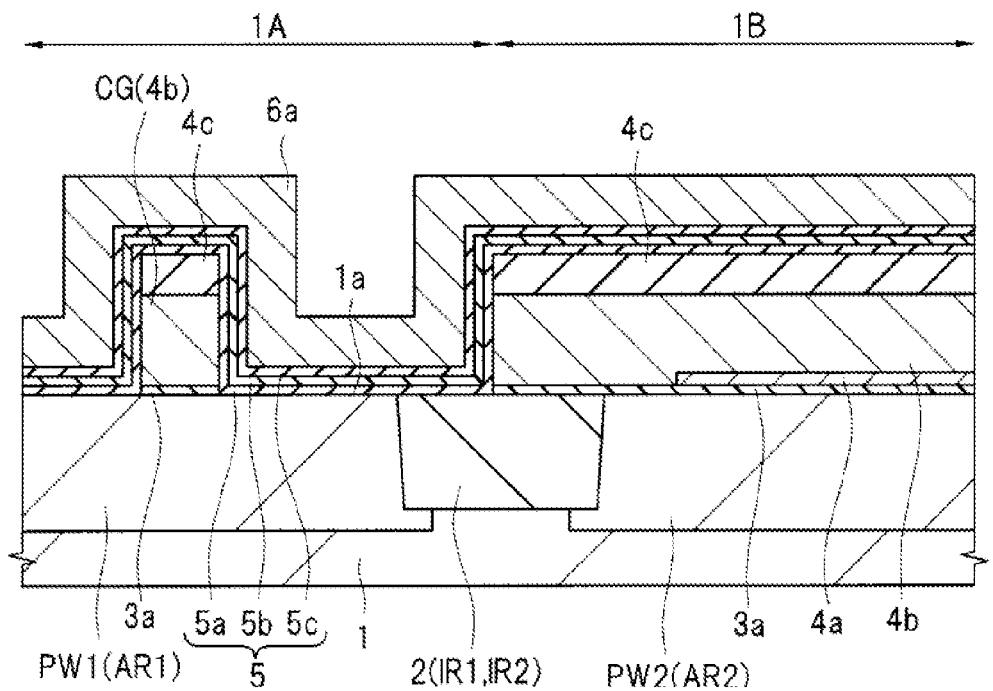
FIG. 16 is a cross-sectional view of the principal part during a manufacturing process of the semiconductor device of the first embodiment.

Next, as shown in FIG. 16, the silicon film 6a is formed, i.e., the silicon film 6a is deposited on the entire principal surface 1a of the semiconductor substrate 1, i.e., over the insulating film 5, (Step S11 in FIG. 5).

The silicon film 6a is formed of a polycrystalline silicon, i.e., a polycrystalline silicon film, and can be formed using a CVD method or the like. During deposition, the silicon film 6a is formed as an amorphous silicon film, and then a subsequent heat treatment can turn the amorphous silicon film into a polycrystalline silicon film.

More preferably, the silicon film 6a has a low resistivity by introducing an n-type impurity, for example, such as phosphorus (P) or arsenic (As), or a p-type impurity such as boron (B). The impurity can be introduced into the silicon film 6a by ion implantation after deposition of the silicon film 6a, but the impurity can also be introduced into the silicon film 6a during deposition of the silicon film 6a. In a case where the impurity is introduced during deposition of the silicon film 6a, gas for deposition of the silicon film 6a is caused to contain a doping gas whereby the silicon film 6a having an impurity introduced therein can be deposited.

Next, the silicon film 6a is etched back by an anisotropic etching technique and thus the memory gate electrode MG is formed (Step S12 in FIG. 5).

Figure 17:
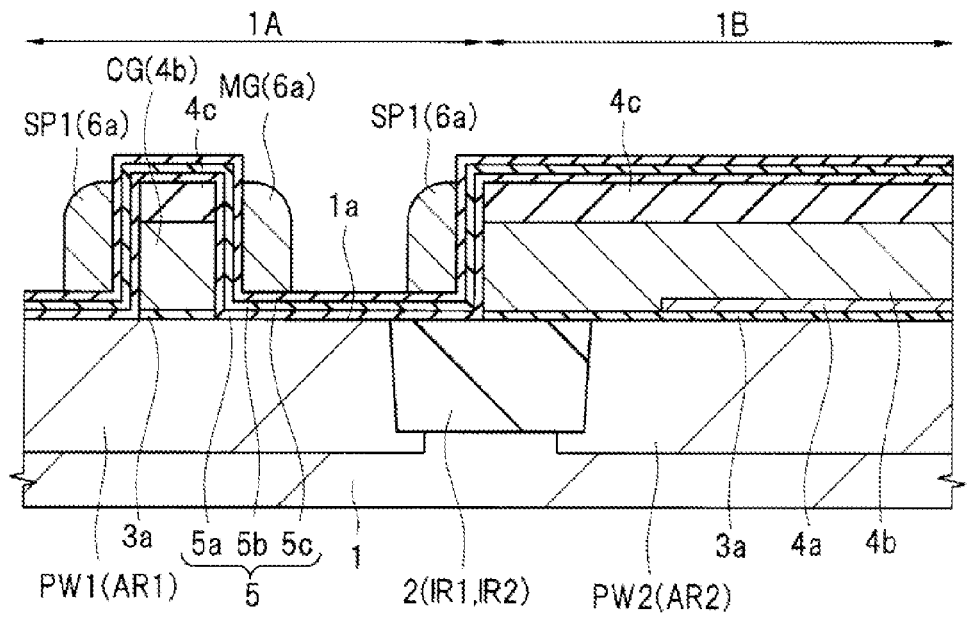
FIG. 17 is a cross-sectional view of the principal part during a manufacturing process of the semiconductor device of the first embodiment.

In this Step S12, the silicon film 6a is etched back by an amount corresponding to the film thickness of the silicon film 6a, and thus the silicon film 6a is left in the form of a sidewall spacer via the insulating film 5 over the both sidewalls of the control gate electrode CG, i.e., over the side surfaces, and the silicon film 6a is removed in other regions. Therefore, as shown in FIG. 17, in the memory cell region 1A, the memory gate electrode MG is formed by the silicon film 6a that is left in the form of a sidewall spacer via the insulating film 5 over one sidewall among the both sidewalls of the control gate electrode CG. In addition, the spacer SP1 is formed by the silicon film 6a left in the form of a sidewall spacer via the insulating film 5 over other sidewall.

The memory gate electrode MG is formed over the insulating film 5 so as to be adjacent to the control gate electrode CG via the insulating film 5. The memory gate electrode MG and the spacer SP1 are formed over the sidewalls on mutually opposite sides of the control gate electrode CG, and have a structure substantially symmetric with the control gate electrode CG sandwiched. Moreover, also over the side surface of the silicon film 4b remaining in the peripheral circuit region 1B and over the side surface of the hard mask film 4c, the spacer SP1 is formed by the silicon film 6a remaining in the form of a sidewall spacer via the insulating film 5.

Between the memory gate electrode MG formed in Step S12 and the p-well PW1 in the semiconductor substrate 1 and also between the memory gate electrode MG and the control gate electrode CG, the insulating film 5 is interposed, and this memory gate electrode MG is formed by the silicon film 6a in contact with the insulating film 5.

At the stage of execution of the etch back process of Step S12, a part not covered with any of the memory gate electrode MG and the spacer SP1 in the insulating films 5, i.e., the insulating film 5 of a part not covered with any of the memory gate electrode MG and the spacer SP1 is exposed. The insulating film 5 under the memory gate electrode MG in the memory cell region 1A serves as the gate insulating film of the memory transistor. In addition, a memory gate length can be adjusted by adjusting the film thickness of the silicon film 6a formed in Step S11.

Figure 18:
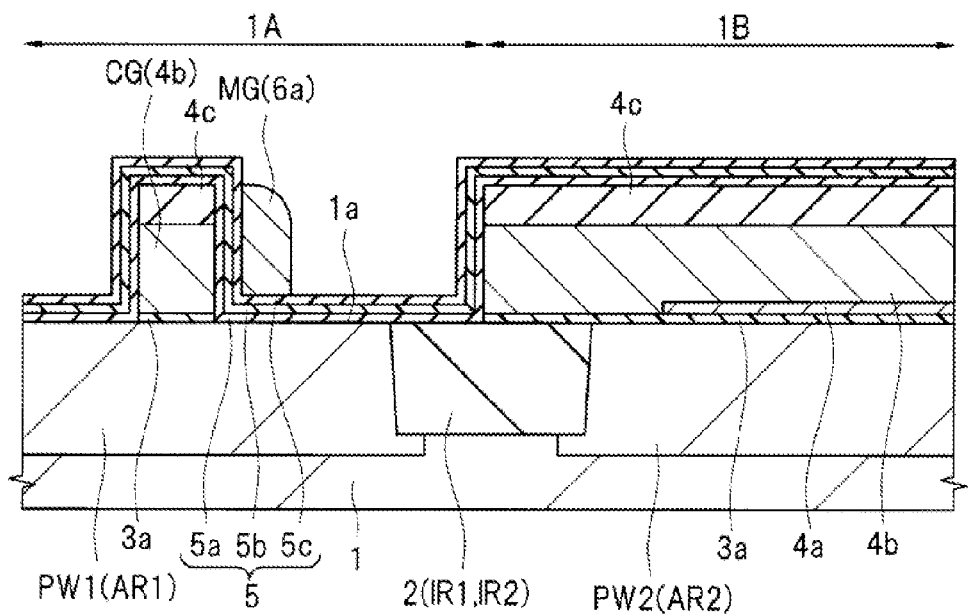
FIG. 18 is a cross-sectional view of the principal part during a manufacturing process of the semiconductor device of the first embodiment.

Next, using a photolithographic technique, there is formed, over the semiconductor substrate 1a, a photoresist pattern (not shown) in which the memory gate electrode MG is covered and the spacer SP1 is exposed. Then, by dry etching with the formed photoresist pattern as an etching mask, the spacer SP1 is removed (Step S13 in FIG. 5). Subsequently, this photoresist pattern is removed. With this Step S13, as shown in FIG. 18, the spacer SP1 is removed, but the memory gate electrode MG is left without being etched because it is covered with the photoresist pattern.

Figure 19:
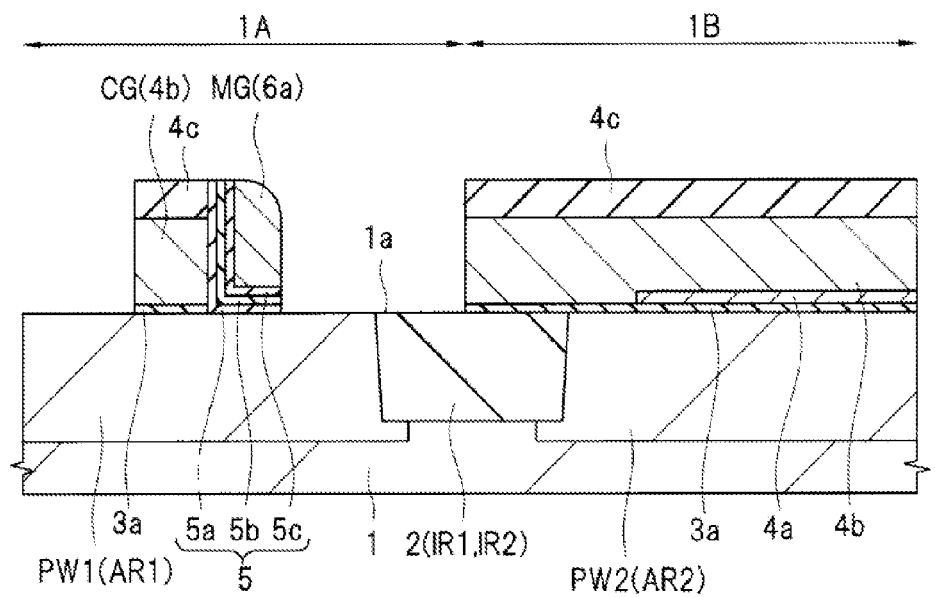
FIG. 19 is a cross-sectional view of the principal part during a manufacturing process of the semiconductor device of the first embodiment.

Next, as shown in FIG. 19, a part exposed without being covered with the memory gate electrode MG in the insulating films 5, i.e., the insulating film 5 of a part not covered with the memory gate electrode MG, is removed by etching such as, for example, wet etching (Step S14 in FIG. 5). In this case, in the memory cell region 1A, the insulating film 5 positioned under the memory gate electrode MG and the insulating film 5 positioned between the memory gate electrode MG and the control gate electrode CG are left without being removed, and the insulating film 5 positioned in other regions is removed. As apparent also from FIG. 19, in the memory cell region 1A, the insulating film 5 extends continuously across both regions (i.e., a region between the memory gate electrode MG and the p-well PW1 in the semiconductor substrate 1 and a region between the memory gate electrode MG and the control gate electrode CG).

Note that, in Step S14, the etching can also be performed so that in the insulating film 5 the silicon oxide film 5c and the silicon nitride film 5b are removed and the silicon oxide film 5a is left without being removed. In this case, at the stage of FIG. 19, the state where the silicon oxide film 5a remains is maintained.

Next, the hard mask film 4c, the silicon film 4b, the metal film 4a, and the insulating film 3a of the peripheral circuit region 1B are patterned using a photolithographic technique and an etching technique (Step S15 in FIG. 5). This Step S15 can be performed, for example, as follows.

Figure 20:
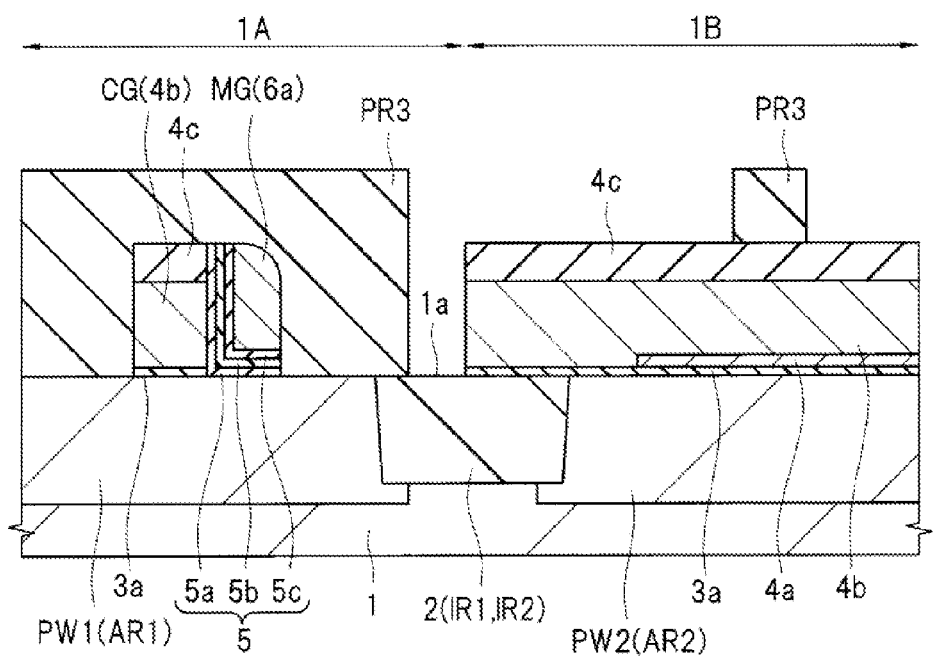
FIG. 20 is a cross-sectional view of the principal part during a manufacturing process of the semiconductor device of the first embodiment.

First, as shown in FIG. 20, over the principal surface 1a of the semiconductor substrate 1, a photoresist pattern PR3 is formed using a photolithography method. The photoresist pattern PR3 is formed in a region where the gate electrode GE1 is to be formed, the region being a part of the peripheral circuit region 1B, and in the entire memory cell region 1A.

Next, using the photoresist pattern PR3 as an etching mask, the hard mask film 4c, the silicon film 4b, the metal film 4a, and the insulating film 3a of the peripheral circuit region 1B are etched and patterned by, for example, dry etching or the like. On the other hand, the memory gate electrode MG and the control gate electrode CG are not etched because the memory cell region 1A is covered with the photoresist pattern PR3. Subsequently, the photoresist pattern PR3 is removed.

Figure 21:
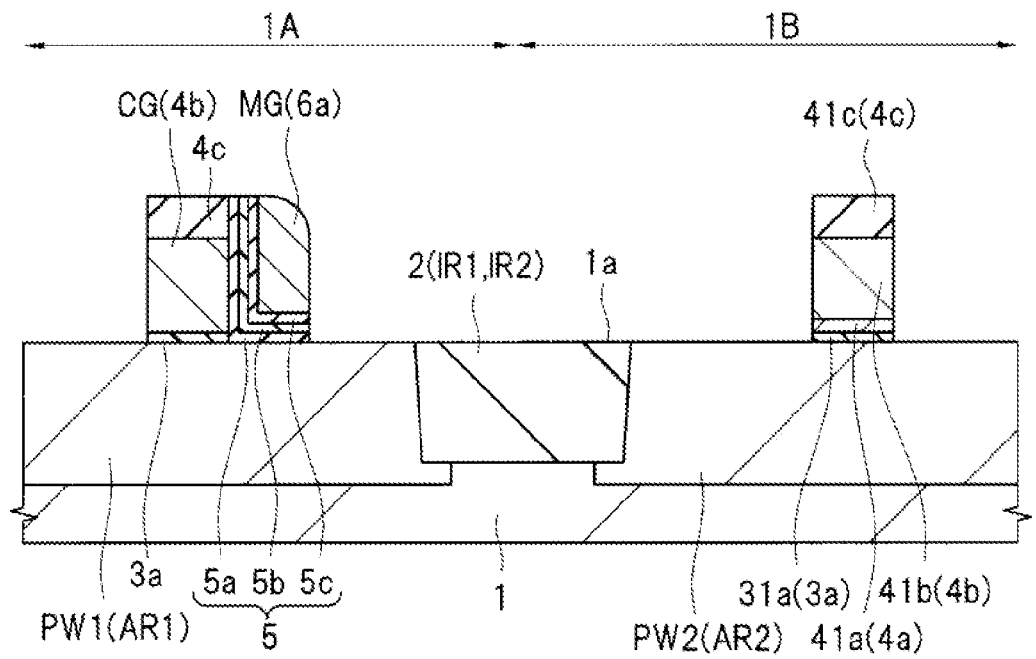
FIG. 21 is a cross-sectional view of the principal part during a manufacturing process of the semiconductor device of the first embodiment.

In this way, as shown in FIG. 21, in a part of the peripheral circuit region 1B, the insulating film portion 31a formed of the insulating film 3a, the metal film portion 41a formed of the metal film 4a, the conductive film portion 41b formed of the silicon film 4b, and the mask film portion 41c formed of the hard mask film 4c are formed.

Note that, after Step S15, a sidewall insulating film can be formed over the sidewalls of the control gate electrode CG and the memory gate electrode MG, and over the sidewall of the gate electrode GE1 prior to Step S16 to be described later.

Next, the n⁻-type semiconductor regions 7a, 7b, and 7c are formed using an ion implantation technique or the like (Step S16 in FIG. 5). In this Step S16, an n-type impurity such as, for example, arsenic (As) or phosphorus (P), is introduced (i.e., doped) into the p-wells PW1 and PW2 of the semiconductor substrate 1, with the control gate electrode CG, the memory gate electrode MG, and the gate electrode GE1 used as the mask. Therefore, the n⁻-type semiconductor regions 7a, 7b, and 7c are formed.

In this case, the n⁻-type semiconductor region 7a is formed in self-alignment with the side surface of the memory gate electrode MG in the memory cell region 1A. Moreover, the n⁻-type semiconductor region 7b is formed in self-alignment with the side surface of the control gate electrode CG in the memory cell region 1A. Furthermore, the n⁻-type semiconductor region 7c is formed in self-alignment with the side surface of the gate electrode GE1 in the peripheral circuit region 1B. The n⁻-type semiconductor regions 7a, 7b, and 7c can be formed in the same ion implantation process, but can also be formed in a different ion implantation process.

Next, the sidewall spacer SW is formed over the sidewall of the control gate electrode CG, over the sidewall of the memory gate electrode MG, and over the sidewall of the gate electrode GE1 (Step S17 in FIG. 5).

First, an insulating film for the sidewall spacer SW is formed, i.e., deposited, on the entire principal surface 1a of the semiconductor substrate 1, and the formed insulating film is etched back by, for example, anisotropic etching. In this way, the sidewall spacer SW is formed by selectively leaving this insulating film over the sidewall of the control gate electrode CG, over the sidewall of the memory gate electrode MG, and over the sidewall of the gate electrode GE1. This sidewall spacer SW is formed of an insulating film such as a silicon oxide film, a silicon nitride film, or a laminated film thereof.

Next, the n⁺-type semiconductor regions 8a, 8b, and 8c are formed using an ion implantation technique or the like (Step S18 in FIG. 5). In this Step S18, an n-type impurity such as arsenic (As) or phosphorus (P) is introduced, i.e., doped into the p-wells PW1 and PW2 of the semiconductor substrate 1, by using, as the mask, the control gate electrode CG, the memory gate electrode MG, the gate electrode GE1, and the sidewall spacer SW over the sidewall thereof. Therefore, the n⁺-type semiconductor regions 8a, 8b, and 8c are formed.

In this case, the n⁺-type semiconductor region 8a is formed in self-alignment with the sidewall spacer SW over the sidewall of the memory gate electrode MG in the memory cell region 1A. In addition, the n⁺-type semiconductor region 8b is formed in self-alignment with the sidewall spacer SW over the sidewall of the control gate electrode CG in the memory cell region 1A. Furthermore, the n⁺-type semiconductor region 8c is formed in self-alignment with the sidewall spacer SW over both the sidewalls of the gate electrode GE1 in the peripheral circuit region 1B. Therefore, an LDD structure is formed. The n⁺-type semiconductor regions 8a, 8b, and 8c can be formed in the same ion implantation process, but can also be formed in a different ion implantation process.

In this way, with the n⁻-type semiconductor region 7a and the n⁺-type semiconductor region 8a having an impurity concentration higher than the n⁻-type semiconductor region 7a, the n-type semiconductor region MS functioning as the source region of the memory transistor is formed. Furthermore, with the n⁻-type semiconductor region 7b and the n⁺-type semiconductor region 8b having an impurity concentration higher than n⁻-type semiconductor region 7b, the n-type semiconductor region MD functioning as the drain region of the control transistor is formed.

Figure 22:
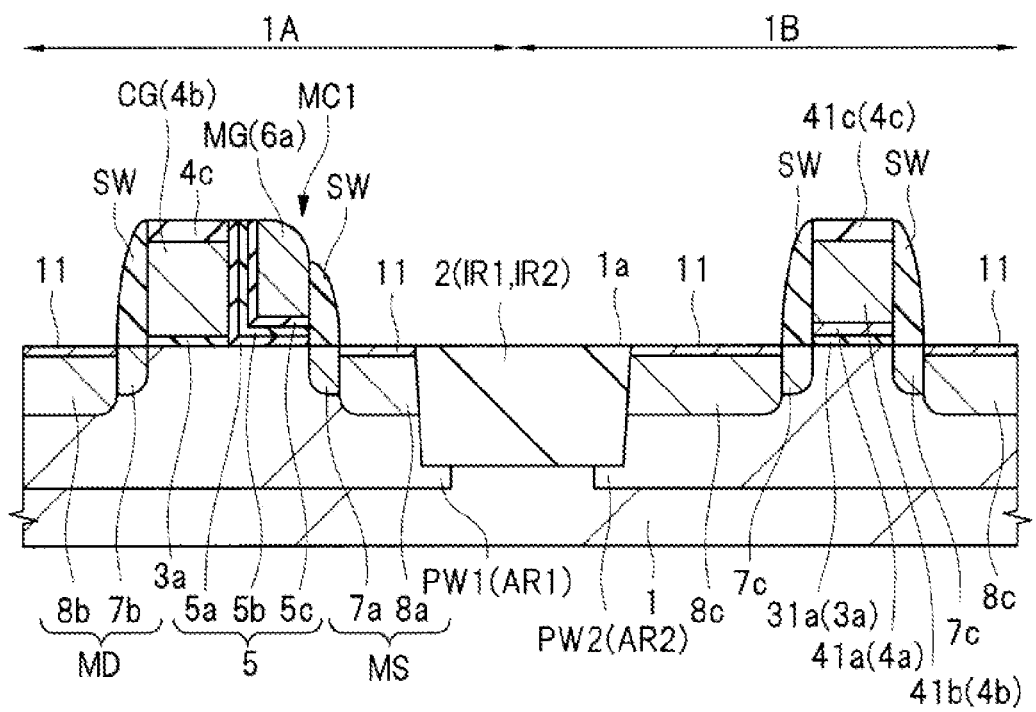
FIG. 22 is a cross-sectional view of the principal part during a manufacturing process of the semiconductor device of the first embodiment.

Subsequently, there is performed activation annealing that is a heat treatment for activating the impurities introduced into the n⁻-type semiconductor regions 7a, 7b, and 7c, the n⁺-type semiconductor regions 8a, 8b, and 8c, and the like (Step S19 in FIG. 5). Therefore, as shown in FIG. 22, the memory cell MC1 of the nonvolatile memory is formed in the memory cell region 1A.

Next, the metal silicide layer 11 is formed (Step S20 in FIG. 5). In this Step S20, a metal film is formed, i.e., deposited on the entire principal surface 1a of the semiconductor substrate 1 so as to cover the control gate electrode CG, the memory gate electrode MG, the gate electrode GE1, and the sidewall spacer SW. The metal film is formed of, for example, a cobalt (Co) film, a nickel (Ni) film, or a nickel platinum alloy film, and can be formed using a sputtering method or the like. In addition, a heat treatment is performed on the semiconductor substrate 1, thereby causing the respective upper layer portions of the n⁺-type semiconductor regions 8a, 8b, and 8c to react with the metal film. Therefore, in the respective upper portions of the n⁺-type semiconductor regions 8a, 8b, and 8c, the metal silicide layer 11 is formed, respectively. The metal silicide layer 11 can be, for example, a cobalt silicide layer, a nickel silicide layer, or a platinum-added nickel silicide layer. Subsequently, an unreacted metal film is removed. By performing the so-called Salicide process, the metal silicide layer 11 can be formed in the respective upper portions of the n⁺-type semiconductor regions 8a, 8b, and 8c as shown in FIG. 22.

Figure 23:
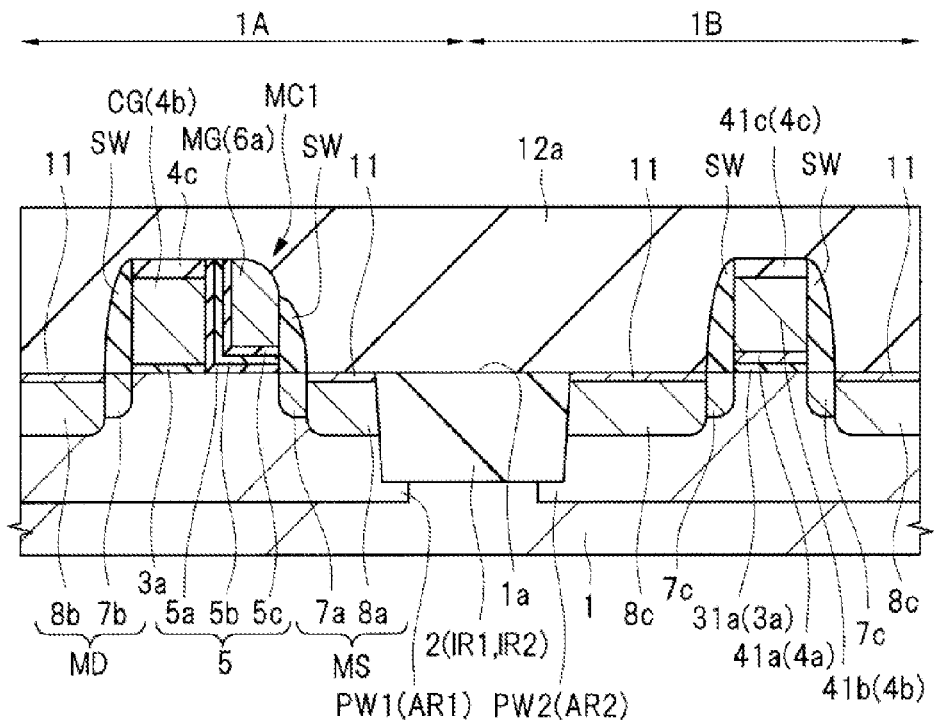
FIG. 23 is a cross-sectional view of the principal part during a manufacturing process of the semiconductor device of the first embodiment.

Next, as shown in FIG. 23, an interlayer insulating film 12a is formed, i.e., deposited as an insulating film on the entire principal surface 1a of the semiconductor substrate 1 so as to cover the control gate electrode CG, the memory gate electrode MG, the gate electrode GE1, and the sidewall spacer SW over the sidewalls thereof (Step S21 in FIG. 6). In this Step S21, the interlayer insulating film 12a is formed so as to cover the insulating film portion 31a, the metal film portion 41a, and the conductive film portion 41b. The interlayer insulating film 12a is formed of a single film of a silicon oxide film, a laminated film of a silicon nitride film and a silicon oxide film or the like, and can be formed using, for example, a CVD method or the like.

Figure 24:
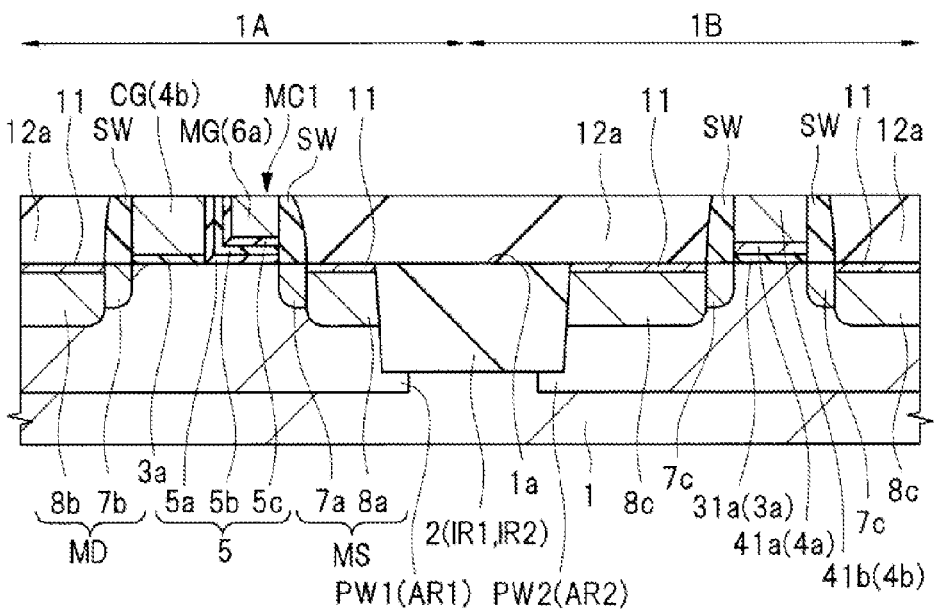
FIG. 24 is a cross-sectional view of the principal part during a manufacturing process of the semiconductor device of the first embodiment.

Next, as shown in FIG. 24, the interlayer insulating film 12a is polished and the conductive film portion 41b is exposed (Step S22 in FIG. 6). In this Step S22, the mask film portion 41c formed of the interlayer insulating film 12a and the hard mask film 4c is polished using a CMP (Chemical Mechanical Polishing) method or the like. Then, the upper surface of the interlayer insulating film 12a is planarized and the upper surface of the conductive film portion 41b formed of the silicon film 4b is exposed. Note that, in a case where the mask film portion 41c formed of the hard mask film 4c is not formed, in Step S22, the interlayer insulating film 12a is polished and the upper surface of the conductive film portion 41b formed of the silicon film 4b is exposed.

Figure 25:
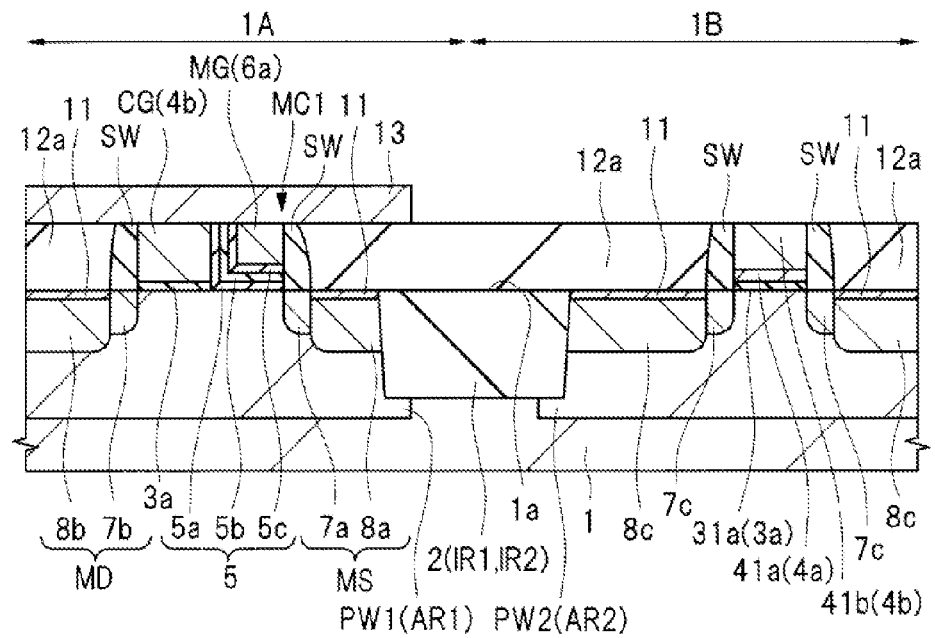
FIG. 25 is a cross-sectional view of the principal part during a manufacturing process of the semiconductor device of the first embodiment.

Next, as shown in FIG. 25, a hard mask film 13 covering the memory cell region 1A is formed (Step S23 in FIG. 6).

First, the hard mask film 13 formed of a silicon nitride film is formed, i.e., deposited, on the entire principal surface 1a of the semiconductor substrate 1. The hard mask film 13 can be formed using, for example, a CVD method or the like.

Next, using a photolithographic technique, there is formed, over the semiconductor substrate 1, a photoresist pattern (not shown) in which the memory cell region 1A is covered and the peripheral circuit region 1B is exposed. Then, the hard mask film 13 is removed by dry etching, with the formed photoresist pattern as an etching mask. Subsequently, this photoresist pattern is removed. Therefore, as shown in FIG. 25, in the peripheral circuit region 1B, the removal of the hard mask film 13 exposes the conductive film portion 41b, whereas in the memory cell region 1A, the hard mask film 13 is left without being etched because it is covered with the photoresist pattern.

Figure 26:
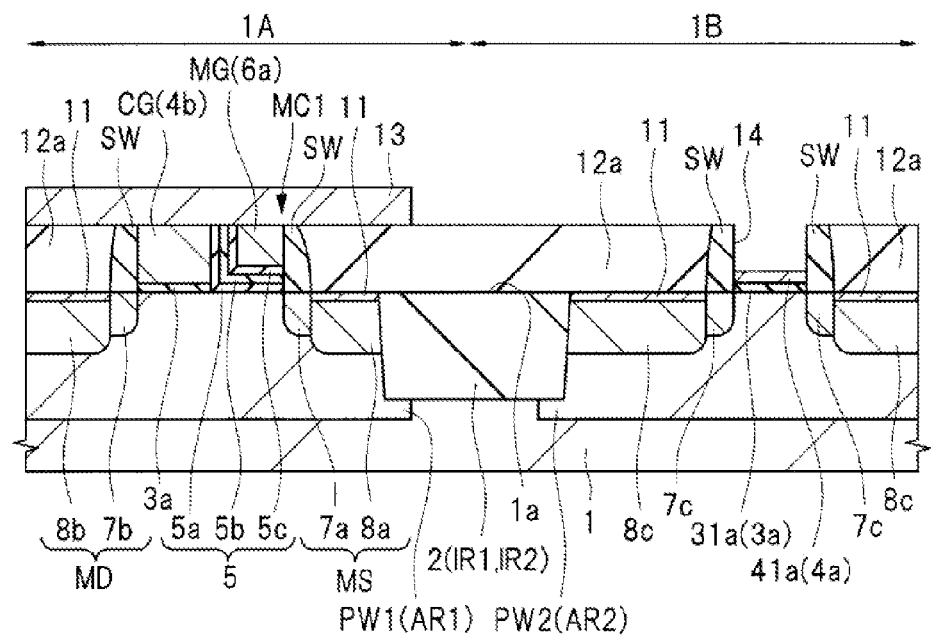
FIG. 26 is a cross-sectional view of the principal part during a manufacturing process of the semiconductor device of the first embodiment.

Next, as shown in FIG. 26, the exposed conductive film portion 41b is etched and removed (Step S24 in FIG. 6). That is, the conductive film portion 41b functions as a dummy gate electrode.

In this Step S24, the conductive film portion 41b is preferably removed by wet etching using an etchant. Although, depending on the quality of the material of the silicon film 4b constituting the conductive film portion 41b, as an etchant, for example, ammonia water, hydrogen peroxide solution, or the like can be used. With this Step S24, the conductive film portion 41b formed of the silicon film 4b is removed and the metal film portion 41a positioned under the conductive film portion 41b is exposed. In addition, a part in which the conductive film portion 41b is removed, serves as a concave portion 14. In the bottom portion of the concave portion 14, the metal film portion 41a is exposed, whereas on a sidewall, i.e., a side surface, of the concave portion 14, the sidewall spacer SW is exposed. That is, in this Step S24, the concave portion 14 is formed by removing the conductive film portion 41b, and thus the metal film portion 41a is exposed in the bottom portion of the concave portion 14.

In Step S24, under etching conditions, including selection of an etchant, in which the metal film portion 41a is hard to be etched in comparison with the conductive film portion 41b, etching of the conductive film portion 41b selectively removes the conductive film portion 41b. That is, the metal film portion 41a formed of the metal film 4a is used as an etching stopper.

In a case where the metal film portion 41a is not formed but the conductive film portion 41b is formed directly over the insulating film portion 31a formed of the insulating film 3a, the insulating film portion 31a might be etched and furthermore the p-well PW2 of the semiconductor substrate 1 might be etched, in etching the conductive film portion 41b. On the other hand, in a case where the conductive film portion 41b is formed via the metal film portion 41a over the insulating film portion 31a, the metal film portion 41a functions as an etching stopper in etching the conductive film portion 41b. For this reason, in etching the conductive film portion 41b, the insulating film portion 31a and the p-well PW2 can be prevented from being etched.

In the present first embodiment, in Step S10, in performing, on the semiconductor substrate 1, an oxidation treatment for forming the insulating film 5, there is no risk that the metal film 4a is oxidized and there is no risk that the quality of the material of the metal film 4a changes. Accordingly, in etching the conductive film portion 41b, the metal film portion 41a can be caused to more reliably function as an etching stopper.

Furthermore, in Step S24, under etching conditions, including selection of an etchant, in which the interlayer insulating film 12a is hard to be etched in comparison with the conductive film portion 41b, etching of the conductive film portion 41b selectively removes the conductive film portion 41b. Therefore, etching of the interlayer insulating film 12a is suppressed or prevented.

On the other hand, the control gate electrode CG and the memory gate electrode MG are covered with the hard mask film 13 and are not exposed, and thus are not etched in Step S24.

Figure 27:
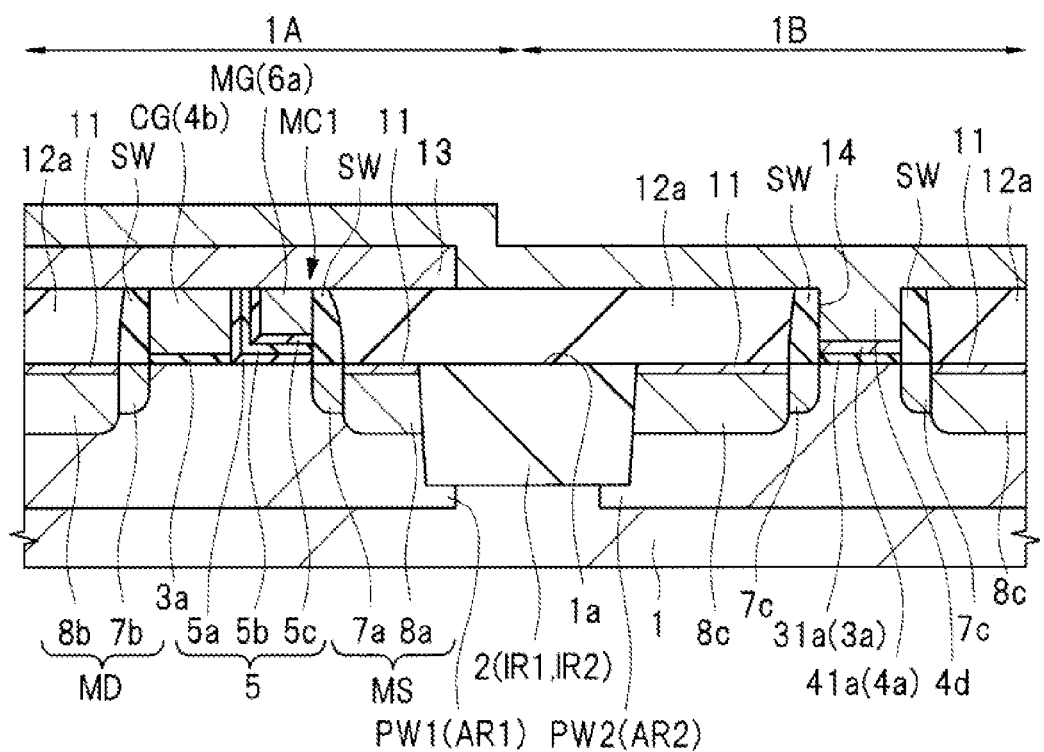
FIG. 27 is a cross-sectional view of the principal part during a manufacturing process of the semiconductor device of the first embodiment.

Next, as shown in FIG. 27, the conductive film 4d for the gate electrode GE1 of MISFET Q1 (see FIG. 28 to be described later) is formed on the entire principal surface 1a of the semiconductor substrate 1 so as to fill the inside of the concave portion 14 (Step S25 in FIG. 6). In this Step S25, over the metal film portion 41a exposed to the bottom portion of the concave portion 14 formed in Step S24, the conductive film 4d is formed so as to be in contact with the metal film portion 41a. Then, the inside of the concave portion 14 is filled with the conductive film 4d.

As the conductive film 4d, a metal film formed of a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a tungsten (W) film, or the like can be preferably used. In addition, from the viewpoint of enhancing electrical conductivity, a TiN film can be more preferably used as the conductive film 4d. The conductive film 4d can be formed by a physical vapor deposition (PVD) method such as, for example, a sputtering method. Furthermore, depending on the type of the material of the conductive film 4d, the conductive film 4d can also be formed by a CVD method.

Figure 28:
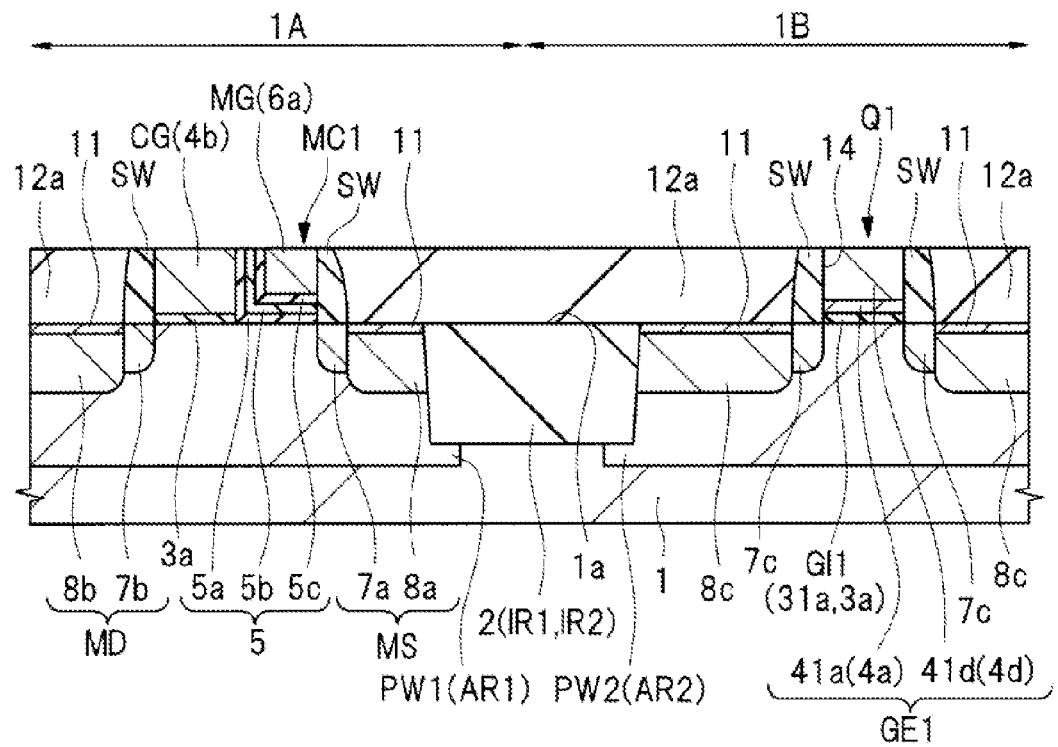
FIG. 28 is a cross-sectional view of the principal part during a manufacturing process of the semiconductor device of the first embodiment.

Next, as shown in FIG. 28, the conductive film 4d outside the concave portion 14 is removed and the conductive film 4d is left inside the concave portion 14, thereby the gate electrode GE1 being formed (Step S26 in FIG. 6).

Specifically, in Step S26, by using an etch back method, a CMP method, or the like, the conductive film 4d outside the concave portion 14 is removed and the conductive film 4d is left inside the concave portion 14, and thus there is formed the conductive film portion 41d formed of the conductive film 4d that is left inside the concave portion 14. Therefore, removal of the hard mask film 13 exposes the upper surface of the interlayer insulating film 12a, resulting in a state where the conductive film portion 41d formed of the conductive film 4d is embedded into the concave portion 14. Accordingly, the gate electrode GE1 is formed by the metal film portion 41a formed of the metal film 4a and the conductive film portion 41d formed of the conductive film 4d. In addition, between the p-well PW2 of the semiconductor substrate 1 and the gate electrode GE1, the gate insulating film GI1 is formed by the insulating film portion 31a formed of the insulating film 3a.

In a part in contact with the gate insulating film GI1 of the gate electrode GE1, the metal film portion 41a formed of the metal film 4a is arranged, and thus the gate electrode GE1 is a metal gate electrode. That is, by setting the metal film portion 41a to the one formed of the metal film 4a, the gate electrode GE1 can be caused to function as a metal gate electrode regardless of the material of the conductive film portion 41d.

Furthermore, by performing the processes of Step S24 to Step S26, the gate electrode GE1 as the metal gate electrode is formed after the $n^-$-type semiconductor region 7c and the $n^+$-type semiconductor region 8c of MISFET Q1 are formed, and thus this is the so-called metal-gate-last process. On the other hand, the gate insulating film GI1 formed of a high-k film, i.e., a high-dielectric film, is suitably formed before the n⁻-type semiconductor region 7c and the n⁺-type semiconductor region 8c are formed, and thus this is the so-called metal-gate-first process.

In this way, as shown in FIG. 28, MISFET Q1 is formed in the peripheral circuit region 1B.

Alternatively, in place of Step S24 to Step S26, as a modification, the following Step S24' to Step S26' can also be performed.

Figure 29:
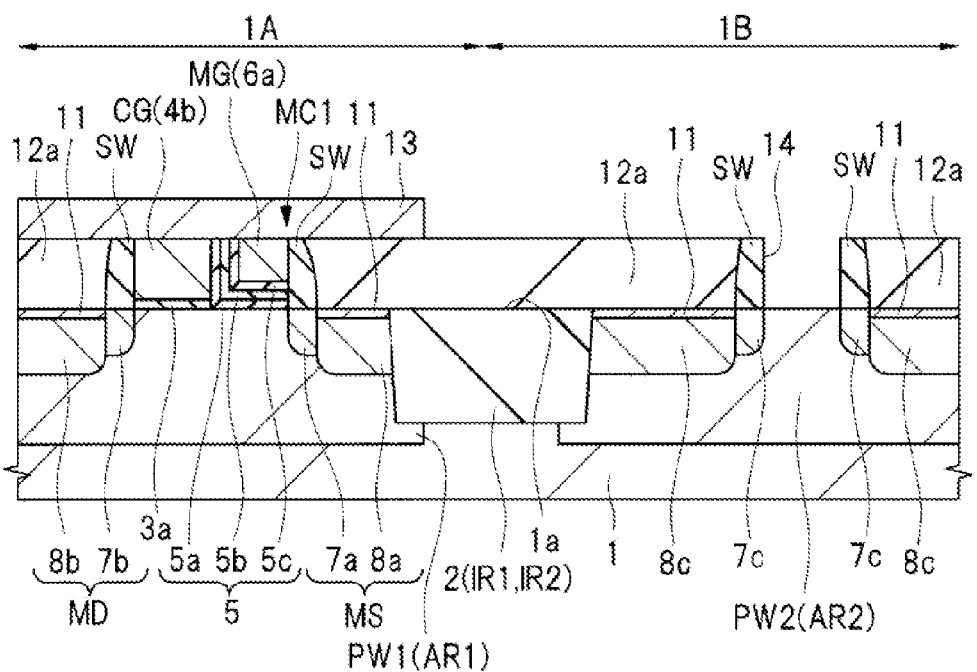
FIG. 29 is a cross-sectional view of the principal part during a manufacturing process of the semiconductor device of the first embodiment.

First, as shown in FIG. 29, the exposed conductive film portion 41b is etched and removed, and also the metal film portion 41a and the insulating film portion 31a are etched and removed (Step S24'). That is, the conductive film portion 41b and the metal film portion 41a function as a dummy gate electrode, and the insulating film portion 31a functions as a dummy gate insulating film.

In Step S24', first, using an etchant having a high etching selectivity of the silicon film 4b relative to the metal film 4a, the conductive film portion 41b formed of the silicon film 4b can be removed. Next, using an etchant having a high etching selectivity of the metal film 4a and the insulating film 3a relative to the semiconductor substrate 1, the metal film portion 41a formed of the metal film 4a and the insulating film portion 31a formed of the insulating film 3a can be removed. Therefore, the conductive film portion 41b, the metal film portion 41a, and the insulating film portion 31a are removed, and the p-well PW2 of the semiconductor substrate 1 positioned under the insulating film portion 31a is exposed. In addition, a portion, in which the conductive film portion 41b, the metal film portion 41a, and the insulating film portion 31a are removed, serves as the concave portion 14. In the bottom portion of the concave portion 14, the p-well PW2 of the semiconductor substrate 1 is exposed, while on the sidewall, i.e., the side surface of the concave portion 14, the sidewall spacer SW is exposed.

That is, in this Step S24', the conductive film portion 41b, the metal film portion 41a, and the insulating film portion 31a are removed and the concave portion 14 is formed, and in the bottom portion of the concave portion 14, the semiconductor substrate 1 is exposed.

In a case where the metal film portion 41a is not formed but the conductive film portion 41b is formed directly over the insulating film portion 31a formed of the insulating film 3a, the insulating film portion 31a might be etched in etching the conductive film portion 41b. Then, the p-well PW2 of the semiconductor substrate 1 might be etched, or the p-well PW2 might be damaged. On the other hand, in a case where the conductive film portion 41b is formed via the metal film portion 41a over the insulating film portion 31a, the metal film portion 41a functions as an etching stopper in etching the conductive film portion 41b, and thus the p-well PW2 can be prevented from being etched and the p-well PW2 can be prevented from being damaged.

On the other hand, the control gate electrode CG and the memory gate electrode MG are covered with the hard mask film 13 and are not exposed, and thus are not etched in the etching process of Step S24'.

Figure 30:
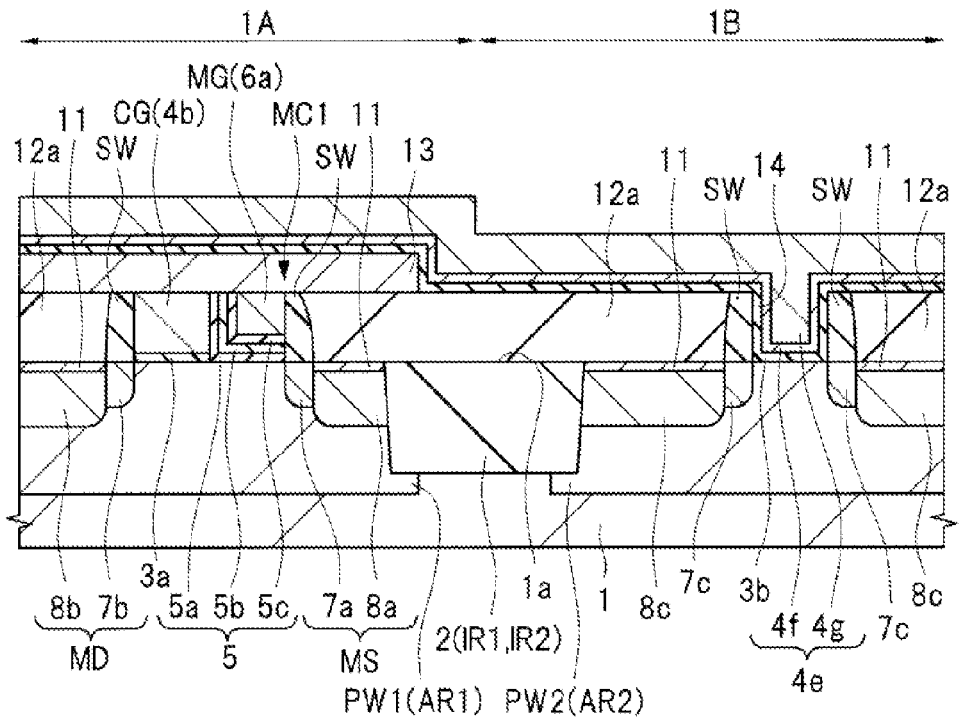
FIG. 30 is a cross-sectional view of the principal part during a manufacturing process of the semiconductor device of the first embodiment.

Next, as shown in FIG. 30, the insulating film 3b for the gate insulating film GI1 (see FIG. 31 to be described later) of MISFET Q1 is formed on the entire principal surface 1a of the semiconductor substrate 1 (Step S25'). In this Step S25', over the p-well PW2 of the semiconductor substrate 1, which is exposed to the bottom portion of the concave portion 14 formed in Step S24', the insulating film 3b is formed so as to be in contact with the p-well PW2. As the insulating film 3b, the so-called high-k film, i.e., a high-dielectric film can be used, and an example of the material usable as the insulating film 3b is as described above. In addition, as with the insulating film 3a, the insulating film 3b can be formed using a sputtering method, an ALD method, or a CVD method.

Next, as shown in FIG. 30, the conductive film 4e for the gate electrode GE1 of MISFET Q1 is formed on the entire principal surface 1a of the semiconductor substrate 1, i.e., over the insulating film 3b, so as to fill the inside of the concave portion 14 (Step S25').

The conductive film 4e for the gate electrode GE1 may be a single layer metal film, but may be a laminated film formed of one or more conductive layers. As shown in FIG. 30, in a case where the conductive film 4e is a laminated film, a conductive layer in contact with at least the insulating film 3b is formed of a metal film, and thus, for example, the conductive film 4e is formed of a metal film 4f in contact with the insulating film 3b and a conductive film 4g formed over the metal film 4f. Therefore, the gate electrode GE1 (see FIG. 31 to be described later) formed by the conductive film 4e can be used as the metal gate electrode.

As the metal film 4f, there can be preferably used a metal film formed of a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a tungsten (W) film, or the like. In addition, from the viewpoint of enhancing electrical conductivity and also from the viewpoint of causing the metal film 4f to function as a barrier film in forming the conductive film 4g, a TiN film can be more preferably used as the metal film 4f. The conductive film 4g can be a metal film of the same type as the metal film 4f, but can be a metal film of a different type.

As shown in FIG. 30, in a case where the conductive film 4e is formed by a laminated film of the metal film 4f and the conductive film 4g over the metal film 4f, the metal film 4f is preferably formed by an ALD method. This is because the ALD method provides a slow deposition rate, but allows a film to be formed with excellent coverage and also causes few damages on an underlayer. Therefore, by forming the metal film 4f by an ALD method, the film can be formed with excellent coverage and also damage on the insulating film 3b of an underlayer can be suppressed or prevented. Then, because the ALD method provides a slow deposition rate, the conductive film 4g formed over the metal film 4f is more preferably formed by a deposition method (e.g., a PVD method, such as a sputtering method) providing a deposition rate faster than the ALD method. Moreover, depending on the type of the material of the conductive film 4g, for example, such as in a case where the conductive film 4g is a silicon film, the conductive film 4g can also be formed by a CVD method.

In this way, over the metal film 4f formed by the ALD method, the conductive film 4g is deposited by a deposition method such as, for example, the PVD method, which provides a deposition rate faster than the ALD method, and thus the time required for formation of the conductive film 4e can be reduced and the throughput can be improved.

Among a total film thickness of the conductive film 4e, the film thickness of the metal film 4f formed by the ALD method is preferably a thickness sufficient in order to secure coverage and obtain an effect of suppressing the damage on the insulating film 3b. In addition, among the total film thickness of the conductive film 4e, the film thickness of the conductive film 4g is more preferably larger than the film thickness of the metal film 4f formed by the ALD method, and thus the time required for deposition of the conductive film 4e can be efficiently reduced. Furthermore, the conductive film 4g is preferably of a single layer in consideration of reduction in the deposition time, but as other aspect, the conductive film 4g can be a laminated film formed of a plurality of conductive layers.

Figure 31:
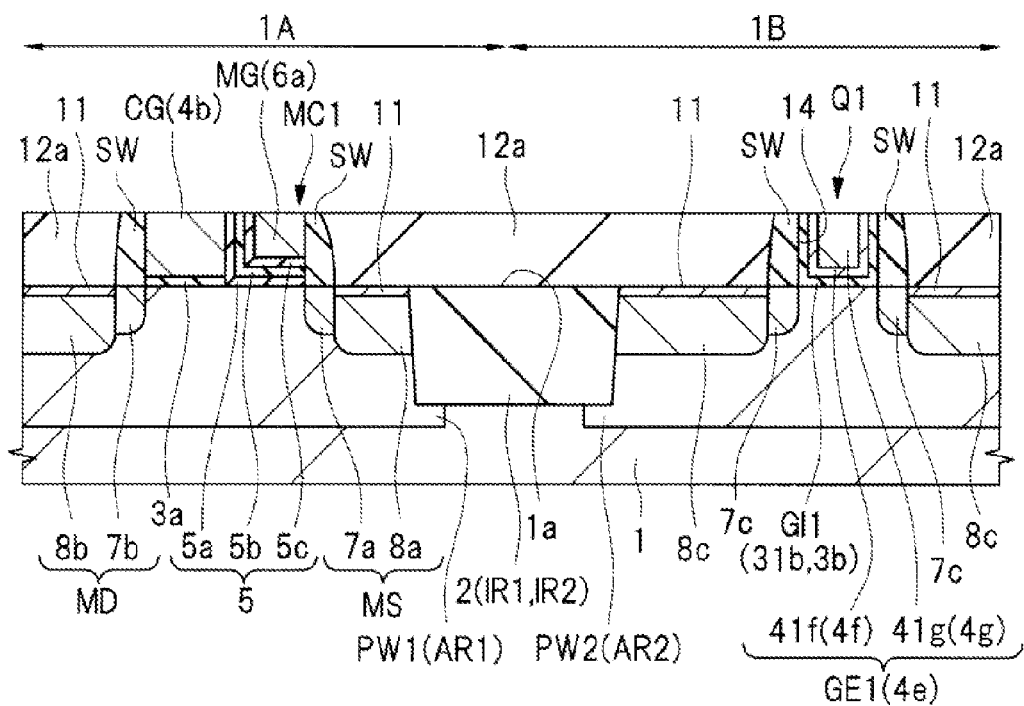
FIG. 31 is a cross-sectional view of the principal part during a manufacturing process of the semiconductor device of the first embodiment.

Next, as shown in FIG. 31, the conductive film. 4e outside the concave portion 14 is removed, and the conductive film 4e is left inside the concave portion 14, and thus the gate electrode GE1 is formed (Step S26').

Specifically, in Step 26', using an etch back method, a CMP method, or the like, the conductive film 4g, the metal film 4f, and the insulating film 3b outside the concave film 4f, and the insulating film portion 14 are removed, and the conductive film 4g, the metal 3b are left in the concave portion 14. Then, an insulating film portion 31b formed of the insulating film 3b remaining inside the concave portion 14, a metal film portion 41f formed of the metal film 4f remaining inside the concave portion 14, and a conductive film portion 41g formed of the conductive film 4g are formed. Therefore, the hard mask film 13 is removed and the upper surface of the interlayer insulating film 12a is exposed, resulting in a state where the conductive film portion 41g is embedded into the concave portion 14 via the insulating film portion 31b and the metal film portion 41f. Therefore, the gate electrode GE1 is formed by the metal film portion 41f formed of the metal film 4f and the conductive film portion 41g formed of the conductive film 4g. In addition, between the p-well PW2 of the semiconductor substrate 1 and the gate electrode GE1, the gate insulating film GI1 is formed by the insulating film portion 31b formed of the insulating film 3b.

In a portion in contact with the gate insulating film GI1 of the gate electrode GE1, the metal film portion 41f formed of the metal film 4f is arranged, and thus the gate electrode GE1 is a metal gate electrode. That is, by constituting the metal film portion 41f by the metal film 4f, the gate electrode GE1 can be caused to function as the metal gate electrode regardless of the material of the conductive film portion 41g.

Furthermore, by performing the processes of Step S24' to Step S26', the gate electrode GE1 as the metal gate electrode is formed after the n$^-$-type semiconductor region 7c and the n$^+$-type semiconductor region 8c of MISFET Q1 are formed, and thus this is the so-called metal-gate-last process. Moreover, the gate insulating film GI1 formed of a high-k film, i.e., a high-dielectric film, is also suitably formed after the n$^-$-type semiconductor region 7c and the n$^+$-type semiconductor region 8c are formed, and thus this is the so-called high-k last process.

In this way, as shown in FIG. 31, MISFET Q1 is formed in the peripheral circuit region 1B.

Next, an interlayer insulating film 12b is formed, i.e., deposited, as an insulating film on the entire principal surface 1a of the semiconductor substrate 1 (Step S27 in FIG. 6). As with the interlayer insulating film 12a, the interlayer insulating film 12b is formed of a single film of a silicon oxide film, or a laminated film of a silicon nitride film and a silicon oxide film, and can be formed using, for example, a CVD method or the like. Hereinafter, the laminated film of the interlayer insulating film. 12a and the interlayer insulating film 12b is referred to as the interlayer insulating film 12.

Next, a plug PG extending through the interlayer insulating film 12 is formed (Step S28 in FIG. 6). First, with a photoresist pattern (not shown), which is formed over the interlayer insulating film 12 using a photolithography method, as an etching mask, dry-etching of the interlayer insulating film 12 forms a contact hole CNT in the interlayer insulating film 12. Next, inside the contact hole CNT, a conductive plug PG formed of W and the like is formed as a conductor portion.

Figure 32:
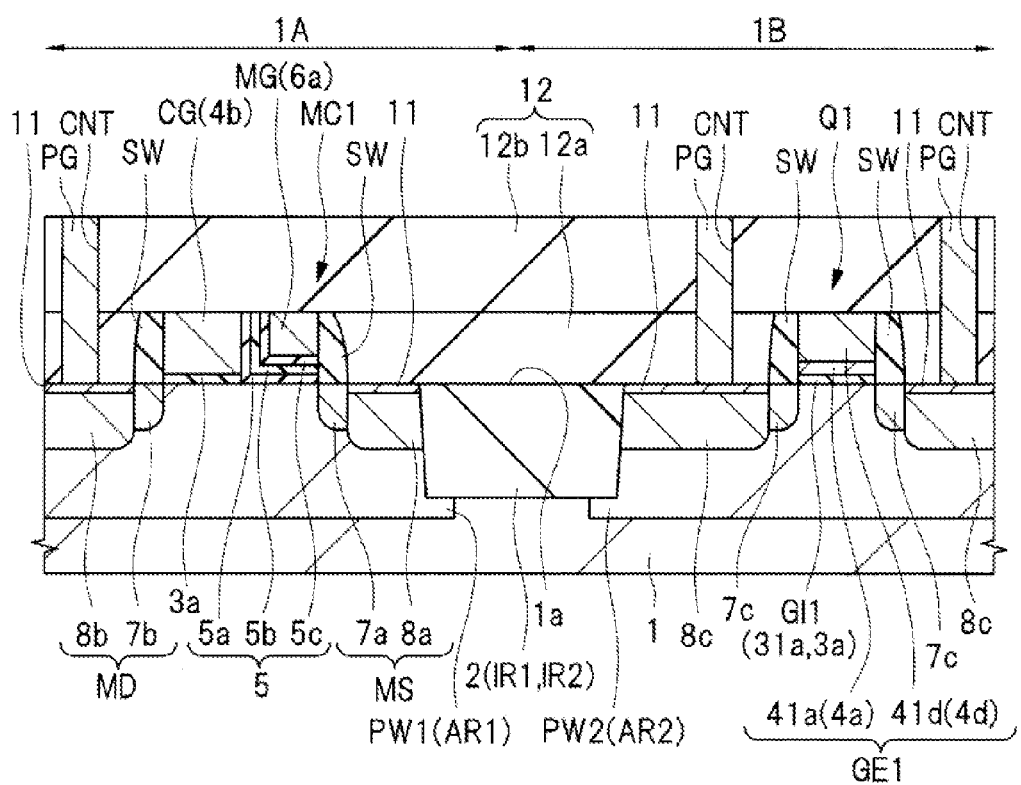
FIG. 32 is a cross-sectional view of the principal part during a manufacturing process of the semiconductor device of the first embodiment.

In order to form the plug PG, a barrier conductor film formed of, for example, a titanium (Ti) film, a titanium nitride (TiN) film, or a laminated film thereof is formed, for example, over the interlayer insulating film 12 including the inside of the contact hole CNT. Then, a main conductor film formed of a tungsten (W) film and the like is formed over this barrier conductor film so as to fill the contact hole CNT, and furthermore the unnecessary main conductor film and barrier conductive film over the interlayer insulating film 12 are removed by a CMP method or an etch back method, thereby as shown in FIG. 32 the plug PG being able to be formed. Note that, for ease of illustration, in FIG. 32, the barrier conductor film and main conductor film constituting the plug PG are integrally shown.

The contact hole CNT and the plug PG embedded therein are formed over the n$^+$-type semiconductor regions 8a, 8b and 8c, over the control gate electrode CG, over the memory gate electrode MG, over the gate electrode GE1, and the like. In the bottom portion of the contact hole CNT, for example, a part of the metal silicide layer 11 over the surface of the n$^+$-type semiconductor regions 8a, 8b and 8c, a part of the metal silicide layer 11 over the surface of the control gate electrode CG, or a part of the metal silicide layer 11 over the surface of the memory gate electrode MG is exposed. Alternatively, in the bottom portion of the contact hole CNT, for example, a part of the metal silicide layer 11 over the surface of gate electrode GE1 is exposed. Note that, FIG. 32 shows a cross-section, in which a part of the metal silicide layer 11 over the surface of the n$^+$-type semiconductor regions 8b and 8c is exposed in the bottom portion of the contact hole CNT and is electrically coupled to the plug PG embedding the contact hole CNT.

Next, as shown in FIG. 1, over the interlayer insulating film 12 into which the plug PG is embedded, the wiring M1 that is the first layer wiring is formed (Step S29 in FIG. 6). Here, there will be described a case where the wiring M1 is formed using, for example, a single damascene technique as the damascene technique.

First, over the interlayer insulating film 12 into which the plug PG is embedded, the insulating film 15 is formed. The insulating film 15 can also be formed using a laminated film of a plurality of insulating films. Next, a wiring groove is formed in a predetermined region of the insulating film 15 by dry etching using a photoresist pattern (not shown) as an etching mask.

Next, over the insulating film 15 including the bottom portion and sidewall of the formed wiring groove, a barrier conductor film formed of, for example, a titanium nitride (TiN) film, a tantalum (Ta) film, a tantalum nitride (TaN) film, or the like is formed. Then, a copper (Cu) seed layer is formed over the barrier conductor film by a CVD method, a sputtering method or the like, and furthermore a copper (Cu) plating film is formed over the seed layer by using an electrolysis plating method or the like and the inside of the wiring groove is filled with the Cu plating film. Then, the main conductor film and barrier conductor film in regions other than the wiring groove are removed by a CMP method and there is formed the first layer wiring M1 containing, as a principal material, Cu embedded in the wiring groove. Note that, in FIG. 1, for ease of illustration, in the wiring M1, the barrier conductor film, the seed layer, and the Cu plating film are shown in an integrated manner.

The wiring M1 is electrically coupled, via the plug PG, to the semiconductor region MS, the semiconductor region MD, the control gate electrode CG, the memory gate electrode MG of the memory cell MC1, as well as the n+-type semiconductor region 8c and the gate electrode GE1 of MISFET Q1, and the like. Subsequently, wirings in the second and subsequent layers are formed by a dual damascene method or the like, but here, the illustration and the description thereof are omitted. In addition, the wiring M1 and wirings in the upper layers of the wiring M1 are not limited to the damascene wiring, can also be formed by patterning a conductive film for wiring, and can also be, for example, a tungsten (W) wiring, an aluminum (Al) wiring, or the like.

In this way, the semiconductor device according to the present first embodiment, described above using FIG. 1, is manufactured. Note that, in FIG. 1, with regard to the interlayer insulating film 12, a boundary between the interlayer insulating films 12a and 12b is not illustrated, but the interlayer insulating films 12a and 12b are illustrated as an integrated one.

<Oxidation of Metal Film Associated with Formation of Insulating Film>

Figure 33:
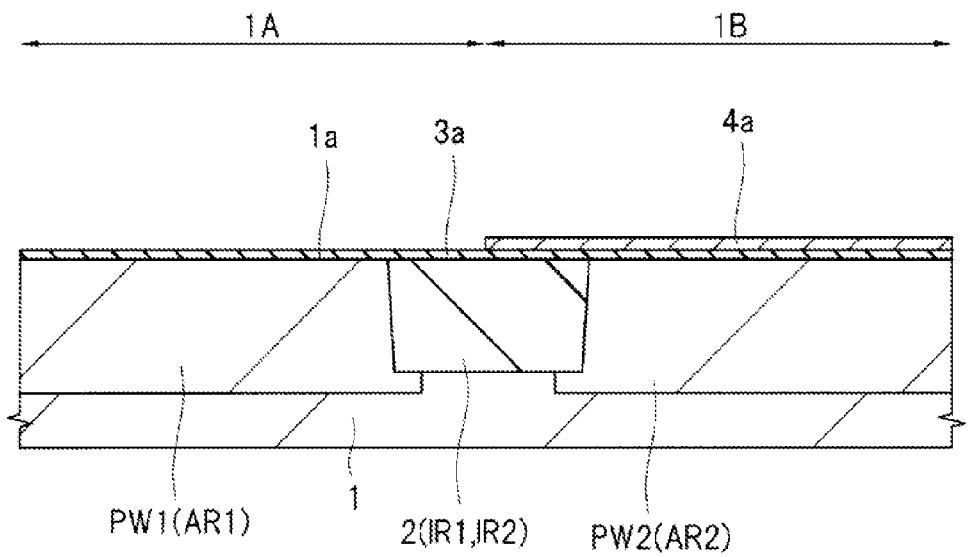
FIG. 33 is a cross-sectional view of a principal part during a manufacturing process of a semiconductor device of a comparative example.
Figure 34:
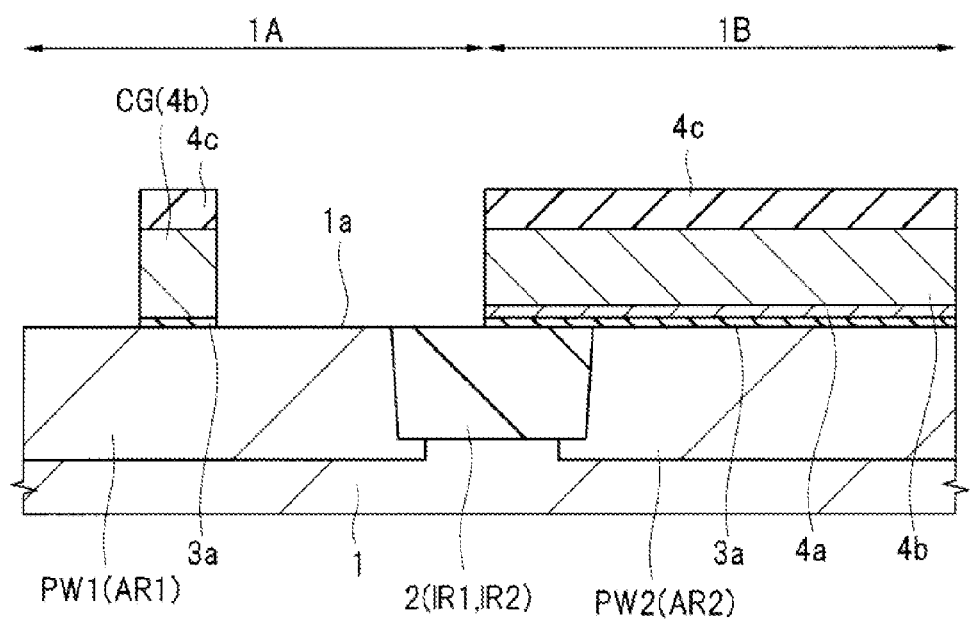
FIG. 34 is a cross-sectional view of a principal part during a manufacturing process of the semiconductor device of the comparative example.

A method for manufacturing a semiconductor device of a comparative example will be described with reference to the accompanying drawings. FIG. 33 and FIG. 34 are cross-sectional views of a principal part of the semiconductor device of the comparative example during a manufacturing process.

In the method for manufacturing a semiconductor device of the comparative example, processes corresponding to Step S1 in FIG. 4 to Step S29 in FIG. 6 are performed for manufacturing a semiconductor device similar to the semiconductor device of the first embodiment.

As shown in FIG. 33, in the method for manufacturing a semiconductor device of the comparative example, in a process corresponding to Step S6 in FIG. 4, for example the metal film 4a is left so that the position of an outer periphery of the metal film 4a to be left becomes the same position as the position of an outer periphery of a region where the silicon film 4b is to be left in Step 9 to be described later. Therefore, as shown in FIG. 34, in the method for manufacturing a semiconductor device of the comparative example, in a process corresponding to Step S9 in FIG. 4, the position of an outer periphery of the silicon film 4b to be left is the same position as the position of an outer periphery of the metal film 4a that has been left in the process corresponding to Step S6 in FIG. 4. That is, in the method for manufacturing a semiconductor device of the comparative example, in the process corresponding to Step S9 in FIG. 4, the silicon film 4b is left so that the outer peripheral portion of the metal film 4a is not covered with the silicon film 4b, but is exposed to the side surfaces of the hard mask film 4c and the silicon film 4b.

However, the analysis of the present inventors revealed that when the insulating film 5 is formed by performing the process corresponding to Step S10 in FIG. 4 in a state where the outer peripheral portion of the metal film 4a is exposed to the side surface of the silicon film 4b, then in the outer peripheral portion of the metal film 4a, the metal film 4a might be oxidized and the film thickness of the metal film 4a might increase. In particular, the analysis of the present inventor revealed that in a case or the like where the silicon oxide film 5a in the insulating film 5 is formed by performing an ISSG oxidation treatment at high temperature of approximately 1050° C., for example, in the outer peripheral portion of the metal film 4a, the metal film 4a is oxidized and the film thickness of the metal film 4a significantly increases.

Figure 35:
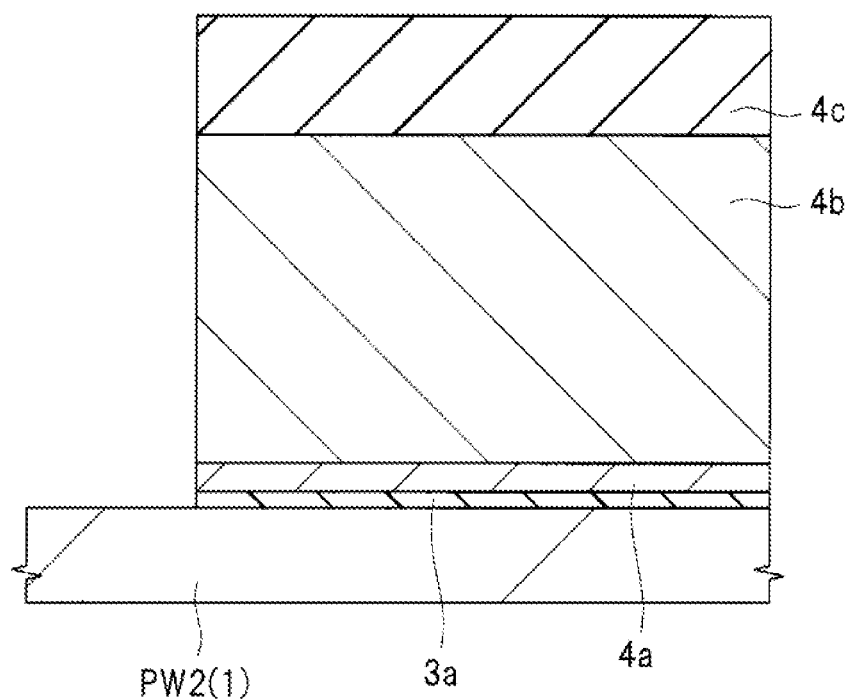
FIG. 35 is a view schematically showing a cross-sectional shape in a vicinity of an outer periphery of a silicon film before performing an oxidation treatment for forming a silicon oxide film in the comparative example.
Figure 36:
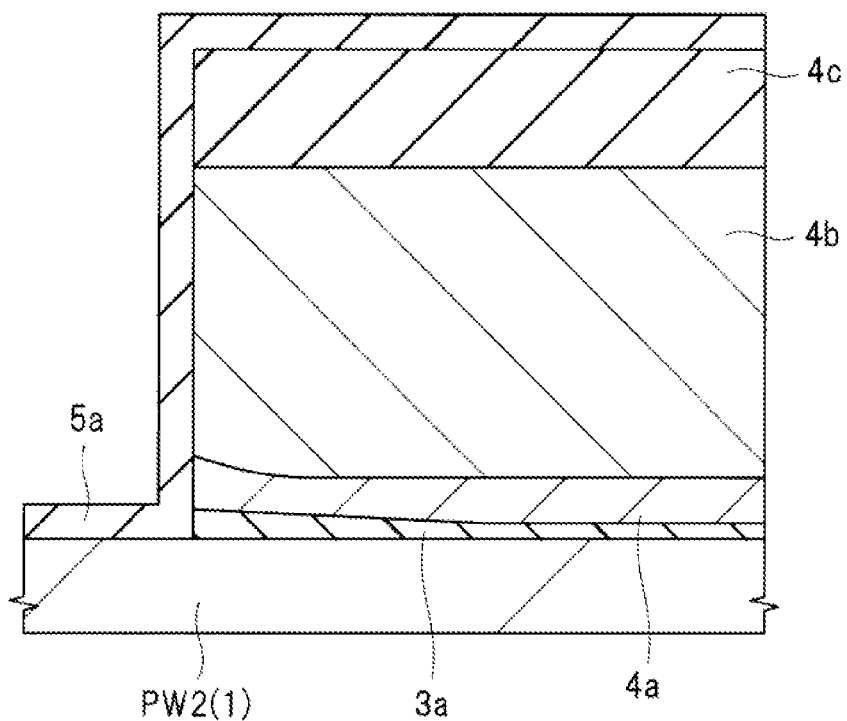
FIG. 36 is a view schematically showing a cross-sectional shape in the vicinity of the outer periphery of the silicon film after performing the oxidation treatment for forming the silicon oxide film in the comparative example.

FIG. 35 and FIG. 36 are views schematically showing a cross-sectional shape in a vicinity of an outer periphery of a silicon film before and after performing an oxidation treatment for forming a silicon oxide film in the comparative example. FIG. 35 shows a cross-sectional shape before performing the oxidation treatment, and FIG. 36 shows a cross-sectional shape after performing the oxidation treatment. FIG. 36 illustrates a state immediately after forming the silicon oxide film 5a.

When the metal film 4a is formed by a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbide nitride (TaCN) film, a tungsten (W) film, or the like, the metal film 4a is easily oxidized in comparison with the silicon film 4b. For this reason, as shown in FIG. 35, in a case where the outer peripheral portion of the metal film 4a is not covered with the silicon film 4b but is exposed to the side surface of the silicon film 4b, the metal film 4a is easily oxidized in performing the oxidation treatment for forming the silicon oxide film 5a.

Accordingly, after performing the oxidation treatment for forming the silicon oxide film 5a, the outer peripheral portion of the metal film 4a is oxidized and the film thickness of the metal film 4a increase, as shown in FIG. 36. In particular, a portion closer to the outer periphery of the metal film 4a is more easily oxidized, and thus in the outer peripheral portion of the metal film 4a, the film thickness of the metal film 4a increases and the outer peripheral portion of the metal film 4a is put into a state of expanding in a thickness direction of the metal film 4a. Such a change in the shape before and after the oxidation treatment reduces the processing accuracy in the subsequent processes, and thus the performance of the semiconductor device cannot be enhanced.

Furthermore, inside the metal film 4a formed of the above-described film or the like, oxygen easily diffuses in comparison with inside the silicon film 4b. For this reason, due to the diffusion of oxygen through the metal film 4a, not only the outer peripheral portion of the metal film 4a but a portion away from the outer periphery of the metal film 4a is oxidized. Accordingly, for the metal film 4a, in a region where the gate electrode GE1 is to be formed, the film thickness of the metal film portion 41a formed of the metal film 4a might increase or the quality of the material might change.

The reason why the high-k film is used as the gate insulating film is because, for example, in comparison with case where a silicon oxide film is used as the gate insulating film, the film thickness of the gate insulating film can be increased while securing the gate capacitance of a MISFET even if a semiconductor element is miniaturized. Another reason is because the increase in the film thickness of the gate insulating film reduces the gate leakage current. In addition, the reason why the gate electrode formed of a metal gate electrode is used in combination with a gate insulating film formed of a high-k film is because there is suppressed the fluctuation of the characteristics such as the threshold voltage, of the semiconductor device caused by, for example, the depletion of a gate electrode in comparison with a case where a gate electrode formed of, for example, a silicon film is used.

However, in the comparative example, as described above, in the region where the gate electrode GE1 is to be formed, the film thickness of the metal film portion 41a formed of the metal film 4a might increase or the quality of the material might change. For this reason, even in a case where the metal film 4a is used, as is, as the gate electrode GE1, or even in a case where another metal film 4f formed after etching and removing the metal film 4a is set as the gate electrode GE1, the state of an interface between the gate electrode GE1 and the gate insulating film GI1 might fluctuate. As a result, the characteristics such as, for example, the threshold voltage, of the semiconductor device might fluctuate and thus the performance of the semiconductor device cannot be enhanced.

Furthermore, not only the metal film 4a but also the insulating film 3a might be oxidized. FIG. 36 illustrates a state where a part of the insulating film 3a is oxidized. When the metal film 4a of titanium nitride or the like is oxidized, oxygen is more likely to penetrate the inside of the insulating film 3a through the metal film 4a, and to react with the insulating film 3a in contact with the metal film 4a. As a result, the same problems as described above might occur and the characteristics such as the threshold voltage might fluctuate.

With the technique described in Patent Document 1, in forming an insulating film so that a silicon film serving as the gate electrode of a MISFET is covered, a metal film exposed to a side surface of the silicon film is oxidized. In addition, with the techniques described in Patent Documents 2 to 4, a process of forming, for example, a silicon film, a titanium nitride film, or the like on a side surface of a metal film exposed to a side surface of a silicon film is required, and thus a total number of processes might increase.

On the other hand, by performing a manufacturing method including the processes of: forming the memory cell MC1 in the memory cell region 1A; then, forming the metal film 4a in the peripheral circuit region 1B; and after that, forming MISFET Q1, the oxidization of the metal film 4a can be prevented. However, with such a manufacturing method, a total number of processes might increase.

<Main Features and Effect of the Present Embodiment>

Then, in the method for manufacturing a semiconductor device of the present first embodiment, in Step S6 in FIG. 4, the metal film 4a is left so that the position of an outer periphery of the metal film 4a backs away from the position of an outer periphery of a region where the silicon film 4b is to be left in Step S9 in FIG. 4. Then, in Step S9 in FIG. 4, the silicon film 4b over the metal film 4a is left so that the outer peripheral portion of the metal film 4a that has been left in Step S6 in FIG. 4 is covered with the silicon film 4b.

Figure 37:
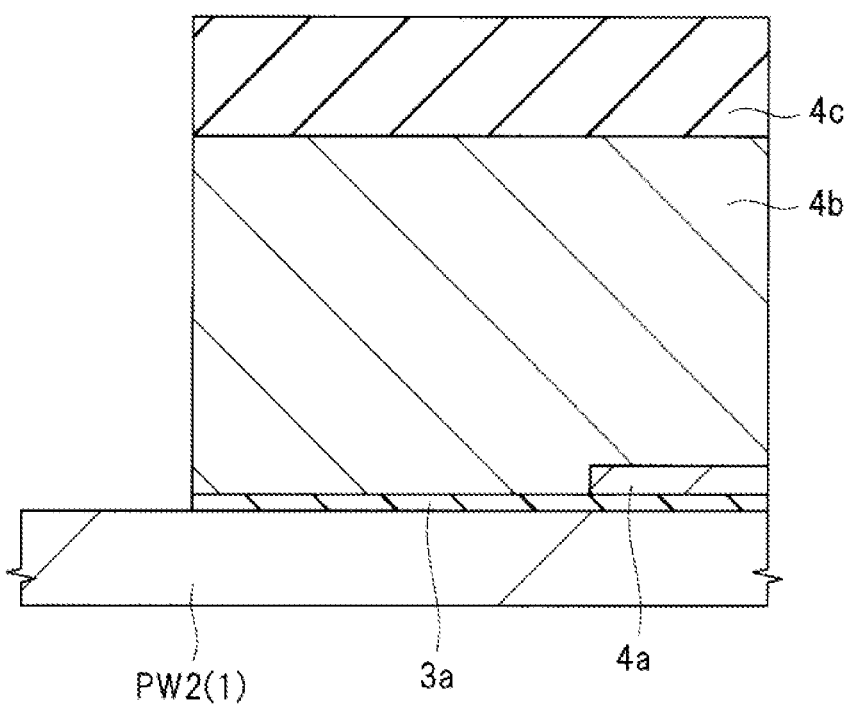
FIG. 37 is a view schematically showing a cross-sectional shape in a vicinity of an outer periphery of a silicon film before performing an oxidation treatment for forming a silicon oxide film in the first embodiment.
Figure 38:
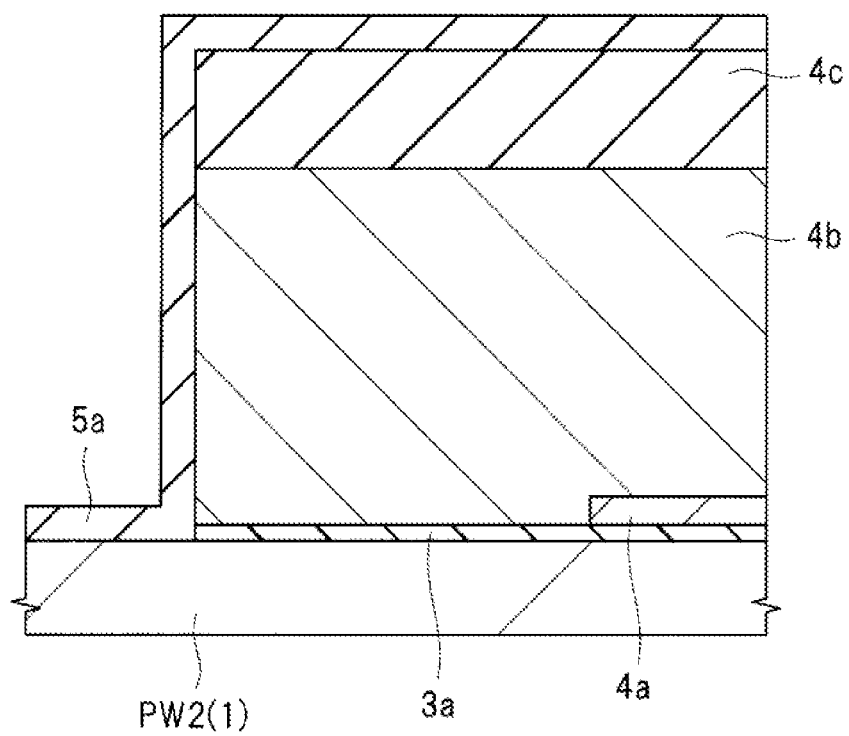
FIG. 38 is a view schematically showing a cross-sectional shape in the vicinity of the outer periphery of a silicon film after performing the oxidation treatment for forming the silicon oxide film in the first embodiment.

FIG. 37 and FIG. 38 are views schematically showing a cross-sectional shape in a vicinity of an outer periphery of a silicon film before and after performing an oxidation treatment for forming a silicon oxide film in the first embodiment. FIG. 37 shows a cross-sectional shape before performing the oxidation treatment, and FIG. 38 is a cross-sectional shape after performing the oxidation treatment. FIG. 38 illustrates a state immediately after forming the silicon oxide film 5a.

As described above, when the metal film 4a is formed of the above-described film and the like, the silicon film 4b is hard to be oxidized in comparison with the metal film 4a, and also inside the silicon film 4b, oxygen is hard to diffuse in comparison with inside the metal film 4a. For this reason, as shown in FIG. 37, in a case where the outer peripheral portion of the metal film 4a is covered with the silicon film 4b and is not exposed to the side surface of the silicon film 4b, even after performing the oxidation treatment for forming the silicon oxide film 5a, the outer peripheral portion of the metal film 4a is not oxidized as shown in FIG. 38. Accordingly, the outer peripheral portion of the metal film 4a is not put into an expanded state in a thickness direction of the metal film 4a, and there is no change in the shape before and after the oxidation treatment, and a decrease in the processing accuracy in the subsequent processes can be prevented, and thus the performance of the semiconductor device can be enhanced.

In addition, since the outer peripheral portion of the metal film 4a is not oxidized, the oxidation of a portion away from the outer periphery of the metal film 4a can also be prevented. Therefore, in the region where the gate electrode GE1 is to be formed, an increase in the film thickness of the metal film 4a can be prevented and a change in the quality of the material can be prevented. Accordingly, in a case where the metal film 4a is used, as is, as the gate electrode GE1 as the metal gate electrode, a fluctuation of the state of the interface between the gate electrode GE1 and the gate insulating film GI1 can be prevented, a fluctuation of the threshold voltage of the semiconductor device can be prevented, and the performance of the semiconductor device can be enhanced.

Alternatively, also in a case where the metal film portion 41a and the insulating film portion 31a are removed and the insulating film 3b for the gate insulating film GI1 and the conductive film 4e for the gate electrode GE1 are newly formed, a change in the accuracy of the shape and in the quality of the material of the gate insulating film GI1 and the gate electrode GE1 can be prevented. Accordingly, there can be prevented a fluctuation of the state of the interface between the gate electrode GE1 as the metal gate electrode and the gate insulating film GI1, a fluctuation of the threshold voltage of the semiconductor device can be prevented, and the performance of the semiconductor device can be enhanced.

According to such a manufacturing method, there is no need to newly add a process of forming, for example, a silicon film, a titanium nitride film, or the like on the side surface of the metal film 4a, and a total number of processes might not increase. Moreover, a total number of processes might not increase, in comparison with the manufacturing method including the processes of: forming the memory cell MC1 in the memory cell region 1A; and after the process above, forming the metal film 4a in the peripheral circuit region 1B; and after the process above, forming MISFET Q1.

Here, the distance DST1 (see FIG. 14), by which the position of the outer periphery of the metal film 4a is caused to back away from the position of the outer periphery of the silicon film 4b, is preferably no less than, for example, approximately 10 nm, when the positional accuracy of patterning of the metal film 4a and the silicon film 4b is not taken into consideration. That is, if the position of the outer periphery of metal film 4a, which has been left in Step S6 backs away, by no less than approximately 10 nm, from the position of the outer periphery of the silicon film 4b to be left in Step S9, oxygen does not diffuse through the silicon film 4b, and thus, for example, even in a case where the ISSG oxidation treatment is performed, the oxidation of the metal film 4a can be prevented.

On the other hand, the positional accuracy of patterning of the metal film 4a and the silicon film 4b is considered to be approximately 20 nm. Accordingly, in consideration of the positional accuracy of patterning of the metal film 4a and the silicon film 4b, the distance DST1 (see FIG. 14) is more preferably no less than approximately 30 nm, for example. Therefore, for example, even in a case where the ISSG oxidation treatment is performed, the oxidation of the metal film 4a can be more reliably prevented.

However, the above-described preferable value of the distance DST1 is affected by the design dimensions and other various conditions of the semiconductor device, and thus may further fluctuate due to various process conditions including the conditions of the oxidation treatment and the like. Accordingly, the distance DST1 (see FIG. 14) is further preferably no less than, for example, approximately 100 nm. Therefore, for example, even in a case where various oxidation treatments are performed, the oxidation of the metal film 4a can be further reliably prevented regardless of the process conditions.

Note that, in a plan view, the position of the outer periphery of the metal film 4a to be left in Step S6 is preferably away from the element isolating region IR2. With such an arrangement, the diffusion of oxygen through the element isolating film 2 formed in the element isolating region IR2 can be prevented. For this reason, in comparison with a case where the position of the outer periphery of the metal film 4a left in Step S6 positions over the element isolating region IR2, the oxidation of the metal film 4a can be further prevented regardless of the process conditions, for example even in a case where various oxidation treatments are performed.

Second Embodiment

In the method for manufacturing a semiconductor device of the first embodiment, there is applied the so-called metal-gate-last process in which the gate electrode GE1 as the metal gate electrode is formed after the formation of the source region or drain region (hereinafter, referred to also as the source/drain region) of MISFET Q1. In contrast to this, in a method for manufacturing a semiconductor device of a second embodiment, there is applied the so-called metal-gate-first process in which the gate electrode GE1 as the metal gate electrode is formed before the formation of the source/drain region of MISFET Q1.

In the semiconductor device of the present second embodiment, the structure of the memory cell MC1, and the structure of MISFET Q1 in a cross-section perpendicular to the gate width direction of the gate electrode GE1 are the same as the structures of the semiconductor device of the first embodiment described using FIG. 1. In addition, in the method for manufacturing a semiconductor device of the present second embodiment, the so-called metal-gate-first process is applied. Therefore, the gate electrode GE1 of MISFET Q1 includes the conductive film portion 41b formed of the silicon film 4b described using FIG. 21 and the like in the first embodiment, in place of the conductive film portion 41d formed of the conductive film 4d described using FIG. 1 in the first embodiment. Accordingly, the semiconductor device of the present second embodiment has a structure, in which the conductive film portion 41d formed of the conductive film 4d is replaced with the conductive film portion 41b formed of the silicon film 4b, in FIG. 1.

On the other hand, the structure of MISFET Q1 in a cross-section perpendicular to the gate length direction of the gate electrode GE1 can be preferably set to the following structure.

<Structure of Semiconductor Device in Cross-Section (in Gate Width Direction) Perpendicular to Gate Length Direction>

Figure 39:
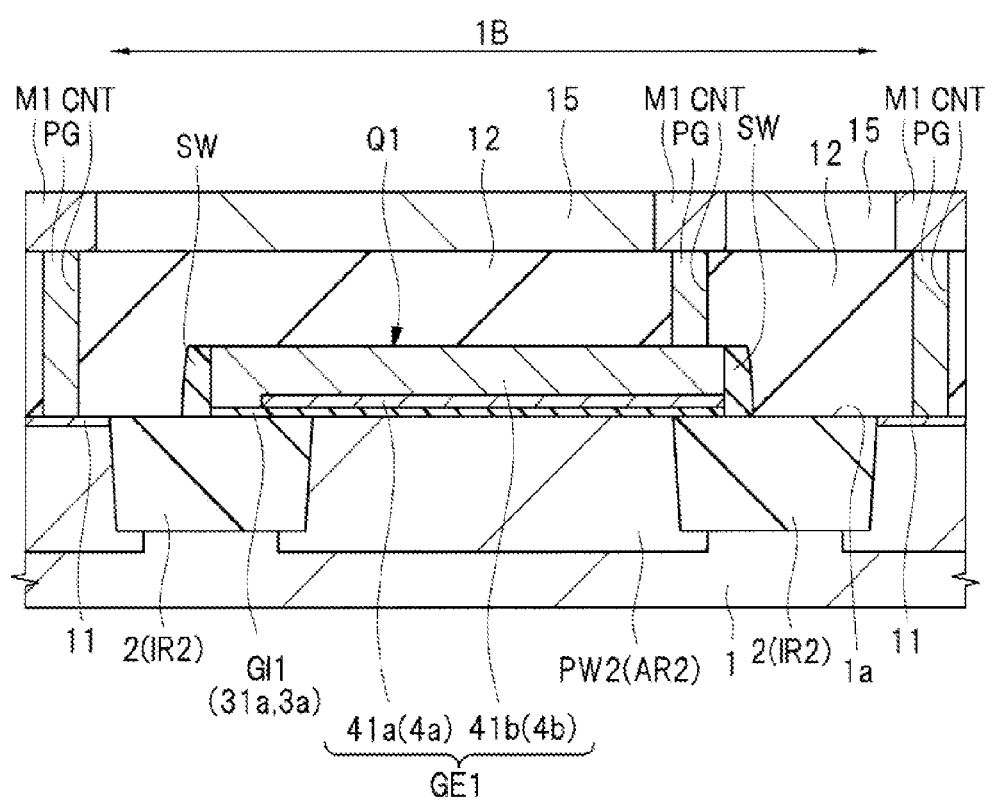
FIG. 39 is a cross-sectional view of a principal part of a semiconductor device of a second embodiment.

FIG. 39 is a cross-sectional view of a principal part of the semiconductor device of the second embodiment. FIG. 39 shows the cross-section perpendicular to the gate length direction of the gate electrode GE1. That is, the structure in the gate width direction is illustrated. Note that, in the semiconductor device in the present second embodiment, each portion other than the metal film portion 41a formed of the metal film 4a and the conductive film portion 41b formed of the silicon film 4b is the same as each portion of the semiconductor device in the first embodiment. Accordingly, the same symbol is attached to a member having the same function as the member of the semiconductor device shown in FIG. 1, the member being each portion other than the metal film portion 41a and the conductive film portion 41b, in the semiconductor device shown in FIG. 39, and the repeated explanation thereof is omitted.

As described above, the semiconductor device of the present second embodiment is formed by the so-called metal-gate-first process, and thus the gate electrode GE1 is formed by the metal film 4a and the silicon film 4b over the metal film 4a. That is, the gate electrode GE1 is formed by the metal film portion 41a formed of the metal film 4a in contact with gate insulating film GI1 and the conductive film portion 41b formed of the silicon film 4b over this metal film 4a. The gate electrode GE1 includes the metal film 4a in contact with the gate insulating film GI1, and thus is the so-called metal gate electrode.

As the metal film 4a, the same metal film as the metal film 4a in the first embodiment can be used. As the silicon film 4b, the same silicon film as the silicon film 4b in the first embodiment can be used.

In the present second embodiment, at least one end portion, in the metal film portion 41a, in the gate width direction of the gate electrode GE1 is preferably covered with the conductive film portion 41b. Such a structure is formed because as described later in the method for manufacturing a semiconductor device, in forming the conductive film portion 41b by patterning the silicon film 4b, the silicon film 4b is patterned so that one end of the metal film portion 41a in the gate width direction of the gate electrode GE1 is covered with the conductive film portion 41b. Accordingly, in the semiconductor device of the present second embodiment, the silicon film 4b is patterned in the peripheral circuit region 1B in Step S9 in FIG. 4, and then in Step S10 in FIG. 4, in performing an oxidation treatment on the semiconductor substrate 1, the oxidation of the metal film 4a can be prevented or suppressed.

Moreover, in the present second embodiment, preferably, the gate insulating film GI1 is formed over the p-well PW2 and over the element isolating region IR2, and there is arranged, over the element isolating region IR2, an end portion, on one side in the gate width direction of the gate electrode GE1 and on the side covered with the silicon film 4b, of the metal film portion 41a. Therefore, also in a portion of the p-well PW2 on one end side in the gate width direction of the gate electrode GE1, the portion being adjacent to the element isolating region IR2, the silicon film 4b is formed via the metal film 4a over the gate insulating film GI1. Therefore, in comparison with a case where the silicon film 4b is directly formed not via the metal film 4a, the fluctuation of the threshold voltage of the semiconductor device caused by the depletion of the gate electrode GE1 formed of the silicon film 4b can be suppressed.

<Method for Manufacturing Semiconductor Device>

Next, the method for manufacturing a semiconductor device of the present second embodiment will be described. FIG. 40 to FIG. 43 are cross-sectional views of a principal part of the semiconductor device of the second embodiment during a manufacturing process. In the cross-sectional views of FIG. 40 to FIG. 43, a cross-section perpendicular to the gate length direction of the gate electrode GE1 is shown.

In the method for manufacturing a semiconductor device of the present second embodiment, the semiconductor device is manufactured by performing the processes of Step S1 in FIG. 4 to Step S20 in FIG. 5 in the method for manufacturing a semiconductor device of the first embodiment, and then there are not performed the processes of Step S21 to Step S26 in FIG. 6, which are the steps of the metal-gate-last process.

First, the processes of Step S1 to Step S6 in FIG. 4 are performed for patterning the metal film 4a of the memory cell region 1A. At this time, the structure in a cross-section perpendicular to the gate width direction of the gate electrode GE1 is the same as the structure described using FIG. 11 in the first embodiment. On the other hand, as shown in FIG. 40, in the cross-section perpendicular to the gate length direction of the gate electrode GE1, at least one end portion, in the metal film 4a, in the gate width direction of the gate electrode GE1 is arranged over the element isolating region IR2. FIG. 40 shows an example, in which other end portion of the metal film 4a in the gate width direction of the gate electrode GE1 is also arranged over the element isolating region IR2.

Next, the processes of Step S7 to Step S9 in FIG. 4 are performed for patterning the hard mask film 4c and the silicon film 4b by etching such as dry etching. At this time, the structure in a cross-section perpendicular to the gate width direction of the gate electrode GE1 is the same as the structure described using FIG. 14 in the first embodiment. On the other hand, as shown in FIG. 41, in the cross-section perpendicular to the gate length direction of the gate electrode GE1, at least one end portion, in the metal film 4a, in the gate width direction of the gate electrode GE1 is covered with the silicon film 4b. FIG. 41 shows an example in which other end portion of the metal film 4a in the gate width direction of the gate electrode GE1 is also covered with the silicon film 4b.

Figure 42:
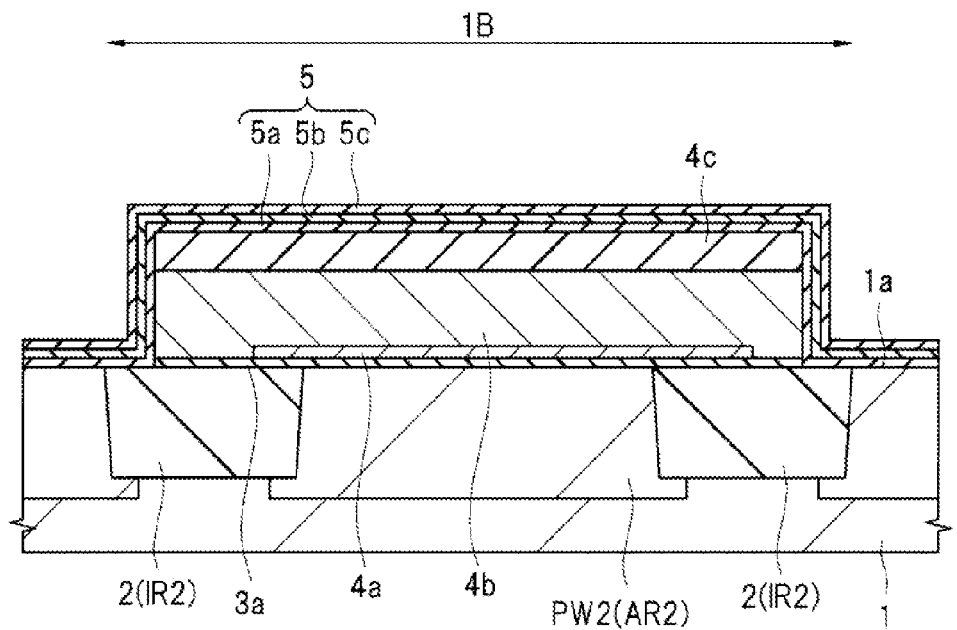
FIG. 42 is a cross-sectional view of the principal part of the semiconductor device of the second embodiment during a manufacturing process.

Next, the process of Step S10 in FIG. 4 is performed to form the insulating film 5 for the gate insulating film of the memory transistor on the entire principal surface 1a of the semiconductor substrate 1. At this time, the structure in a cross-section perpendicular to the gate width direction of the gate electrode GE1 is the same as the structure described using FIG. 15 in the first embodiment. On the other hand, as shown in FIG. 42, also in the cross-section perpendicular to the gate length direction of the gate electrode GE1, the insulating film 5 is formed so as to cover the surfaces of the hard mask film 4c and the silicon film 4b remaining in the peripheral circuit region 1B.

Also in the present second embodiment, as with the first embodiment, in Step S9, the silicon film 4b over the metal film 4a is left so that an outer peripheral portion of the metal film 4a that has been left in Step S6, i.e., a side surface of the metal film 4a that has been left in Step S6 is covered with the silicon film 4b, and thus the outer peripheral portion of the metal film 4a is not exposed. Therefore, the oxidation of the metal film 4a can be prevented or suppressed in performing, on the semiconductor substrate 1, an oxidation treatment for forming the insulating film 5.

Figure 43:
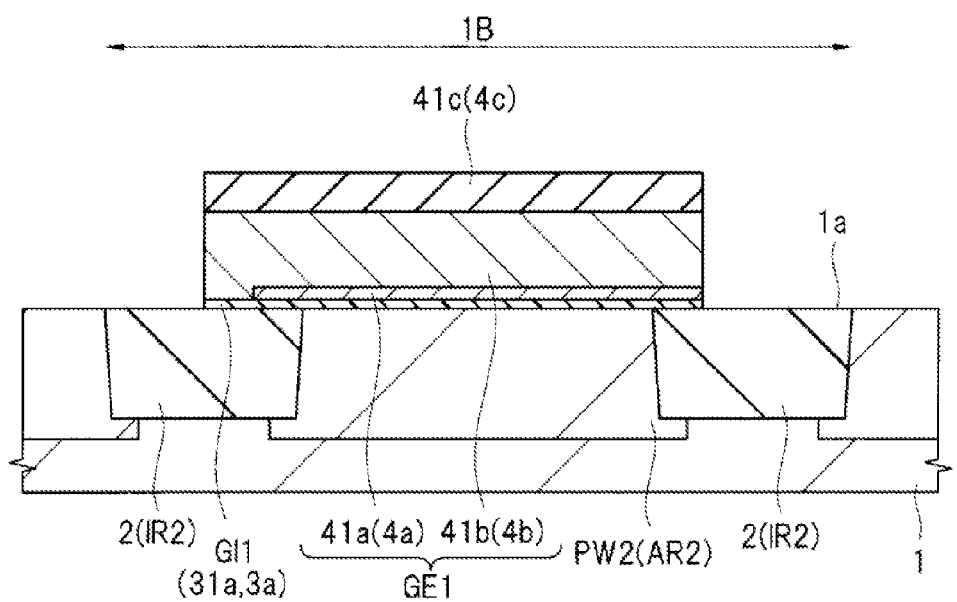
FIG. 43 is a cross-sectional view of the principal part of the semiconductor device of the second embodiment during a manufacturing process.

Next, the processes of Step S11 to Step S15 in FIG. 5 are performed for patterning the hard mask film 4c and the silicon film 4b in the peripheral circuit region 1B. At this time, the structure in a cross-section perpendicular to the gate width direction of the gate electrode GE1 is the same as the structure described using FIG. 21 in the first embodiment. On the other hand, as shown in FIG. 43, in the cross-section perpendicular to the gate length direction of the gate electrode GE1, at least one end portion, in the metal film portion 41a formed of the metal film 4a, in the gate width direction of the gate electrode GE1 is covered with the conductive film portion 41b formed of the silicon film 4b. Such a structure is formed because, in Step S15 in FIG. 5, in forming the conductive film portion 41b by patterning the silicon film 4b, the silicon film 4b is patterned so that one end of the metal film portion 41a in the gate width direction of the gate electrode GE1 is covered with the conductive film portion 41b.

Note that FIG. 43 shows an example in which other end portion of the metal film portion 41a in the gate width direction of the gate electrode GE1 is not covered with the conductive film portion 41b constituted by the silicon film 4b. However, other end portion of the metal film portion 41a in the gate width direction of the gate electrode GE1 may be covered with the conductive film portion 41b constituted by the silicon film 4b.

Next, by performing the processes of Step S16 to Step S20 in FIG. 5 of the method for manufacturing a semiconductor device of the first embodiment, the metal silicide layer 11 is formed. Subsequently, without performing the processes of Step S21 to Step S26 in FIG. 6 which are the steps of the so-called metal-gate-last process, the processes of Step S27 to Step S29 in FIG. 6 are performed. At this time, the structure in a cross-section perpendicular to the gate width direction of the gate electrode GE1 is the same as the structure described using FIG. 1 in the first embodiment. On the other hand, as shown in FIG. 39, in the cross-section perpendicular to the gate length direction of the gate electrode GE1, at least one end portion, in the metal film portion 41a, in the gate width direction of the gate electrode GE1 is covered with the conductive film portion 41b.

<Main Features and Effect of the Present Embodiment>

In the method for manufacturing a semiconductor device according to the present second embodiment, as with the method for manufacturing a semiconductor device according to the first embodiment, in Step S6 in FIG. 4, the metal film 4a is left so that the position of an outer periphery of the metal film 4a backs away from the position of an outer periphery of a region where the silicon film 4b is to be left in Step S9 in FIG. 4. Then, in Step S9 in FIG. 4, the silicon film 4b over the metal film 4a is left so that the outer peripheral portion of the metal film 4a that has been left in Step S6 in FIG. 4 is covered with the silicon film 4b.

Therefore, as with the first embodiment, the oxidation of the metal film 4a can be prevented, and in the region where the gate electrode GE1 is to be formed, an increase in the film thickness of the metal film portion 41a formed of the metal film 4a can be prevented and a change in the quality of the material can be prevented. Accordingly, as with the first embodiment, for example, a fluctuation of the state of the interface between the gate electrode GE1 and the gate insulating film GI1 can be prevented, a fluctuation of the threshold voltage of the semiconductor device can be prevented, and the performance of the semiconductor device can be enhanced.

On the other hand, the semiconductor device of the present second embodiment, different from the first embodiment, is manufactured using the so-called metal-gate-first process. That is, the metal film portion 41a and the conductive film portion 41b formed of the silicon film 4b, which have been formed in performing the oxidation treatment on the semiconductor substrate 1 are used, as is, as the gate electrode GE1 as the metal gate electrode. For this reason, the effect of preventing a fluctuation of the state of the interface between the gate electrode GE1 and the gate insulating film GI1, and the effect of preventing a fluctuation of the threshold voltage of the semiconductor device become larger in comparison with those in the first embodiment. Accordingly, the effect of improving the performance of the semiconductor device becomes larger in comparison with that in the first embodiment.

Third Embodiment

In the first embodiment and the second embodiment, there have been described a semiconductor device having a non-volatile memory and a MISFET with a metal gate electrode mixedly mounted therein, and a method for manufacturing the same. On the other hand, the methods of manufacturing a semiconductor device described in the first embodiment and the second embodiment can also be applied to a method for manufacturing a semiconductor device having a semi-conductor element other than a nonvolatile memory and an MISFET with a metal gate electrode mixedly mounted therein. Hereinafter, as a third embodiment, there will be described a semiconductor device having a DRAM and a MISFET with a metal gate electrode mixedly mounted therein and a method for manufacturing the same.

<Structure of Semiconductor Device>

Figure 44:
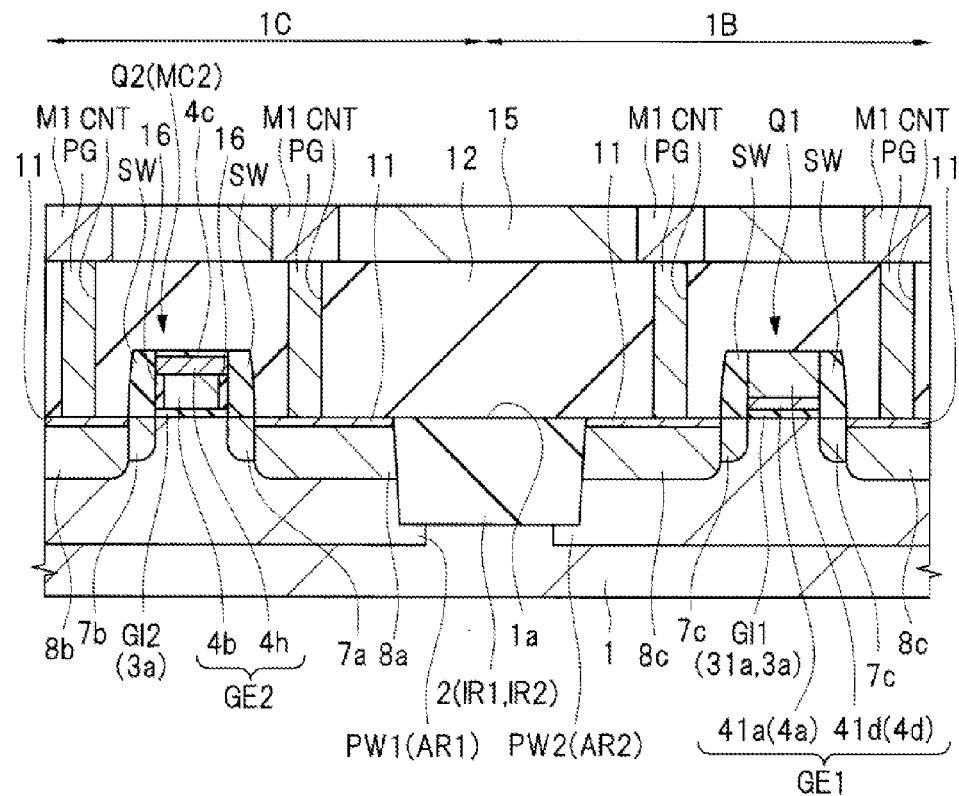
FIG. 44 is a cross-sectional view of a principal part of a semiconductor device of a third embodiment.
Figure 45:
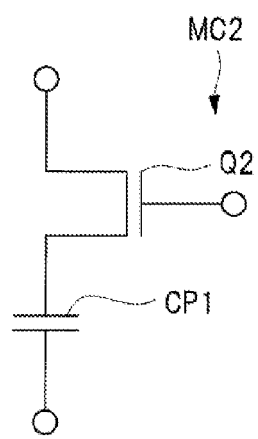
FIG. 45 is an equivalent circuit diagram of a memory cell in the semiconductor device of the third embodiment.

FIG. 44 is a cross-sectional view of a principal part of the semiconductor device of the third embodiment. FIG. 45 is an equivalent circuit diagram of a memory cell in the semiconductor device of the third embodiment. As shown in FIG. 45, one memory cell MC2 of a DRAM includes a MISFET Q2 as a control transistor and a capacitive element CP1.

The semiconductor device of the present third embodiment includes the semiconductor substrate 1. The semiconductor substrate 1 can be the same semiconductor substrate as the semiconductor substrate 1 of the semiconductor device of the first embodiment.

The semiconductor device of the present third embodiment includes a memory cell region 1C and a peripheral circuit region 1B on the principal surface 1a side of the semiconductor substrate 1. MISFET Q1 is formed in the peripheral circuit region 1B, while in the memory cell region 1C, MISFET Q2 included in the memory cell MC2 of the DRAM is formed. The structures of the peripheral circuit region 1B and MISFET Q1 are the same as the structures of the peripheral circuit region 1B and MISFET Q1 in the semiconductor device of the first embodiment, and thus the explanation thereof is omitted.

In the memory cell region 1C, the semiconductor device includes the active region AR1 and the element isolating region IR1. The element isolating region IR1 is for isolating an element, and the element isolating film 2 is formed in the element isolating region IR1. The active region AR1 is defined by the element isolating region IR1, and is electrically isolated by the element isolating region IR1 from other active regions, and the p-well PW1 is formed in the active region AR1. In the p-well PW1, the above-described MISFET Q2 is formed.

As shown in FIG. 44, MISFET Q2 includes a semiconductor region formed of the n$^-$-type semiconductor regions 7a and 7b and the n$^+$-type semiconductor regions 8a and 8b, a gate insulating film GI2 formed over the p-well PW1, and a gate electrode GE2 formed over the gate insulating film GI2. The n$^-$-type semiconductor regions 7a and 7b and the n$^+$-type semiconductor regions 8a and 8b are formed inside the p-well PW1 in the semiconductor substrate 1.

The gate insulating film GI2 is formed of the insulating film 3a. The insulating film 3a can be the insulating film of the same layer as the insulating film 3a of MISFET Q1.

The gate electrode GE2 is formed by the silicon film 4b and a metal film 4h over the silicon film 4b. The silicon film 4b can be the same silicon film as the silicon film 4b in the first embodiment. On the surface of the sidewall of the silicon film 4b, a sidewall insulating film 16 is formed. As the metal film 4h, for example a tungsten (W) film or the like can be used.

The hard mask film 4c is formed over the metal film 4h. As the hard mask film 4c, the same film as the hard mask film 4c in the first embodiment can be used.

A semiconductor region formed of the n$^-$-type semiconductor regions 7a and 7b and the n$^+$-type semiconductor regions 8a and 8b is the source and drain semiconductor region having an n-type impurity for MISFET Q2 introduced therein, and is provided with an LDD structure. The n$^-$-type semiconductor regions 7a and 7b and the n$^+$-type semiconductor regions 8a and 8b can be the same semiconductor regions as the n$^-$-type semiconductor regions 7a and 7b and the n$^+$-type semiconductor regions 8a and 8b in the first embodiment, respectively.

Over the sidewall of the gate electrode GE2, the sidewall spacer SW formed of an insulating film is formed, as with over the sidewall of the gate electrode GE1 of MISFET Q1.

Over the n$^+$-type semiconductor regions 8a and 8b of MISFET Q2, the metal silicide layer 11 is formed, as with over the n$^+$-type semiconductor region 8c of MISFET Q1.

Note that, although illustration is omitted, in the memory cell region 1C, over the wiring M1, a capacitive element forming the DRAM is formed together with MISFET Q2 as the control transistor.

FIG. 44 shows a semiconductor device manufactured by the so-called metal-gate-last process, as with the first embodiment. However, also in the present third embodiment, the semiconductor device may be manufactured by the metal-gate-first process in place of the metal-gate-last process. In this case, preferably, as described using FIG. 39 in the second embodiment, in MISFET Q1, at least one end portion, in the metal film portion 41a, in the gate width direction of the gate electrode GE1 is covered with the conductive film portion 41b formed of the silicon film 4b in place of the conductive film portion 41d formed of the conductive film 4d.

<Method for Manufacturing Semiconductor Device>

Figure 46:
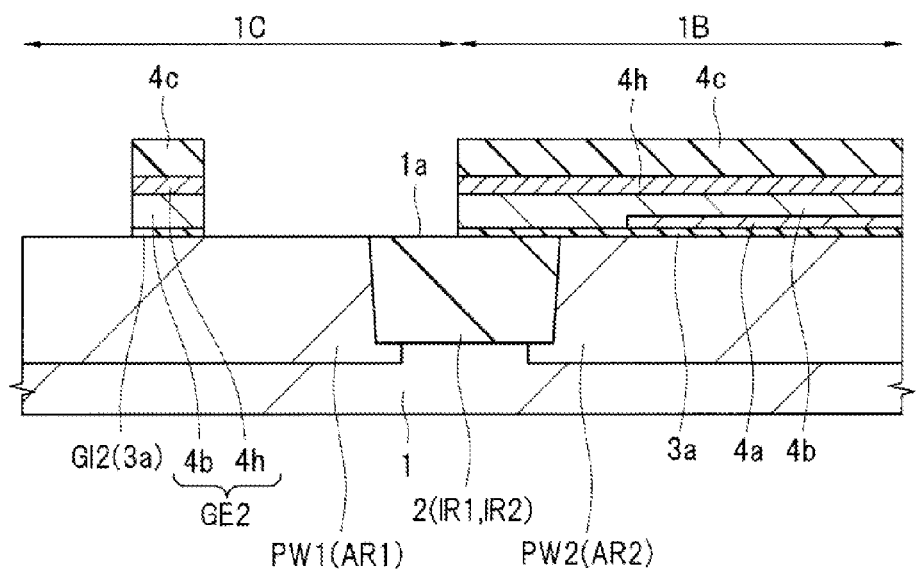
FIG. 46 is a cross-sectional view of the principal part of the semiconductor device of the third embodiment during a manufacturing process.
Figure 47:
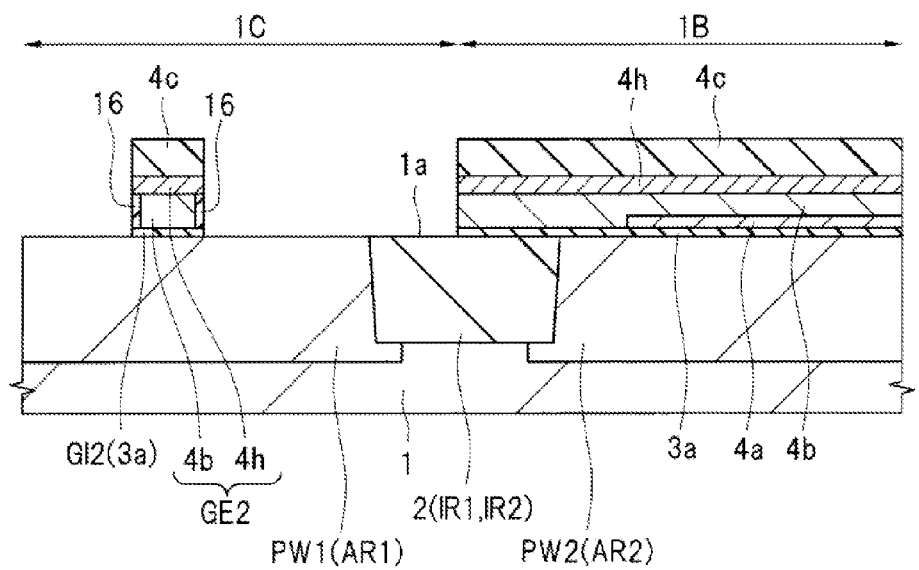
FIG. 47 is a cross-sectional view of the principal part of the semiconductor device of the third embodiment during a manufacturing process.

Next, a method for manufacturing a semiconductor device of the present third embodiment will be described. FIG. 46 and FIG. 47 are cross-sectional views of a principal part of the semiconductor device of the third embodiment during a manufacturing process.

First, the processes of Step S1 to Step S6 in FIG. 4 are performed for patterning the metal film 4a, and then the processes of Step S7 to Step S9 in FIG. 4 are performed for patterning the hard mask film 4c and the silicon film 4b. However, the method for manufacturing a semiconductor device of the present third embodiment differs from the method for manufacturing a semiconductor device of the first embodiment in that between Step S7 and Step S8 in FIG. 4, the metal film 4h is formed, i.e., deposited. As the metal film 4h, for example, a W film can be formed by a CVD method as described above.

The structure of the cross-section after the processes to Step S9 in FIG. 4 are performed is the same as the structure described using FIG. 14 in the first embodiment except that the metal film 4h is formed between the silicon film 4b and the hard mask film 4c. That is, as shown in FIG. 46, also in the present third embodiment, as with the first embodiment, the silicon film 4b over the metal film 4a is left so that the outer peripheral portion of the metal film 4a is covered with the silicon film 4b.

Note that, as shown in FIG. 46, after the processes up to Step S9 in FIG. 4 are performed, in the memory cell region 1C that is a region other than the peripheral circuit region 1B, the gate electrode GE2 formed of the silicon film 4b and the metal film 4h is formed and the gate insulating film GI2 formed of the insulating film 3a is formed.

Next, a process of Step S110 is performed in place of the process of Step S10 in FIG. 4. In this Step S110, an oxidation treatment is performed on the semiconductor substrate 1. For example, in a case where the metal film 4h is formed of a W film, by performing ISSG oxidation, for example, under the atmospheric pressure atmosphere containing 10% moisture and under the condition of approximately 60 minutes at 750° C., as shown in FIG. 47, the surface of the sidewall of the metal film 4h is not oxidized, whereas, in the memory cell region 1C, the surface of the sidewall of the silicon film 4b is oxidized for forming the sidewall insulating film 16.

Subsequently, by performing the processes of Step S15 in FIG. 5 to Step S29 in FIG. 6 without performing the processes of Step S11 to Step S14 in FIG. 5, the gate electrode GE1 is formed in the peripheral circuit region 1B, and thus the semiconductor device shown in FIG. 44 is manufactured.

Note that, also in the present third embodiment, the semiconductor device may be manufactured by the metal-gate-first process in place of the metal-gate-last process. That is, the semiconductor device may be manufactured by performing the processes of Step S15 to Step S20 in FIG. 5, and then performing the processes of Step S27 to Step S29 in FIG. 6 without performing the processes of Step S21 to Step S26 in FIG. 6, which are the processes of the metal-gate-last process.

<Main Features and Effect of the Present Embodiment>

Also in the present third embodiment, as with the first embodiment, in Step S6 in FIG. 4, the metal film 4a is left so that the position of an outer periphery of the metal film 4a backs away from the position of an outer periphery of a region where the silicon film 4b is to be left in Step S9 in FIG. 4. Then, in Step S9 in FIG. 4, the silicon film 4b over the metal film 4a is left so that the outer peripheral portion of the metal film 4a that has been left in Step S6 in FIG. 4 is covered with the silicon film 4b. Accordingly, in performing an oxidation treatment for forming an insulating film on the semiconductor substrate 1 on the surface of the silicon film 4b, which is patterned in the region other than peripheral circuit region 1B, the oxidation of the metal film 4a can be prevented because the outer peripheral portion of the metal film 4a remaining in the peripheral circuit region 1B is covered with the silicon film 4b.

Because of this, the damage on the gate electrode GE2 in MISFET Q2 of the memory cell MC2 of the DRAM can be prevented or suppressed. Therefore, the memory characteristics such as the refresh characteristics of the DRAM, can be enhanced and the performance of the semiconductor device can be enhanced.

That is, the methods of manufacturing a semiconductor device of the first embodiment and the second embodiment can be widely applicable to methods of manufacturing a semiconductor device including the process of: after a silicon film is patterned in a certain region and before a metal gate electrode is formed in a region different from the certain region, performing an oxidation treatment on a semiconductor substrate while a metal film and the silicon film remain in this different region. Also in such a case, the oxidation of the remaining metal film can be prevented or suppressed, and thus the performance of the semiconductor device can be enhanced.

Fourth Embodiment

The method for manufacturing a semiconductor device described in the first embodiment and the second embodiment can be applicable also to a method for manufacturing a semiconductor device having a CMOS image sensor and an MISFET with a metal gate electrode mixedly mounted therein. Hereinafter, as a fourth embodiment, a semiconductor device having a CMOS image sensor and an MISFET with a metal gate electrode mixedly mounted therein and a method for manufacturing the same will be described.

<Structure of Semiconductor Device>

Figure 48:
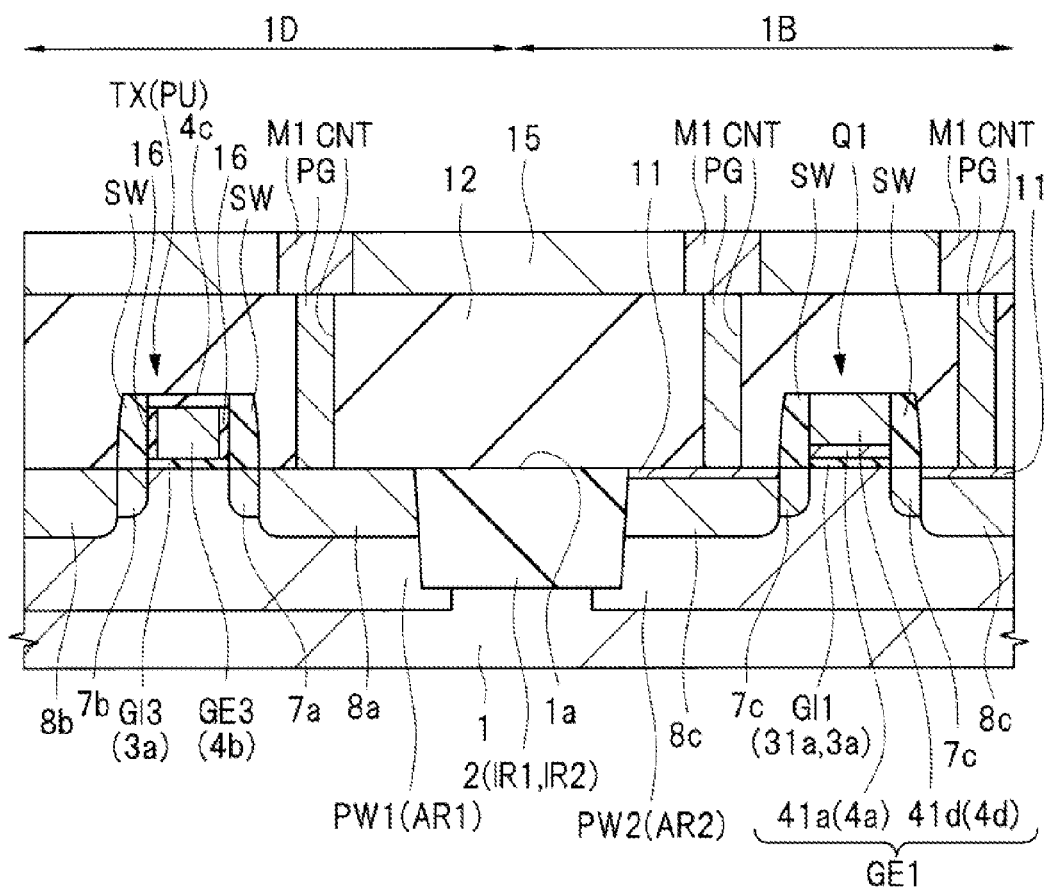
FIG. 48 is a cross-sectional view of a principal part of a semiconductor device of a fourth embodiment.
Figure 49:
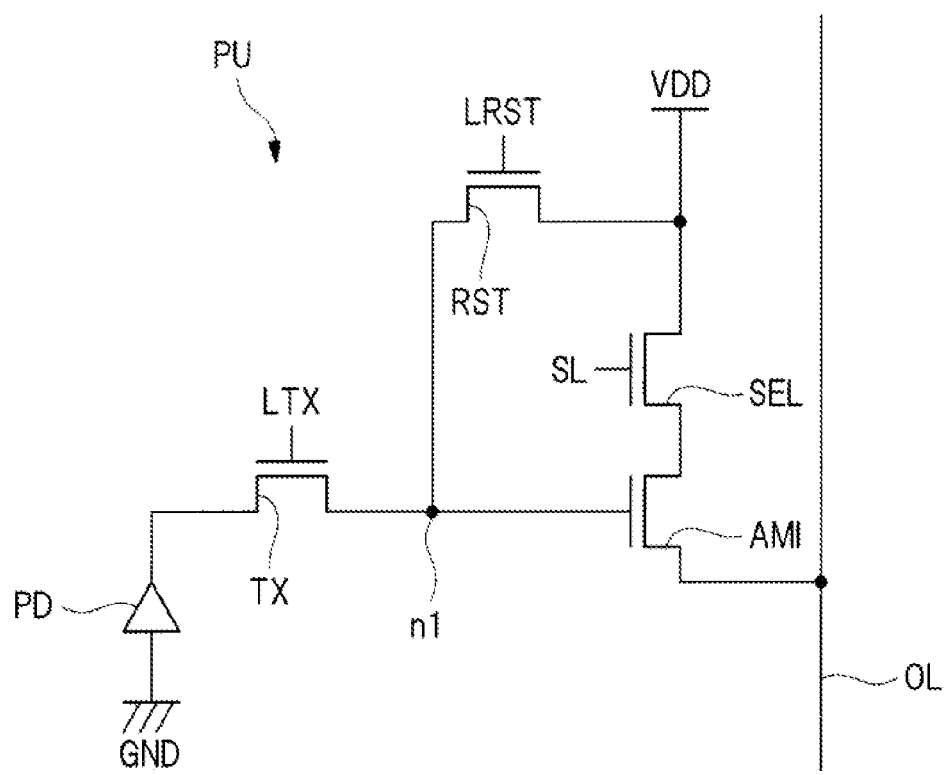
FIG. 49 is an equivalent circuit diagram showing a configuration example of a pixel of a CMOS image sensor in the semiconductor device of the fourth embodiment.

FIG. 48 is a cross-sectional view of a principal part of the semiconductor device of the fourth embodiment. FIG. 49 is an equivalent circuit diagram showing a configuration example of a pixel of the CMOS image sensor in the semiconductor device of the fourth embodiment. As shown in FIG. 49, a pixel PU of the CMOS image sensor includes a photodiode PD and four MISFETs (RST, TX, SEL, AMI). These MISFETs are of an n-channel type, in which RST is a reset transistor, TX is a transfer transistor, SEL is a selection transistor, and AMI is an amplification transistor.

The semiconductor device of the fourth embodiment includes the semiconductor substrate 1. The semiconductor substrate 1 can be the same semiconductor substrate as the semiconductor substrate 1 of the semiconductor device of the first embodiment.

The semiconductor device of the fourth embodiment includes a pixel region 1D and the peripheral circuit region 1B on the principal surface 1a side of the semiconductor substrate 1. MISFET Q1 is formed in the peripheral circuit region 1B, while in the pixel region 1D, four MISFETs described above are formed. FIG. 48 shows the transfer transistor TX among four MISFET formed in the pixel region 1D. The structures of the peripheral circuit region 1B and MISFET Q1 are the same as the structures of the peripheral circuit region 1B and MISFET Q1 in the semiconductor device of the first embodiment, and thus the explanation thereof is omitted.

In the pixel region 1D, the semiconductor device includes the active region AR1 and the element isolating region IR1. The element isolating region IR1 is for isolating an element, and the element isolating film 2 is formed in the element isolating region IR1. The active region AR1 is defined by the element isolating region IR1, and is electrically isolated by the element isolating region IR1 from other active regions, and the p-well PW1 is formed in the active region AR1. In the p-well PW1, the transfer transistor TX described above is formed.

As shown in FIG. 48, the transfer transistor TX includes a semiconductor region formed of the $n^-$-type semiconductor regions 7a and 7b and the $n^+$-type semiconductor regions 8a and 8b, a gate insulating film GI3 formed over the p-well PW1, and a gate electrode GE3 formed over the gate insulating film GI3. The $n^-$-type semiconductor regions 7a and 7b and the $n^+$-type semiconductor regions 8a and 8b are formed inside the p-well PW1 in the semiconductor substrate 1.

The gate insulating film GI3 is formed of the insulating film 3a. The insulating film 3a can be the insulating film of the same layer as the insulating film 3a of MISFET Q1.

The gate electrode GE3 is formed by the silicon film 4b. The silicon film 4b can be the same silicon film as the silicon film 4b in the first embodiment. The sidewall insulating film 16 is formed on the surface of the sidewall of the silicon film 4b.

The hard mask film 4c is formed over the silicon film 4b. In the present fourth embodiment, as the hard mask film 4c, for example, a silicon oxide film can be used.

The semiconductor region formed of the n$^-$-type semiconductor regions 7a and 7b and the n$^+$-type semiconductor regions 8a and 8b is the source and drain semiconductor region of the transfer transistor TX having an n-type impurity introduced therein, and is provided with an LDD structure. The n$^-$-type semiconductor regions 7a and 7b and the n+-type semiconductor regions 8a and 8b can be the same as the n$^-$-type semiconductor regions 7a and 7b and the n$^+$-type semiconductor regions 8a and 8b in the first embodiment, respectively. Alternatively, the above-described semiconductor region may not be provided with the LDD structure by setting the regions where the n$^-$-type semiconductor regions 7a and 7b are formed in FIG. 48 to the n$^+$-type semiconductor regions 8a and 8b, respectively, without forming the n$^-$-type semiconductor regions 7a and 7b.

Over the sidewall of the gate electrode GE3, the sidewall spacer SW formed of an insulating film is formed, as with over the sidewall of the gate electrode GE1 of MISFET Q1.

Note that, as shown in FIG. 48, in the upper part of the n$^+$-type semiconductor regions 8a and 8b of the transfer transistor TX, the metal silicide layer 11 may not be formed, unlike over the n$^+$-type semiconductor region 8c of MISFET Q1.

FIG. 48 shows a semiconductor device manufactured by the so-called metal-gate-last process, as with the first embodiment. However, also in the present fourth embodiment, the semiconductor device may be manufactured by the metal-gate-first process in place of the metal-gate-last process. In this case, preferably, as described using FIG. 39 in the second embodiment, in MISFET Q1, at least one end portion, in the metal film portion 41a, in the gate width direction of the gate electrode GE1 is covered with the conductive film portion 41b formed of the silicon film 4b in place of the conductive film portion 41d formed of the conductive film 4d.

Next, the operation of the pixel PU formed in the pixel region 1D will be described.

As shown in FIG. 49, the photodiode PD and the transfer transistor TX are coupled in series between an earth potential GND and a node n1. The reset transistor RST is coupled between the node n1 and a power supply potential VDD. The power supply potential VDD is the electric potential of a power supply potential line. Between the power supply potential VDD and an output line OL, the selection transistor SEL and the amplification transistor AMI are coupled in series. The gate electrode of the amplification transistor AMI is coupled to the node n1. Moreover, the gate electrode of the reset transistor RST is coupled to a reset line LRST. Furthermore, the gate electrode of the selection transistor SEL is coupled to a selection line SL, and the gate electrode of the transfer transistor TX is coupled to a transfer line LTX.

For example, the voltages applied to the transfer line LTX and the reset line LRST are ramped up to an H level to set the transfer transistor TX and the reset transistor RST to an on-state. As a result, the charges of the photodiode PD are discharged and depleted. Subsequently, the transfer transistor TX is set to an off-state.

Subsequently, for example, when a mechanical shutter of an electronic device such as a camera, is opened, charges are generated by incident radiation and are stored in the photodiode PD while the shutter is open. That is, the photodiode PD receives incident light and generates charges.

Next, after closing the shutter, the voltage applied to the reset line LRST is ramped down to an L level to set the reset transistor RST to an off-state. Furthermore, the voltages applied to the selection line SL and the transfer line LTX are ramped up to an H level to set the selection transistor SEL and the transfer transistor TX to an on-state. Therefore, the charges generated by the photodiode PD are transferred to an end portion on the node n1 side of the transfer transistor TX. At this time, the electric potential of the node n1 changes to a value depending on the charges transferred from the photodiode PD, and this value is amplified by the amplification transistor AMI and appears at the output line OL. This electric potential of the output line OL is read as an output signal.

<Method for Manufacturing Semiconductor Device>

Figure 50:
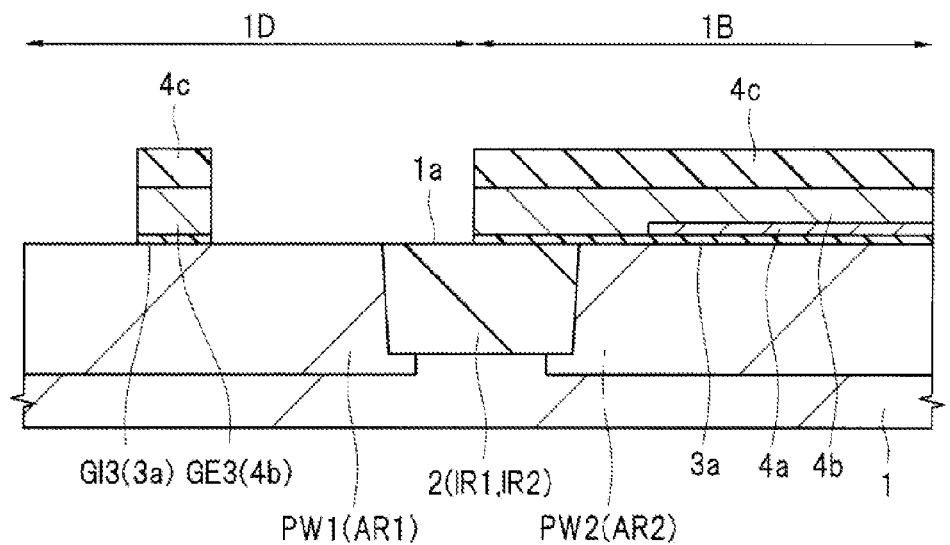
FIG. 50 is a cross-sectional view of the principal part of the semiconductor device of the fourth embodiment during a manufacturing process.
Figure 51:
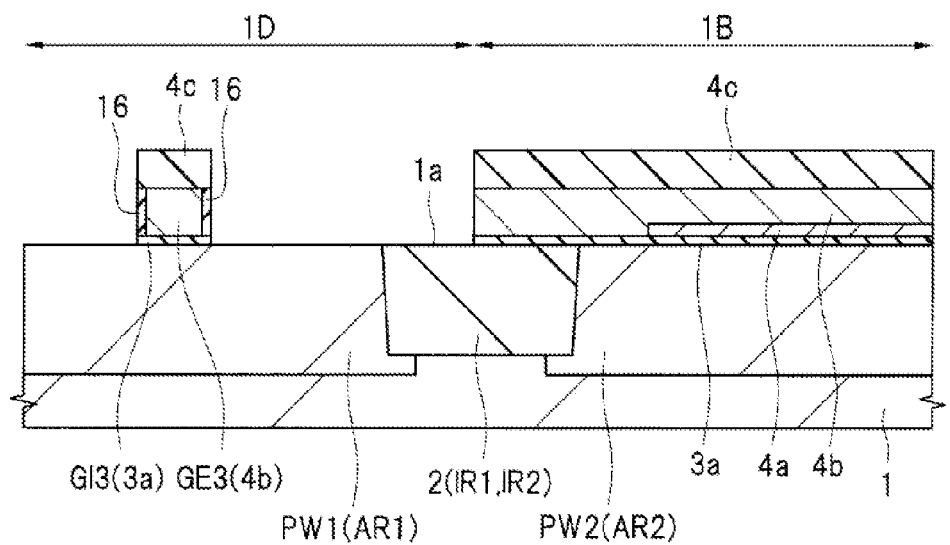
FIG. 51 is a cross-sectional view of the principal part of the semiconductor device of the fourth embodiment during a manufacturing process.

Next, a method for manufacturing a semiconductor device of the present fourth embodiment will be described. FIG. 50 and FIG. 51 are cross-sectional views of a principal part of the semiconductor device of the fourth embodiment during a manufacturing process.

First, the processes of Step S1 to Step S6 in FIG. 4 are performed to pattern the metal film 4a, and then the processes of Step S7 to Step S9 in FIG. 4 are performed to pattern the hard mask film 4c and the silicon film 4b.

The structure of the cross-section after the processes to Step S9 in FIG. 4 are performed is the same as the structure described using FIG. 14 in the first embodiment. That is, as shown in FIG. 50, also in the present fourth embodiment, as with the first embodiment, the silicon film 4b over the metal film 4a is left so that the outer peripheral portion of the metal film 4a is covered with the silicon film 4b.

Note that, as shown in FIG. 50, after the processes up to Step S9 in FIG. 4 are performed, in the pixel region 1D that is the region other than the peripheral circuit region 1B, the gate electrode GE3 formed of the silicon film 4b is formed and the gate insulating film GI3 formed of the insulating film 3a is formed.

Next, a process of Step S210 is performed in place of the process of Step S10 in FIG. 4. In this Step S210, by performing an oxidation treatment on the semiconductor substrate 1, as shown in FIG. 51 in the pixel region 1D, the oxidation of the surface of the sidewall of the silicon film 4b forms the sidewall insulating film 16.

Subsequently, by performing the processes of Step S15 in FIG. 5 to Step S29 in FIG. 6 without performing the processes of Step S11 to Step S14 in FIG. 5, the gate electrode GE1 is formed in the peripheral circuit region 1B, and thus the semiconductor device shown in FIG. 48 is manufactured.

Note that, also in the present fourth embodiment, the semiconductor device may be manufactured by the metal-gate-first process in place of the metal-gate-last process. That is, the semiconductor device may be manufactured by performing the processes of Step S15 to Step S20 in FIG. 5, and then performing the processes of Step S27 to Step S29 in FIG. 6 without performing the processes of Step S21 to Step S26 in FIG. 6 that are the processes of the metal-gate-last process.

<Main Features and Effect of the Present Embodiment>

Also in the present fourth embodiment, as with the first embodiment, in Step S6 in FIG. 4, the metal film 4a is left so that the position of an outer periphery of the metal film 4a backs away from the position of an outer periphery of a region where the silicon film 4b is to be left in Step S9 in FIG. 4. Then, in Step S9 in FIG. 4, the silicon film 4b over the metal film 4*a* is left so that the outer peripheral portion of the metal film 4*a* that has been left in Step S6 in FIG. 4 is covered with the silicon film 4*b*. Accordingly, in performing, on the semiconductor substrate 1, on the surface of the silicon film 4*b* that has been patterned in the region other than peripheral circuit region 1B, an oxidation treatment for forming an insulating film, the oxidation of the metal film 4*a* can be prevented because the outer peripheral portion of the metal film 4*a* remaining in the peripheral circuit region 1B is covered with the silicon film 4*b*.

Therefore, for example, in the transfer transistor TX of the pixel PU of the CMOS image sensor, the damage on the gate electrode GE3 can be prevented or suppressed. Accordingly, the detection characteristic of the CMOS image sensor can be enhanced and the performance of the semiconductor device can be enhanced.

The present invention made by the present inventors has been described specifically according to the embodiments. However, it is obvious that the present invention is not limited to the embodiments, but various modifications are possible without departing from the gist of the invention.

What is claimed is:

1. A semiconductor device comprising:
  a semiconductor substrate;
  a first gate insulating film formed over the semiconductor substrate; and
  a first gate electrode formed over the first gate insulating film,
  wherein the first gate electrode includes:
  a first film portion formed of a first conductive film over the first gate insulating film; and
  a second film portion formed of a second conductive film over the first film portion, and
  wherein a side surface of one end portion, in the first film portion, in a gate width direction of the first gate electrode is covered with the second film portion.

2. The semiconductor device according to claim 1, further comprising:
  a first active region formed in a first region on a first principal surface side of the semiconductor substrate; and
  a first element isolating region which is formed in the first region on the first principal surface side of the semiconductor substrate and which defines the first active region,
  wherein the first gate insulating film is formed over the first active region, and
  wherein the one end portion, in the first film portion, in the gate width direction is arranged over the first element isolating region.

3. The semiconductor device according to claim 1,
  wherein the first gate insulating film is formed in a first region on a first principal surface side of the semiconductor substrate, the semiconductor device further comprising:
  a second gate insulating film formed over the semiconductor substrate in a second region on the first principal surface side of the semiconductor substrate;
  a second gate electrode formed over the second gate insulating film;
  a third gate electrode which is formed over the semiconductor substrate in the second region and which is adjacent to the second gate electrode; and
  a first insulating film which is formed between the third gate electrode and the semiconductor substrate and between the second gate electrode and the third gate electrode, and which has a charge storage section therein.

4. The semiconductor device according to claim 3,
  wherein the semiconductor device comprises a nonvolatile memory formed in the second region on the first principal surface side of the semiconductor substrate, and
  wherein the second gate electrode and the third gate electrode are gate electrodes constituting the nonvolatile memory.

5. A semiconductor device comprising:
  a semiconductor substrate;
  a first gate insulating film formed over the semiconductor substrate;
  a first gate electrode formed over the first insulating film; and
  a sidewall spacer formed over a side of the first gate electrode,
  wherein the first gate electrode includes a first conductive film over the first insulating film and a second conductive film over the first conductive film,
  wherein, as viewed in a cross section, the first conductive film has a first end portion and a second end portion opposite to the first end portion, and
  wherein, as viewed in the cross section, a side surface of the first end portion of the first conductive film is covered with the second conductive film.

6. The semiconductor device according to claim 5,
  wherein, the side surface of the first end portion of the first conductive film is in contact with the second conductive film.

7. The semiconductor device according to claim 6,
  wherein the first conductive film includes a titanium nitride film, a tantalum nitride film, a tungsten nitride film, a titanium carbide film, a tantalum carbide film, a tungsten carbide film, a tantalum carbide nitride film, or a tungsten film, and
  wherein the second conductive film includes a silicon film.

8. The semiconductor device according to claim 7, further comprising:
  a first active region formed in a first region on a main surface side of the semiconductor substrate; and
  a field isolation oxide region which is formed in the first region on the main surface side of the semiconductor substrate and which defines the first active region,
  wherein the first gate insulating film is formed over the first active region, and
  wherein the first end portion of the first conductive film is arranged over the field isolation oxide region.

9. The semiconductor device according to claim 7,
  wherein the first gate insulating film is formed in a first region on a main surface side of the semiconductor substrate, the semiconductor device further comprising:
  a second gate insulating film formed over the semiconductor substrate in a second region on the main surface side of the semiconductor substrate;
  a second gate electrode formed over the second gate insulating film;
  a third gate electrode which is formed over the semiconductor substrate in the second region and which is adjacent to the second gate electrode via a first insulating film; and
  the first insulating film which is formed between the third gate electrode and the semiconductor substrate and between the second gate electrode and the third gate electrode, and which has a charge storage portion therein.

10. The semiconductor device according to claim 9, wherein the second gate electrode and the third gate electrode are gate electrodes constituting a nonvolatile memory.

11. The semiconductor device according to claim 5, wherein the second conductive film separates the first end portion of the first conductive film and the sidewall spacer from each other.

12. The semiconductor device according to claim 1, wherein the second film portion directly contacts the first gate insulating film.

* * * * *